(12) United States Patent
Fujii et al.

(10) Patent No.: US 11,088,162 B2
(45) Date of Patent: Aug. 10, 2021

(54) SEMICONDUCTOR MEMORY DEVICE AND SEMICONDUCTOR DEVICE MANUFACTURING METHOD

(71) Applicant: Toshiba Memory Corporation, Minato-ku (JP)

(72) Inventors: Kotaro Fujii, Yokkaichi (JP); Satoshi Nagashima, Yokkaichi (JP); Yumi Nakajima, Yokkaichi (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/284,128

(22) Filed: Feb. 25, 2019

(65) Prior Publication Data

US 2020/0075622 A1 Mar. 5, 2020

(30) Foreign Application Priority Data

Aug. 31, 2018 (JP) .............................. JP2018-163544

(51) Int. Cl.
*H01L 29/76* (2006.01)
*H01L 27/11582* (2017.01)
*H01L 27/11556* (2017.01)
*H01L 21/8234* (2006.01)
*G11C 16/04* (2006.01)
*H01L 27/1157* (2017.01)
(Continued)

(52) U.S. Cl.
CPC .... *H01L 27/11582* (2013.01); *G11C 16/0483* (2013.01); *H01L 21/823487* (2013.01); *H01L 27/1157* (2013.01); *H01L 27/11524* (2013.01); *H01L 27/11556* (2013.01); *G11C 16/08* (2013.01); *G11C 16/26* (2013.01); *H01L 27/11519* (2013.01); *H01L 27/11565* (2013.01)

(58) Field of Classification Search
USPC ....................................................... 257/314
See application file for complete search history.

(56) References Cited

U.S. PATENT DOCUMENTS

| 8,436,414 | B2 | 5/2013 | Tanaka et al. |
| 2015/0200199 | A1 | 7/2015 | Sakamoto et al. |
| 2018/0019134 | A1* | 1/2018 | Choi ...................... H01L 27/115 |

FOREIGN PATENT DOCUMENTS

| JP | 2010-192569 | 9/2010 |
| JP | 2012-94694 | 5/2012 |
| JP | 2017-10951 | 1/2017 |

* cited by examiner

*Primary Examiner* — Niki H Nguyen
(74) *Attorney, Agent, or Firm* — Oblon, McClelland, Maier & Neustadt, L.L.P.

(57) ABSTRACT

According to one embodiment, a semiconductor memory device includes: a first insulating layer provided between first and second interconnection layers; a first semiconductor layer provided between the first interconnection layer and the first insulating layer; a second semiconductor layer provided between the second interconnection layer and the first insulating layer; a first charge storage layer provided between the first interconnection layer and the first semiconductor layer; a second charge storage layer provided between the second interconnection layer and the second semiconductor layer; and a second insulating layer provided between the first interconnection layer and the second interconnection layer, between the first semiconductor layer and the second semiconductor layer, and between the first charge storage layer and the second charge storage layer.

24 Claims, 55 Drawing Sheets

(51) Int. Cl.
*H01L 27/11524* (2017.01)
*H01L 27/11565* (2017.01)
*G11C 16/26* (2006.01)
*G11C 16/08* (2006.01)
*H01L 27/11519* (2017.01)

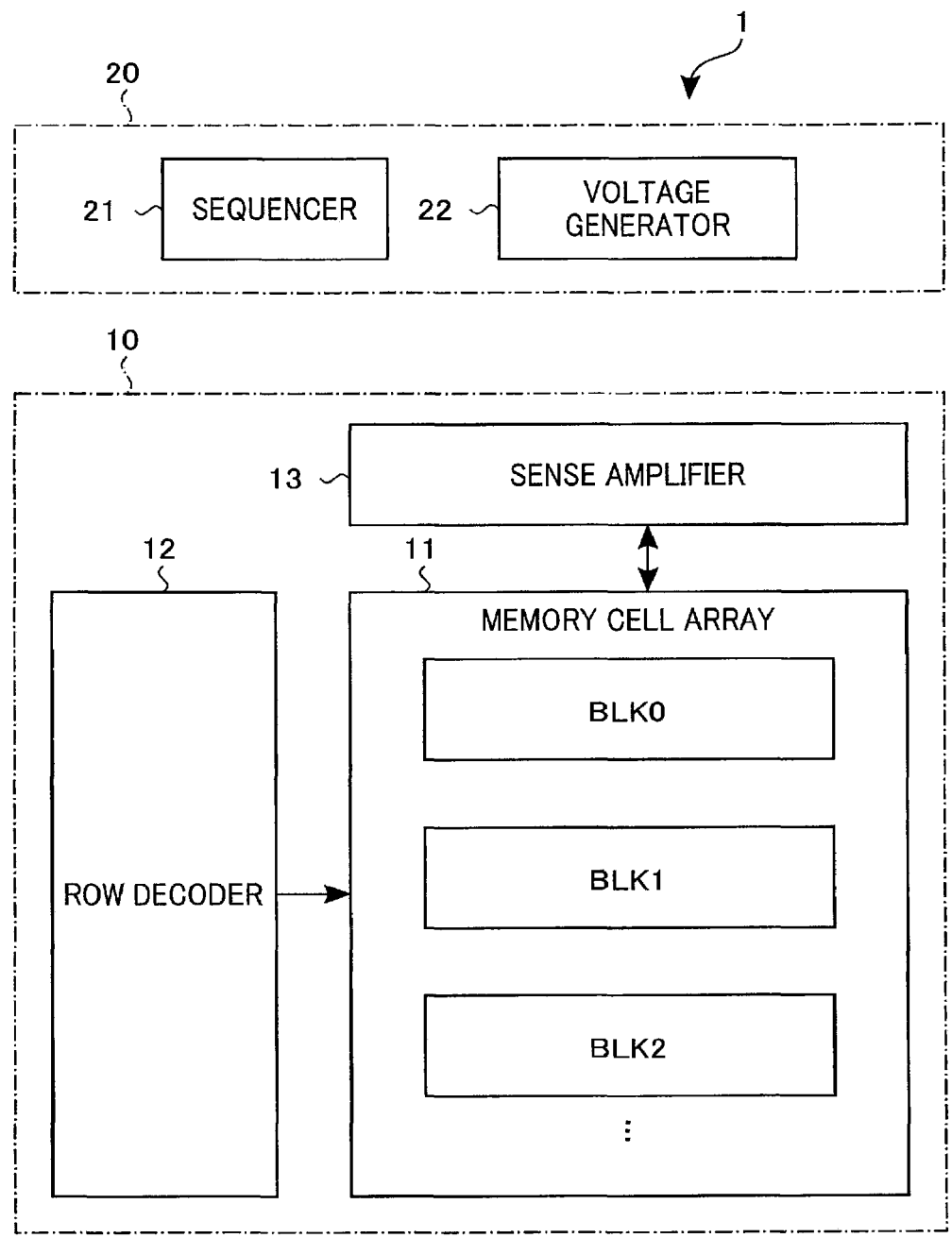
F I G. 1

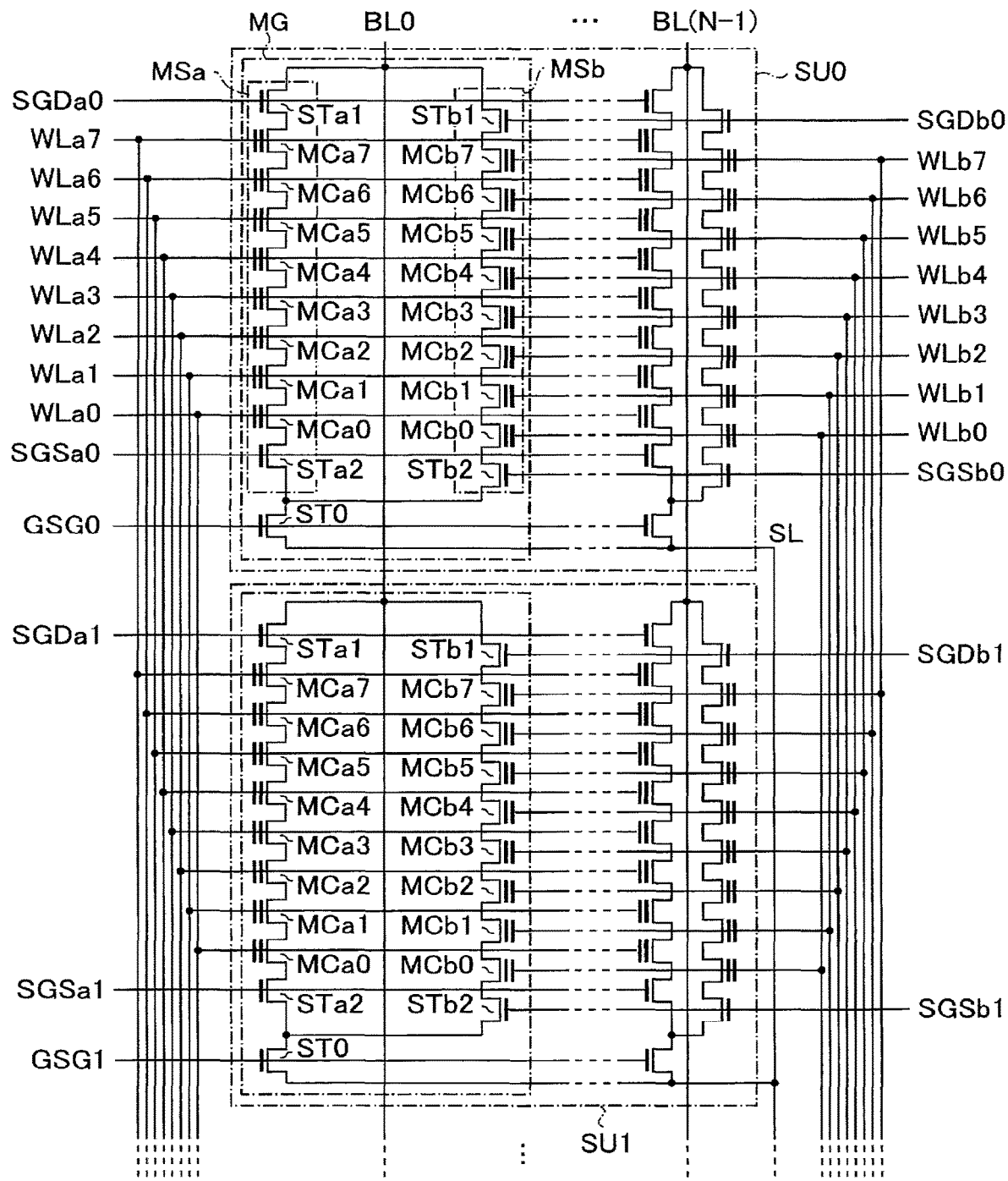
F I G. 2

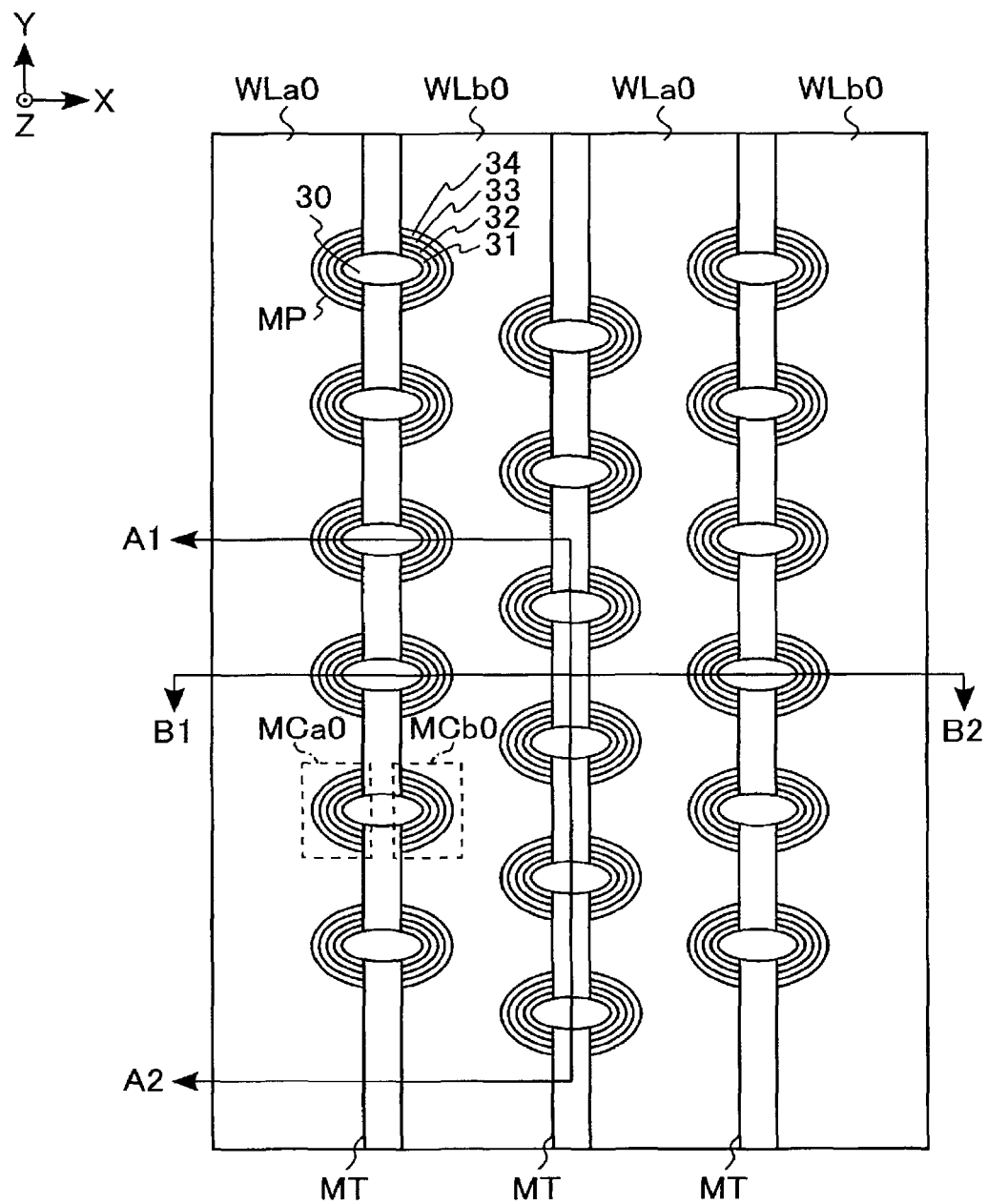
F I G. 3

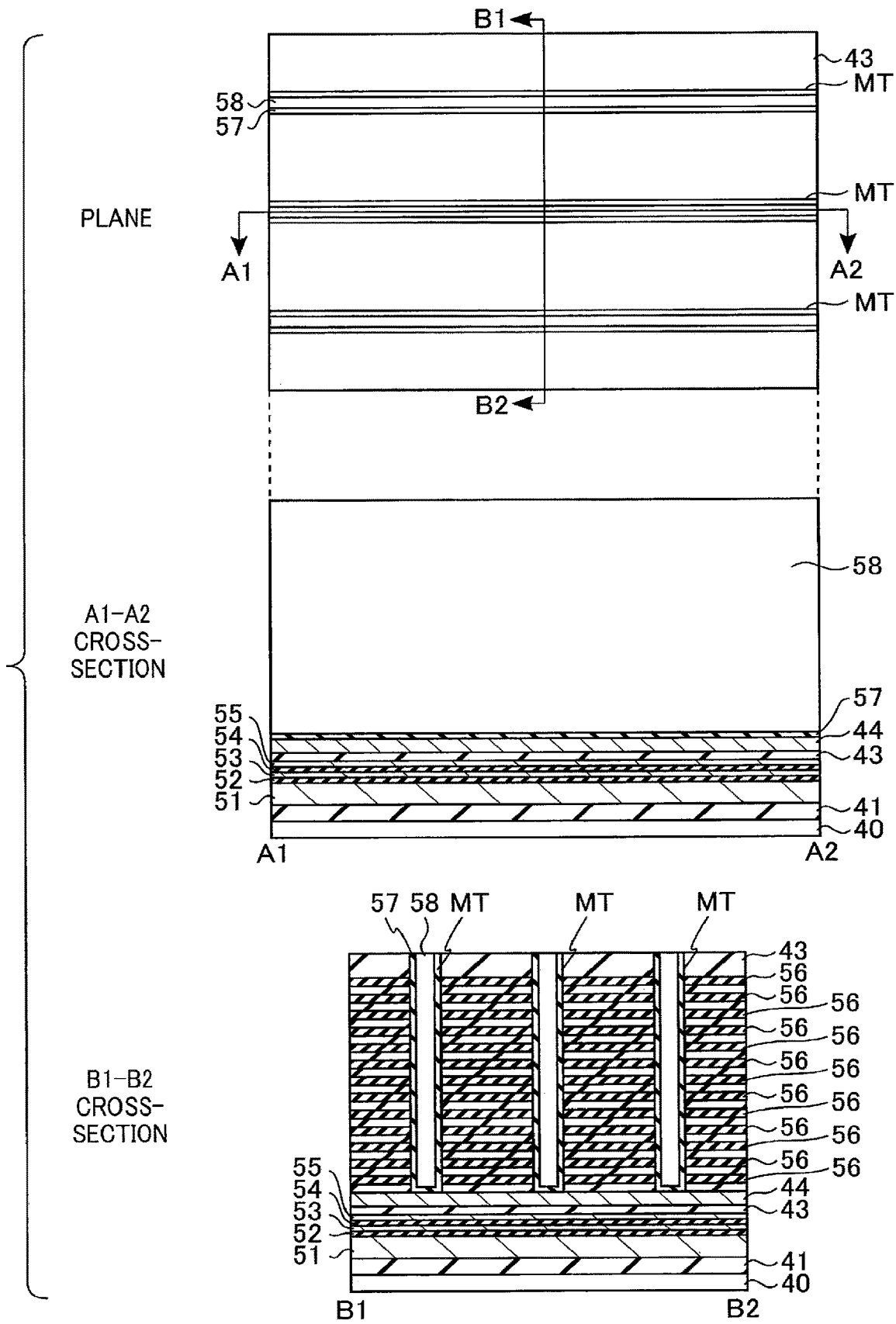
F I G. 8

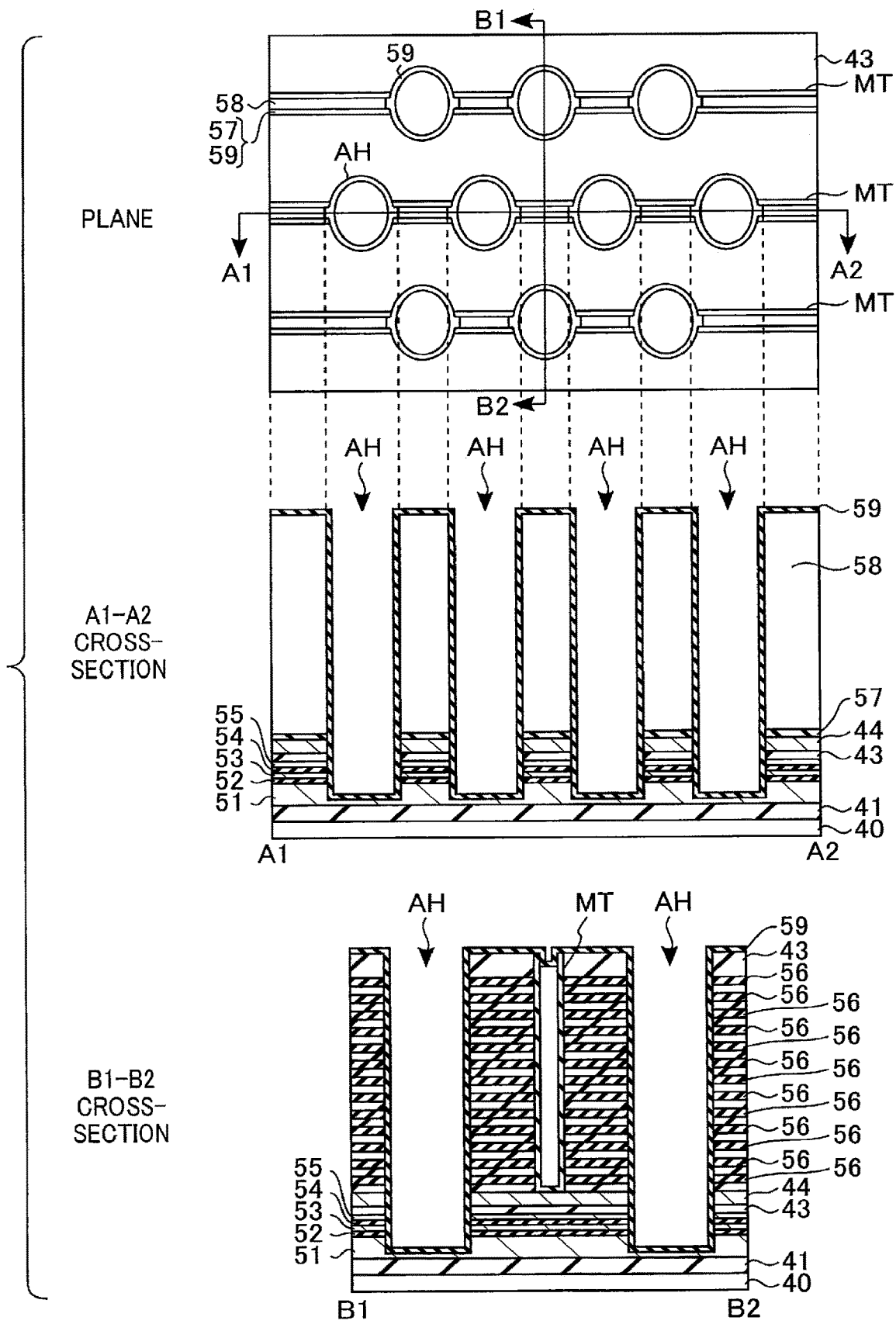
F I G. 12

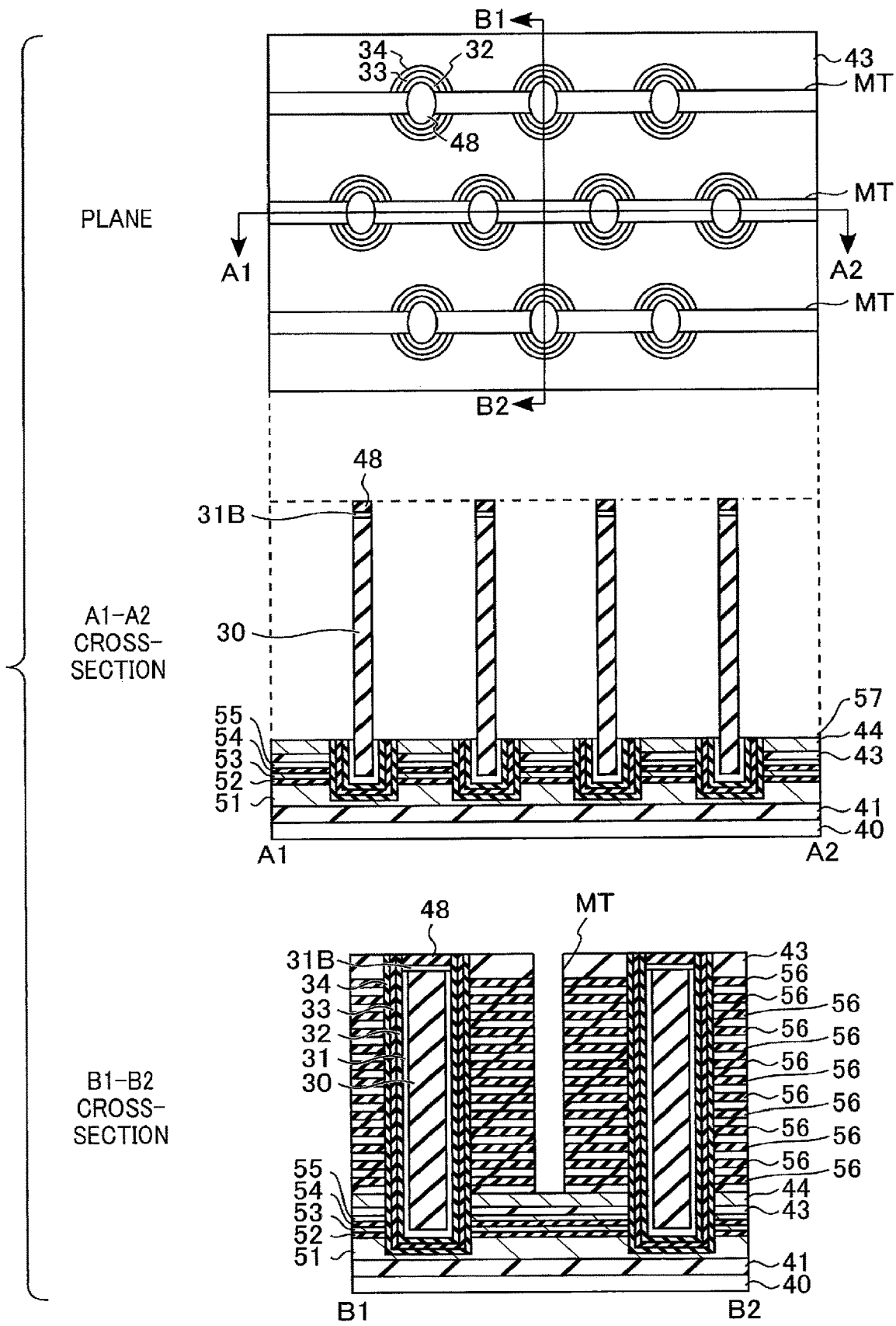
F I G. 16

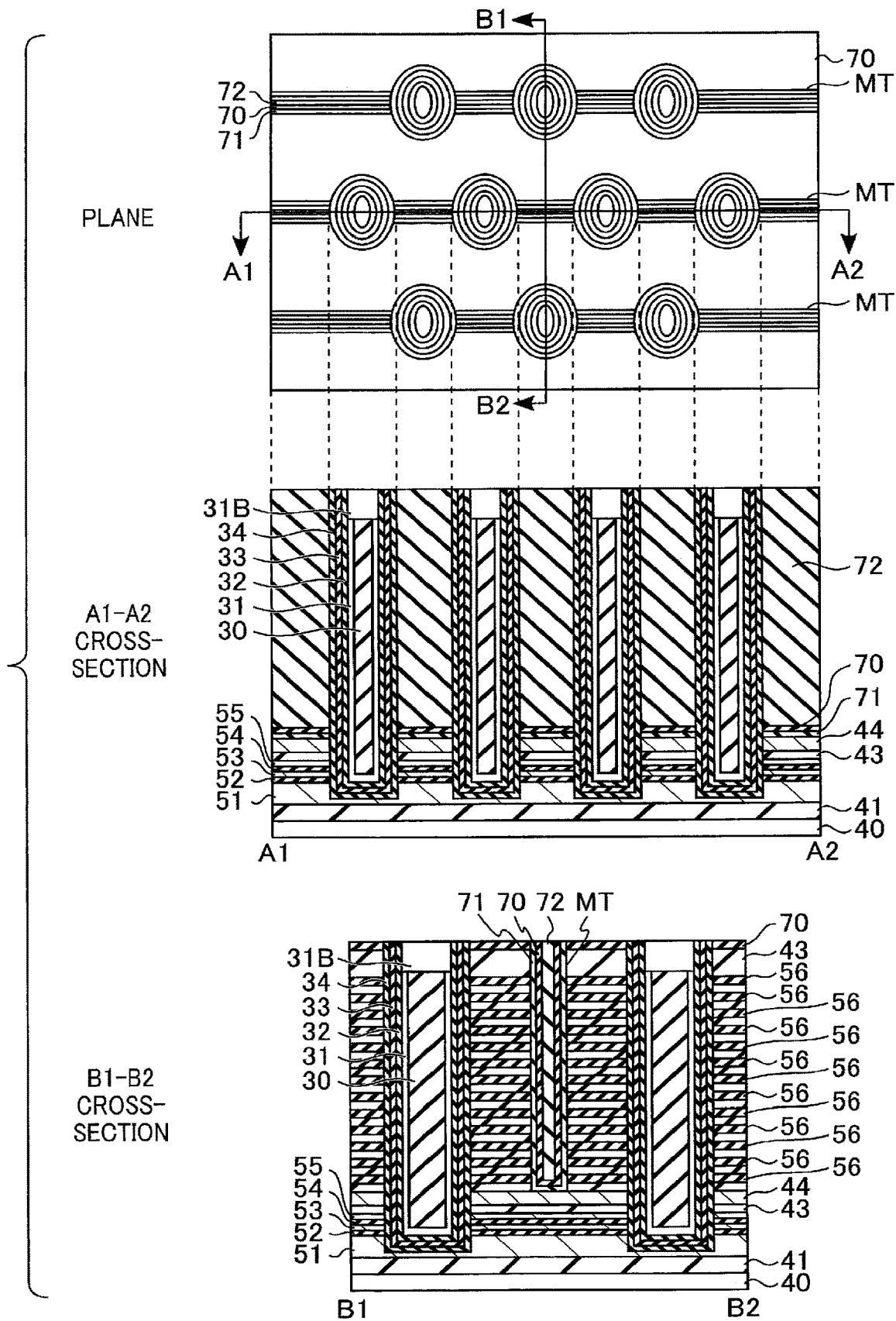
F I G. 27

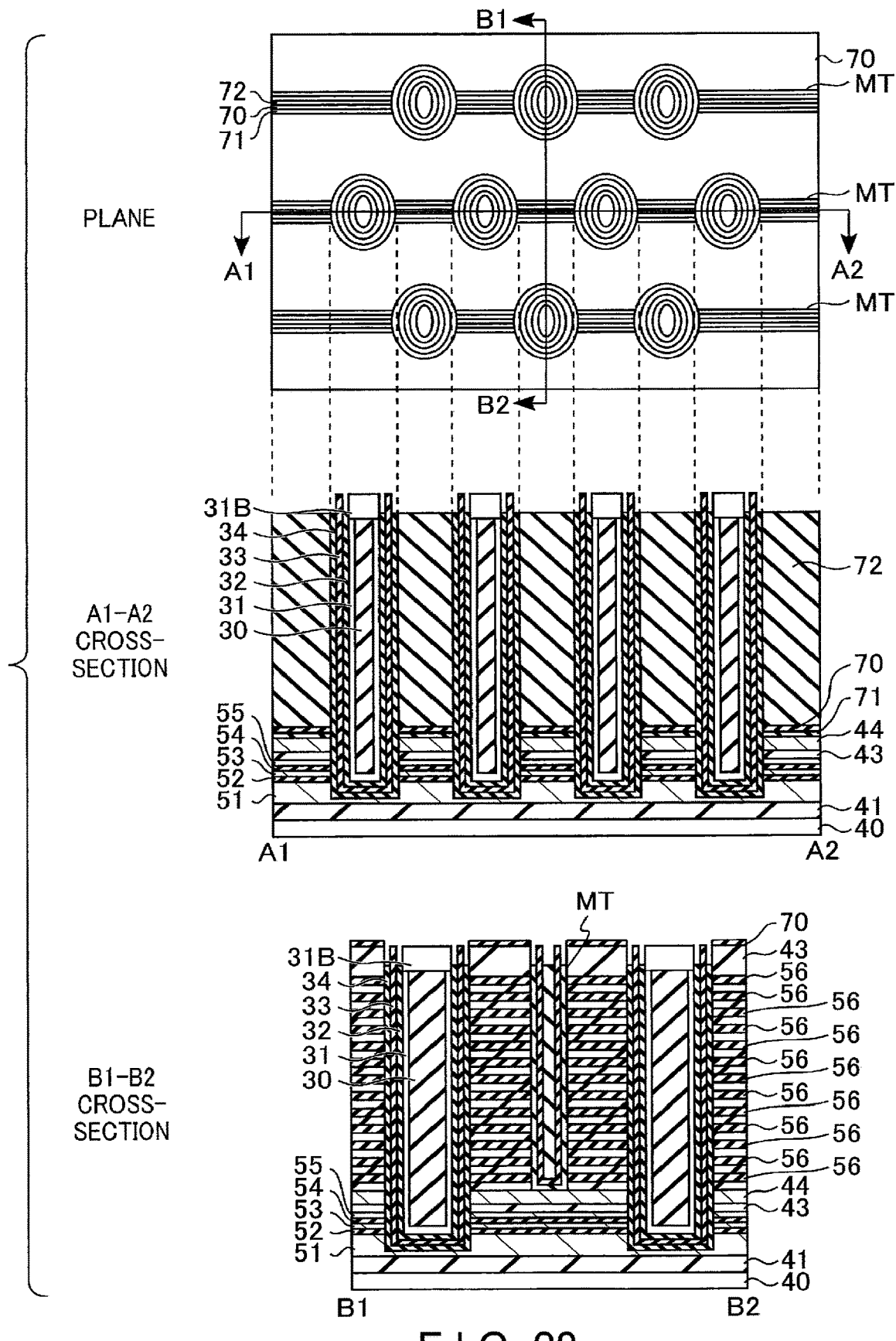
F I G. 28

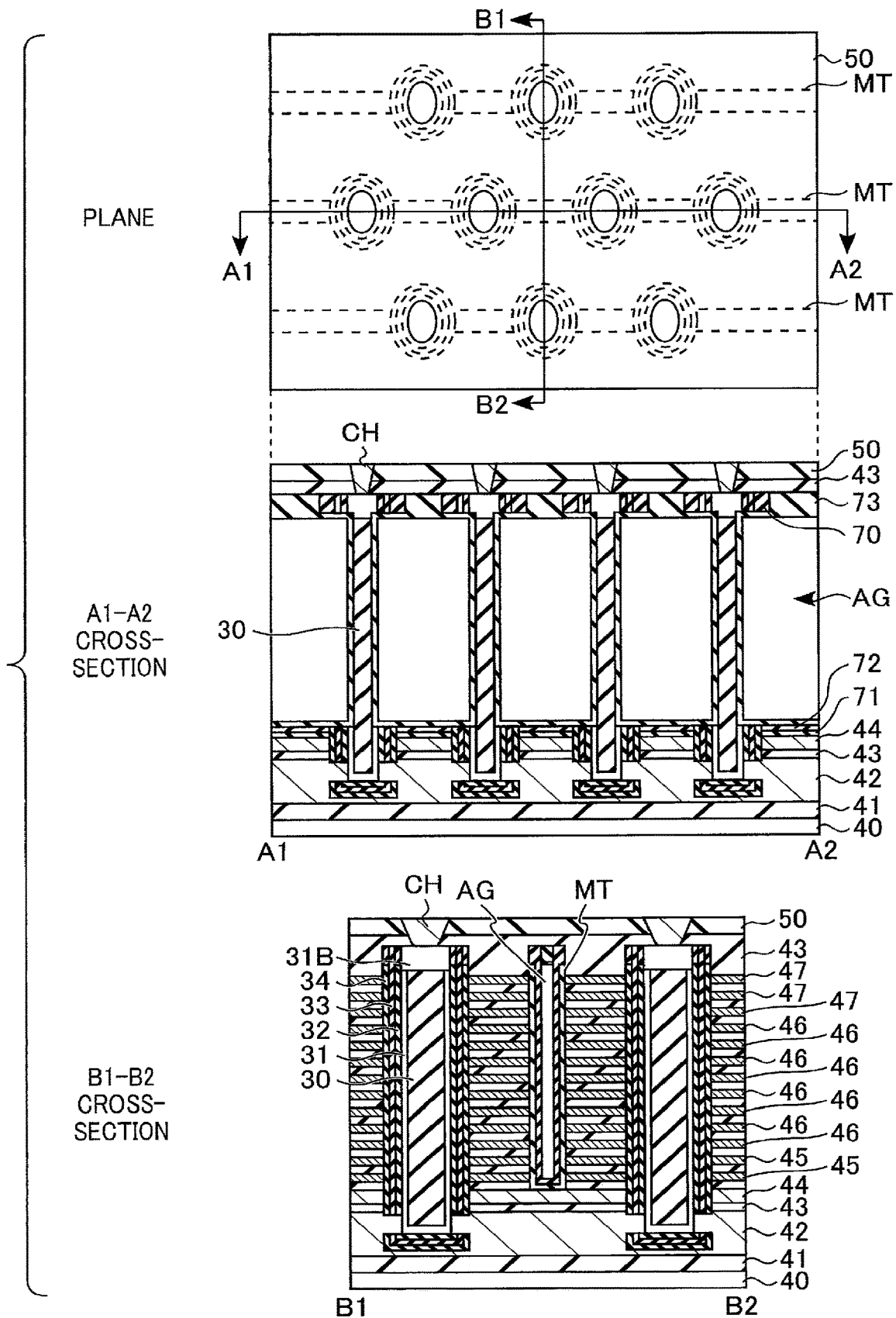
F I G. 36

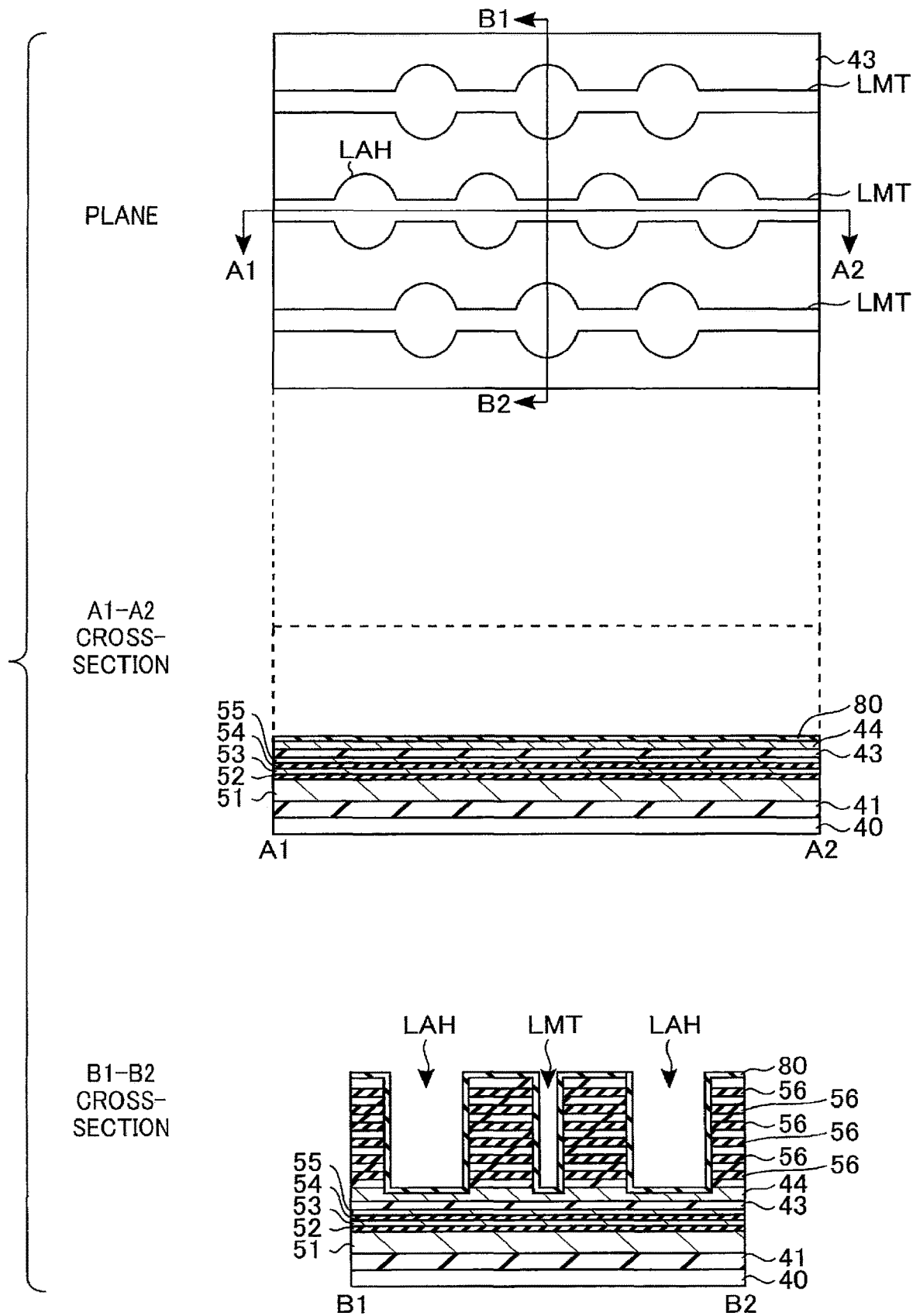
F I G. 39

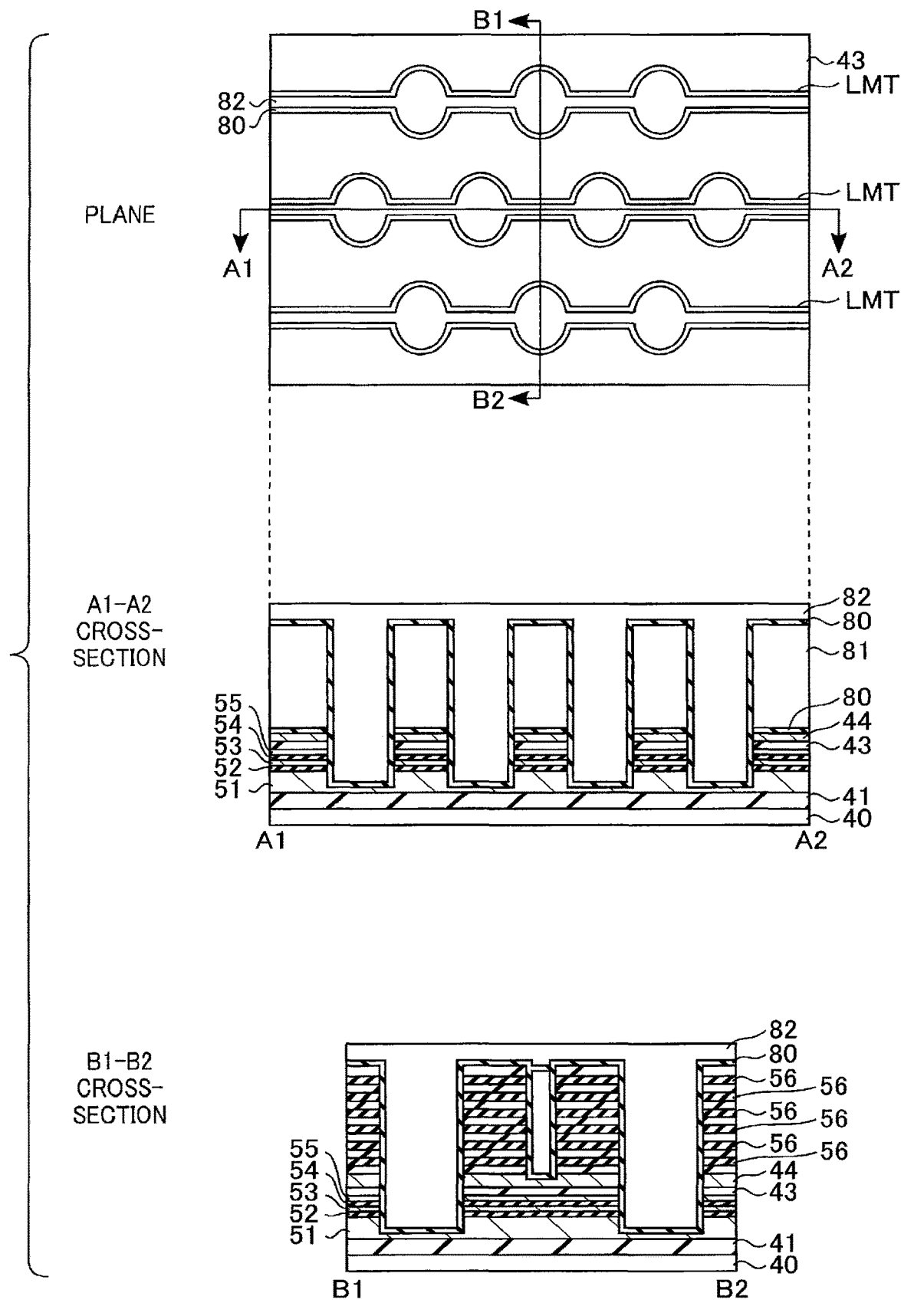
F I G. 42

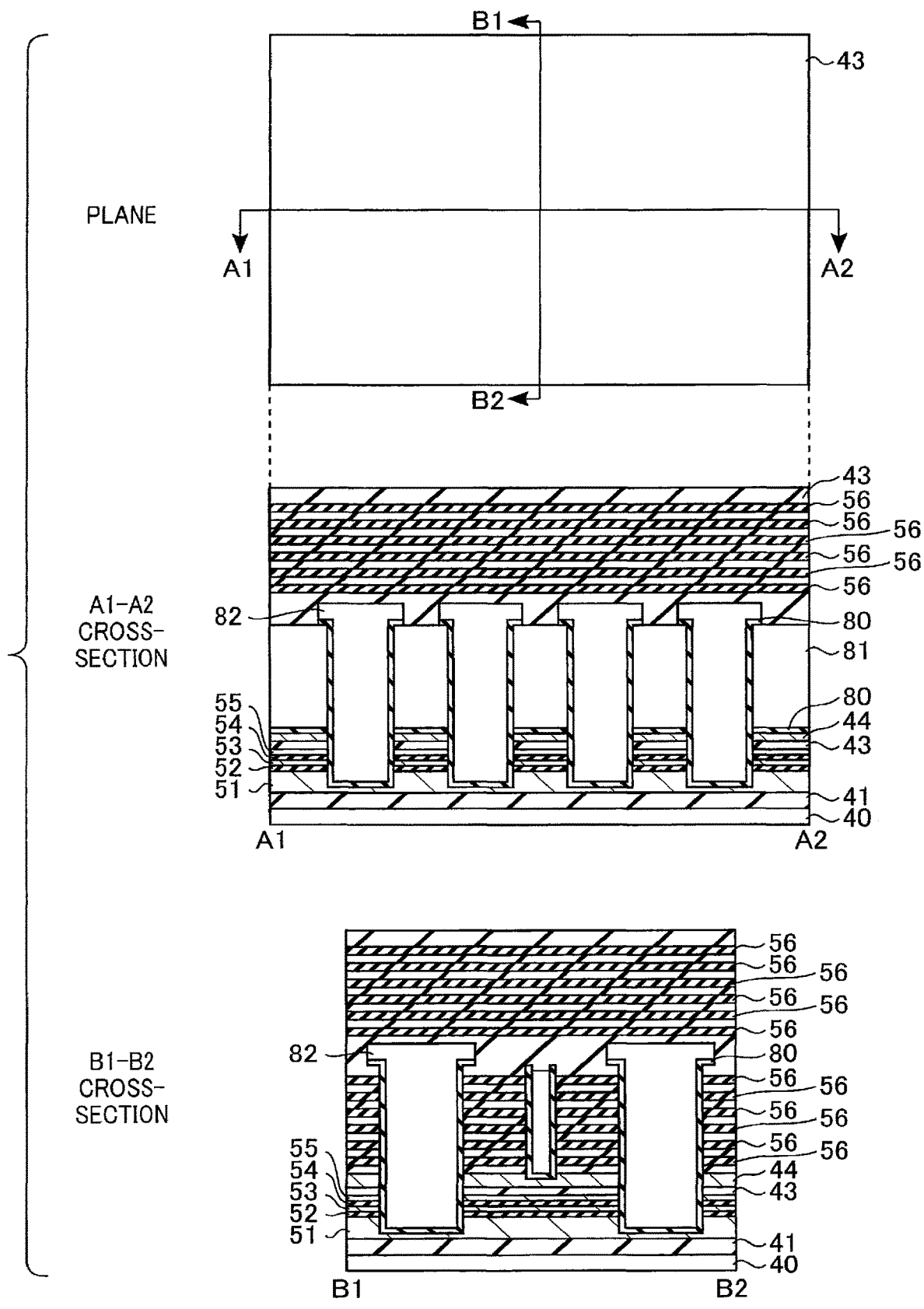
F I G. 45

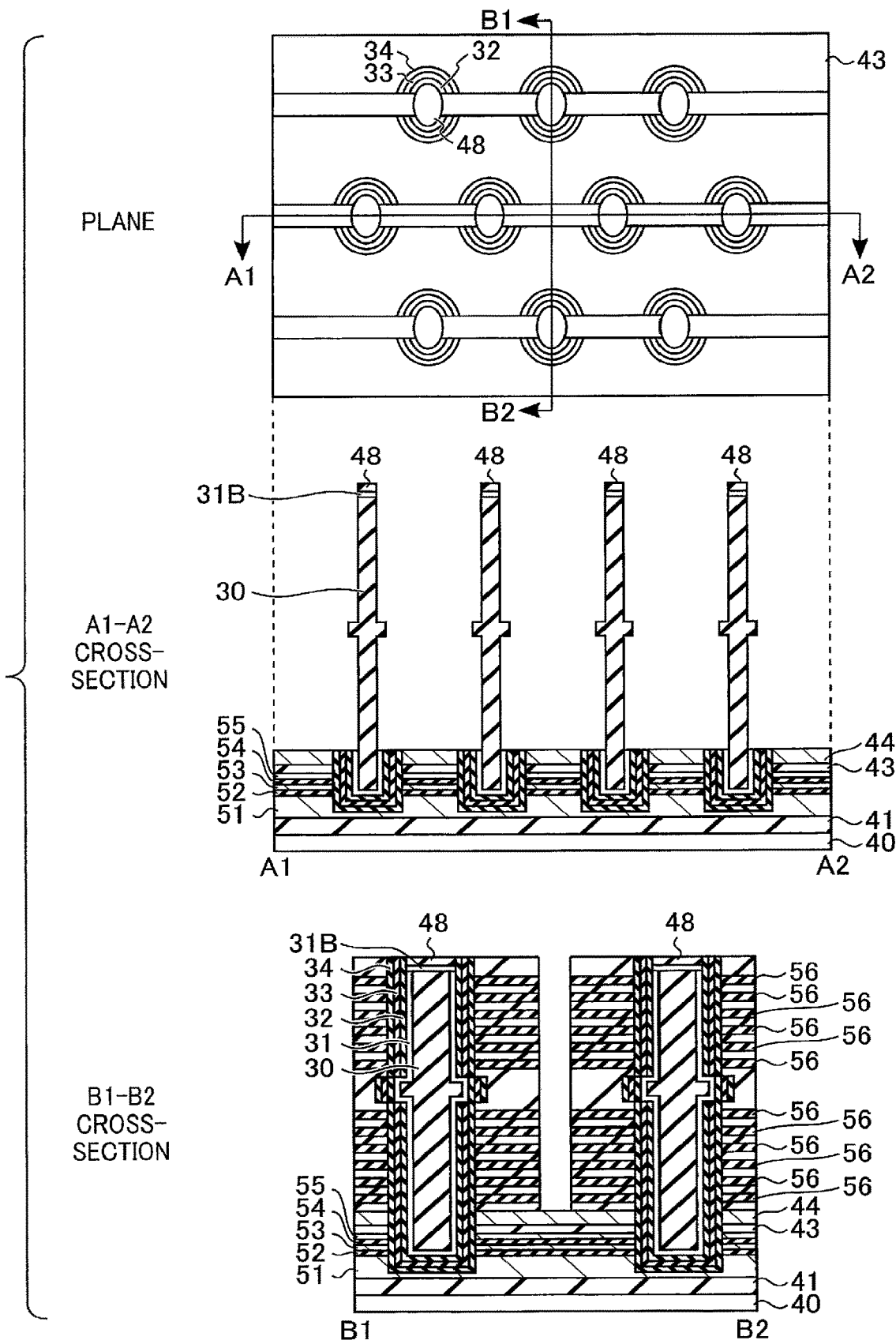
F I G. 52

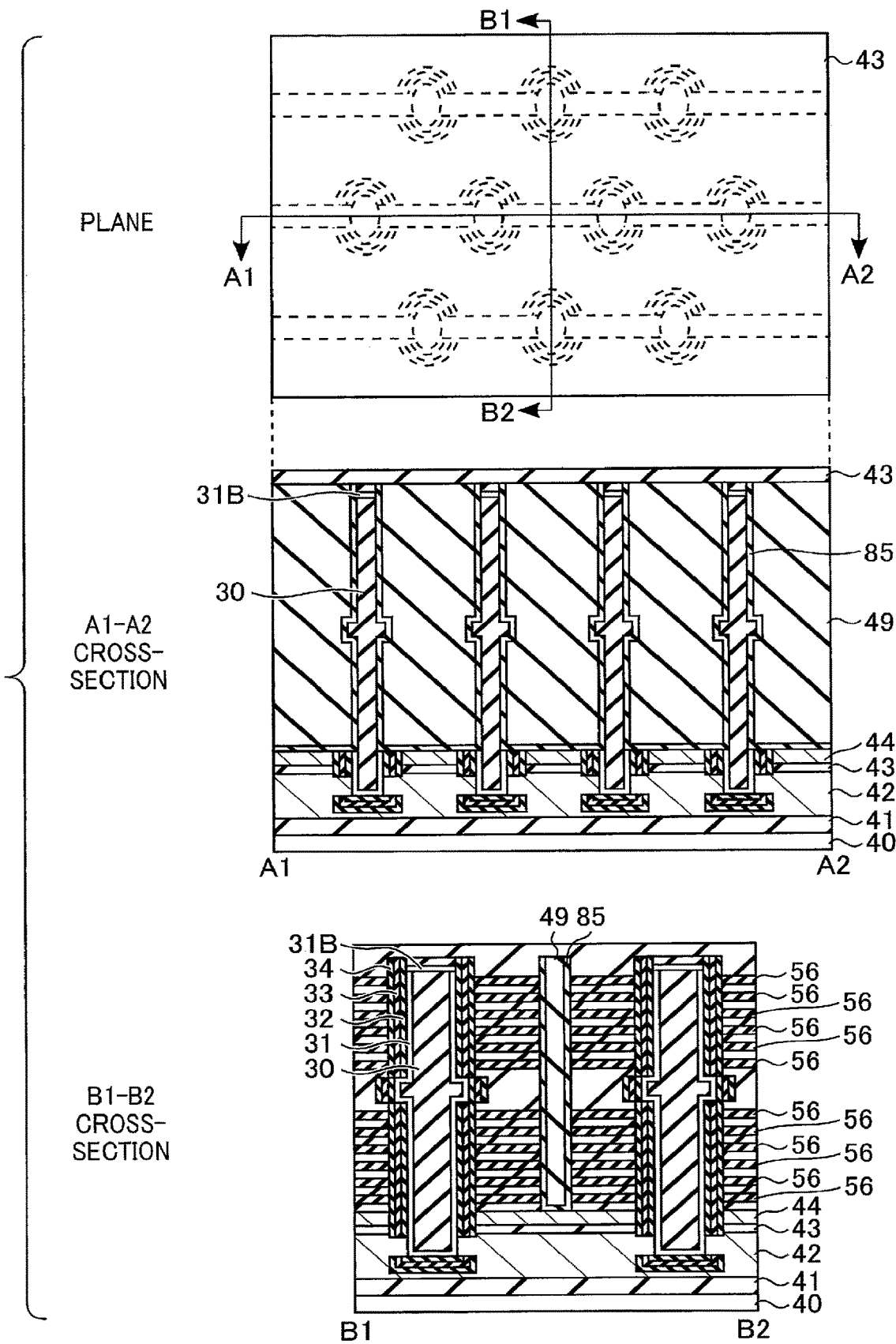
F I G. 54

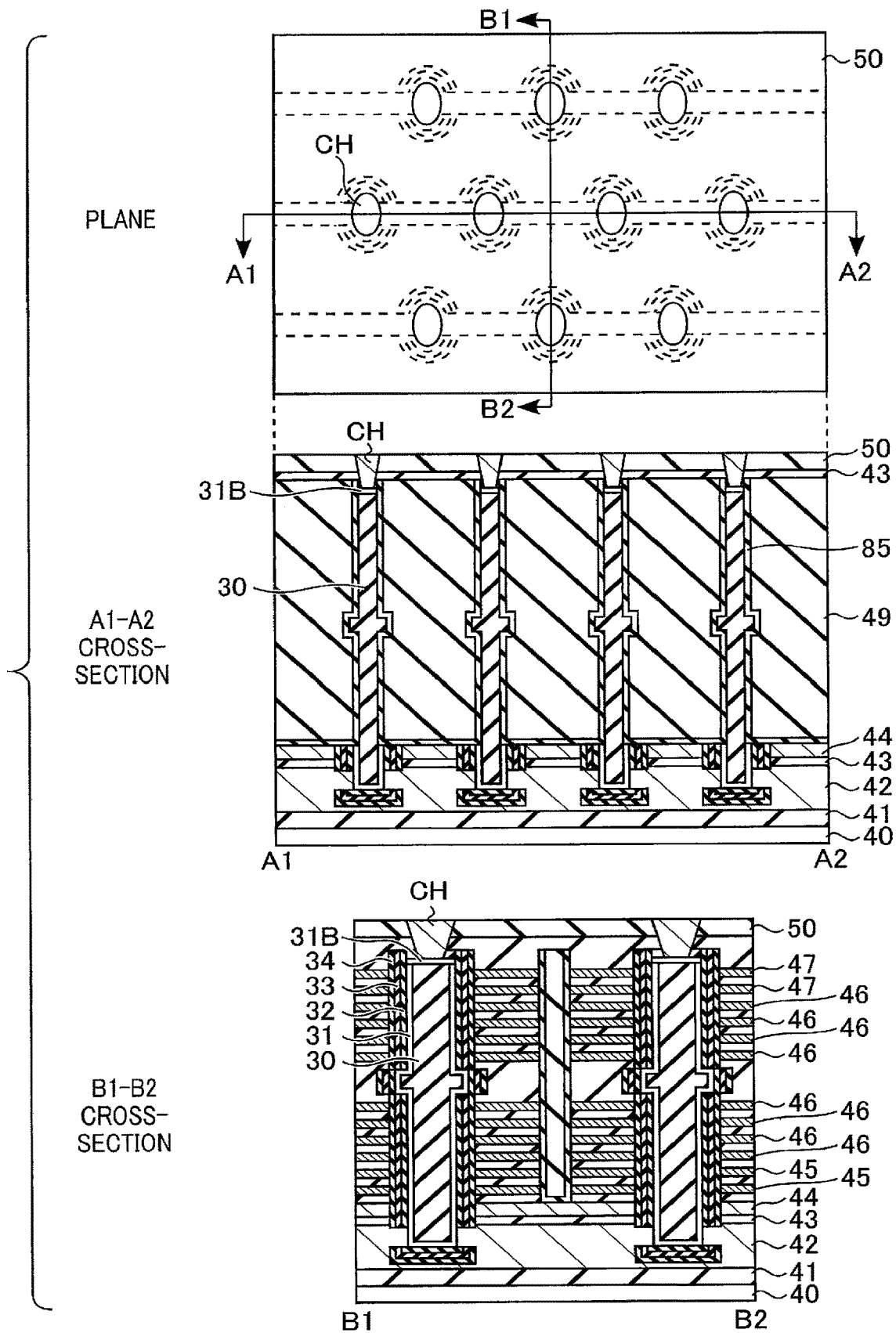
F I G. 55 ing, to a second embodiment;
SEMICONDUCTOR MEMORY DEVICE AND SEMICONDUCTOR DEVICE MANUFACTURING METHOD

CROSS-REFERENCE TO RELATED APPLICATIONS

This application is based upon and claims the benefit of priority from Japanese Patent Application No. 2018-163544, filed Aug. 31, 2018, the entire contents of which are incorporated herein by reference.

FIELD

Embodiments described herein relate generally to a semiconductor memory device and a semiconductor device manufacturing method.

BACKGROUND

As a semiconductor memory device, a NAND flash memory is known.

BRIEF DESCRIPTION OF THE DRAWINGS

FIG. 1 is a block diagram of a semiconductor memory device according to a first embodiment;
FIG. 2 is a circuit diagram of a memory cell array included in the semiconductor memory device according to the first embodiment;
FIG. 3 is a plan view of the memory cell array included in the semiconductor memory device according to the first embodiment;
FIGS. 6-21 are diagrams showing a process of manufacturing the memory cell array included in the semiconductor memory device according to the first embodiment;
FIGS. 24-36 are diagrams showing a process of manufacturing the memory cell array included in the semiconductor memory device according to the second embodiment;
FIGS. 39-55 are diagrams showing a process of manufacturing the memory cell array included in the semiconductor memory device according to the third embodiment.

DETAILED DESCRIPTION

Figure 4:
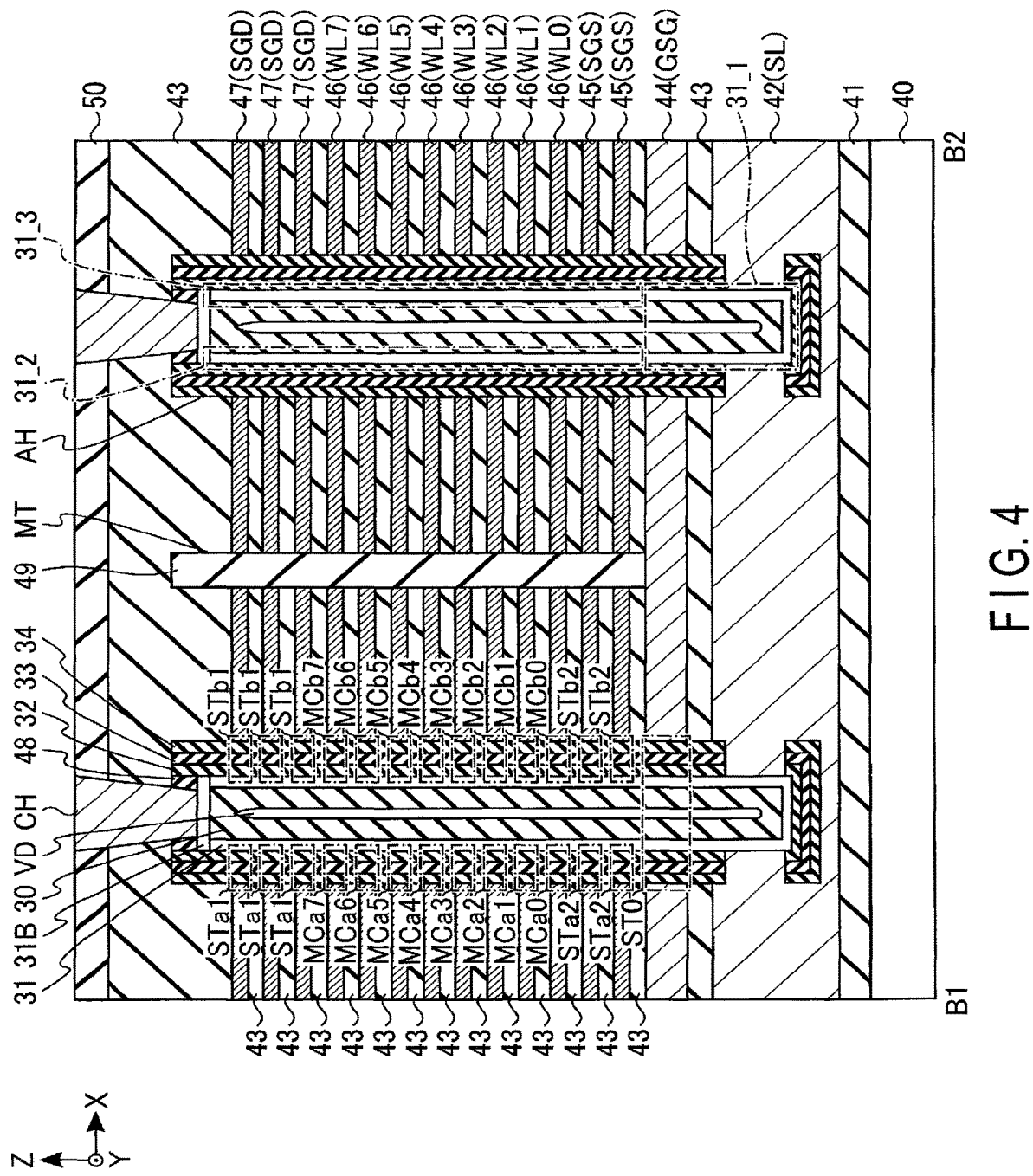
FIG. 4 is a cross-sectional view taken along line B1-B2 in FIG. 3.

In general, according to one embodiment, a first interconnection layer extending in a first direction; a second interconnection layer arranged adjacently to the first interconnection layer in a second direction intersecting the first direction, and extending in the first direction; a first insulating layer provided between the first interconnection layer and the second interconnection layer, and extending in a third direction intersecting the first direction and the second direction; a first semiconductor layer provided between the first interconnection layer and the first insulating layer, and extending in the third direction; a second semiconductor layer provided between the second interconnection layer and the first insulating layer, and extending in the third direction; a first charge storage layer provided between the first interconnection layer and the first semiconductor layer; a second charge storage layer provided between the second interconnection layer and the second semiconductor layer; and a second insulating layer provided between the first interconnection layer and the second interconnection layer, between the first semiconductor layer and the second semiconductor layer, and between the first charge storage layer and the second charge storage layer, and extending in the first and third directions.

1. First Embodiment

The semiconductor memory device according to the first embodiment will be described. Hereinafter, a three-dimensionally stacked type NAND flash memory, in which memory cell transistors are three-dimensionally stacked above a semiconductor substrate, will be described as an example of the semiconductor memory device.

1.1 Configuration 1.1.1 Overall Configuration of Semiconductor Memory Device First, an overall configuration of the semiconductor memory device will be described with reference to FIG. 1. FIG. 1 is a block diagram showing an example of the basic overall configuration of the semiconductor memory device. In FIG. 1, some of the couplings between the blocks are indicated by arrows; however, the couplings between the blocks are not limited to those shown in FIG. 1.

As shown in FIG. 1, the semiconductor memory device 1 roughly includes a memory core part 10 and a peripheral circuitry part 20.

The memory core part 10 includes a memory cell array 11, a row decoder 12, and a sense amplifier 13.

The memory cell array 11 includes a plurality of blocks BLK. In the example of FIG. 1, three blocks BLK0 to BLK2 are shown; however, the number of the blocks is not limited to three. Each block BLK is associated with a row and a column, and includes a plurality of three-dimensionally stacked memory cell transistors.

The row decoder 12 decodes a row address received from an external controller (not shown). The row decoder 12 selects a line extending in the row direction of the memory cell array 11 based on the decoding result. Specifically, the row decoder 12 applies voltages to various interconnections for selecting a line extending in the row direction.

When data is read, the sense amplifier 13 senses data read from a block BLK. When data is written, the sense amplifier 13 applies a voltage corresponding to write data to the memory cell array 11.

The peripheral circuitry part 20 includes a sequencer 21 and a voltage generator 22.

The sequencer 21 controls the entire operation of the semiconductor memory device 1. Specifically, the sequencer 21 controls, for example, the voltage generator 22, the row decoder 12, and the sense amplifier 13 in the write operation, read operation, and erase operation.

The voltage generator 22 generates voltages necessary for the write operation, read operation, and erase operation, and supplies the voltages to, for example, the row decoder 12 and the sense amplifier 13.

1.1.2 Circuit Configuration of Memory Cell Array

Next, a circuit configuration of the memory cell array 11 will be described with reference to FIG. 2. FIG. 2 is a circuit diagram of the memory cell array 11 regarding one block BLK.

As shown in FIG. 2, the block BLK includes a plurality of string units SU (SU0, SU1, ... ). Each string unit SU includes a plurality of memory groups MG. Each memory group MG includes two memory strings MSa and MSb, and a select transistor ST0. Hereinafter, memory strings MSa and MSb will be each referred to as a memory string MS when a distinction is not made therebetween.

Memory string MSa includes, for example, eight memory cell transistors MCa0 to MCa7, and select transistors STa1 and STa2. Similarly, memory string MSb includes, for example, eight memory cell transistors MCb0 to MCb7, and select transistors STb1 and STb2. Hereinafter, memory cell transistors MCa0 to MCa7 and MCb0 to MCb7 will be each referred to as a memory cell transistor MC when a distinction is not made therebetween. Select transistors STa1 and STb1 will be each referred to as select transistor ST1, and select transistors STa2 and STb2 will be each referred to as select transistor ST2, when a distinction is not made therebetween.

Each memory cell transistor MC includes a control gate and a charge storage layer, and non-volatilely holds data. The memory cell transistor MC may be of a MONOS type which uses an insulating layer as the charge storage layer, or may be of an FG type which uses a conductive layer as the charge storage layer. In the present embodiment, a MONOS-type memory cell transistor will be described as an example. The number of memory cell transistors MC included in each memory string MS may be 16, 32, 48, 64, 96, or 128, etc., and the number is not limited to these numbers. Furthermore, the number of select transistors ST1 and ST2 included in each memory string MS can be any desired number, as long as at least one select transistor ST1 and one select transistor ST2 are included.

The memory cell transistors MC and select transistors ST1 and ST2 included in each memory string MS are coupled in series. More specifically, in memory string MSa, the current paths of select transistor STa2, memory cell transistors MCa0 to MCa7, and select transistor STa1 are coupled in series in order. Similarly, in memory string MSb, the current paths of select transistor STb2, memory cell transistors MCb0 to MCb7, and select transistor STb1 are coupled in series in order. The drains of select transistor STa1 and select transistor STb1 included in one memory group MG are coupled in common to any of a plurality of bit lines BL (BL0, ... , BL(N-1), where (N-1) is an integer equal to or greater than 2). A plurality of bit lines BL are each independently controlled by the sense amplifier 13. The sources of select transistor STa2 and select transistor STb2 included in one memory group MG are coupled in common to the drain of select transistor ST0. The source of select transistor ST0 is coupled to a source line SL.

In each string unit SU, the gates of a plurality of select transistors STa1 are coupled in common to select gate line SGDa, and the gates of a plurality of select transistors STb1 are coupled in common to select gate line SGDb. The gates of a plurality of select transistors STa2 are coupled in common to select gate line SGSa, and the gates of a plurality of select transistors STb2 are coupled in common to select gate line SGSb. The gates of a plurality of select transistors ST0 are coupled in common to select gate line GSG.

Specifically, in string unit SU0, the gates of a plurality of select transistors STa1 are coupled in common to select gate line SGDa0. The gates of a plurality of select transistors STb1 are coupled in common to select gate line SGDb0. The gates of a plurality of select transistors STa2 are coupled in common to select gate line SGSa0. The gates of a plurality of select transistors STb2 are coupled in common to select gate line SGSb0. The gates of a plurality of select transistors ST0 are coupled in common to select gate line GSG0.

Similarly, in string unit SU1, the gates of a plurality of select transistors STa1 are coupled to select gate line SGDa1. The gates of a plurality of select transistors STb1 are coupled in common to select gate line SGDb1. The gates of a plurality of select transistors STa2 are coupled in common to select gate line SGSa1. The gates of a plurality of select transistors STb2 are coupled in common to select gate line SGSb1. The gates of a plurality of select transistors ST0 are coupled in common to select gate line GSG1.

Hereinafter, select gate line SGDa (SGDa0, SGDa1, ... ) and SGDb (SGDb0, SGDb1, ... ) will be each referred to as select gate line SGD, and select gate line SGSa (SGSa0, SGSa1, ... ) and SGSb (SGSb0, SGSb1, ... ) will be each referred to as select gate line SGS, when a distinction is not made therebetween. Select gate lines GSG0, GSG1, ... will be referred to as select gate line GSG when a distinction is not made therebetween. Select gate lines GSG0, GSG1, may be coupled to one another. Select gate lines SGD, SGS, and GSG are each independently controlled by the row decoder 12.

The control gates of a plurality of memory cell transistors MCa0 to MCa7 and MCb0 to MCb7 in the same block BLK are coupled in common to respective word lines WLa0 to WLa7 and WLb0 to WLb7 provided in respective blocks BLK. Word lines WLa0 to WLa7 and WLb0 to WLb7 are each independently controlled by the row decoder 12. Hereinafter, word lines WLa and WLb will be each referred to as a word line WL when a distinction is not made therebetween.

The block BLK is, for example, a unit of data erasing, and data held by the memory cell transistors MC included in the same block BLK is collectively erased. Each of the write operation and read operation is collectively performed on a plurality of memory cell transistors MC coupled in common to one word line WL of one string unit SU.

In the memory cell array 11, a plurality of memory groups MG arranged in the same line are coupled in common to one bit line BL. In other words, one memory group MG of each string unit SU is coupled in common to a bit line BL over a plurality of string units SU of a plurality of blocks BLK. Each string unit SU includes a plurality of memory groups MG coupled to different bit lines BL and coupled to the same select gate line SGD. Each block BLK includes a plurality of string units SU sharing the word lines WL. The memory cell array 11 includes a plurality of blocks BLK sharing the bit lines BL. In the memory cell array 11, select gate lines GSG, select gate lines SGS, the word lines WL, and select gate lines SGD are stacked above the semiconductor substrate; accordingly, the memory cell transistors MC are three-dimensionally stacked.

1.1.3 Planar Configuration of Memory Cell Array

Next, a planar configuration of the memory cell array 11 will be described with reference to FIG. 3. FIG. 3 shows an example of the planar layout of word lines WLa0 and WLb0.

As shown in FIG. 3, a plurality of word lines WLa0 and WLb0 which extend in a Y direction parallel to the semiconductor substrate are alternately arranged to be adjacent to each other in an X direction parallel to the semiconductor substrate and orthogonal to the Y direction. Word lines WL are separate from one another in the X direction by memory trenches MT filled with an insulating material. Between word lines WL, a plurality of memory pillars MP are arranged in the Y direction. A plurality of memory pillars MP arranged between word lines WLa0 and WLb0 are in a staggered arrangement. As part of the side surface of each memory pillar MP, a block insulating film 34, a charge storage layer 33, a tunnel insulating film 32, and a semiconductor layer 31 are formed in order, and the inside of the memory pillar MP is filled with a core layer 30. In other words, the block insulating film 34, the charge storage layer 33, the tunnel insulating film 32, and the semiconductor layer 31 are each divided into two in the X direction by the memory trench MT. The memory trench MT is divided into multiple portions in the Y direction by the core layer 30.

For example, in a memory pillar MP provided between word lines WLa0 and WLb0, the area including word line WLa0, the divisions of the block insulating film 34, the charge storage layer 33, the tunnel insulating film 32, and the semiconductor layer 31 on the word line WLa0 side with respect to the memory trench MT, and part of the core layer 30, functions as memory cell transistor MCa0, that is, as one storage. Similarly, the area including word line WLb0, the divisions of the block insulating film 34, the charge storage layer 33, the tunnel insulating film 32, and the semiconductor layer 31 on the word line WLb0 side with respect to the memory trench MT, and part of the core layer 30, functions as memory cell transistor MCb0.

The same is true for the other memory cell transistors MC and select transistors ST1 and ST2. For example, the area including select gate line SGDa0, the divisions of the block insulating film 34, the charge storage layer 33, the tunnel insulating film 32, and the semiconductor layer 31 on the select gate line SGDa0 side with respect to the memory trench MT, and part of the core layer 30, functions as select transistor STa1 of string unit SU0. Similarly, the area including select gate line SGDb0, the divisions of the block insulating film 34, the charge storage layer 33, the tunnel insulating film 32, and the semiconductor layer 31 on the select gate line SGDb0 side with respect to the memory trench MT, and part of the core layer 30, functions as select transistor STb1 of string unit SU0.

1.1.4 Cross-Sectional Configuration of Memory Cell Array

Figure 5:
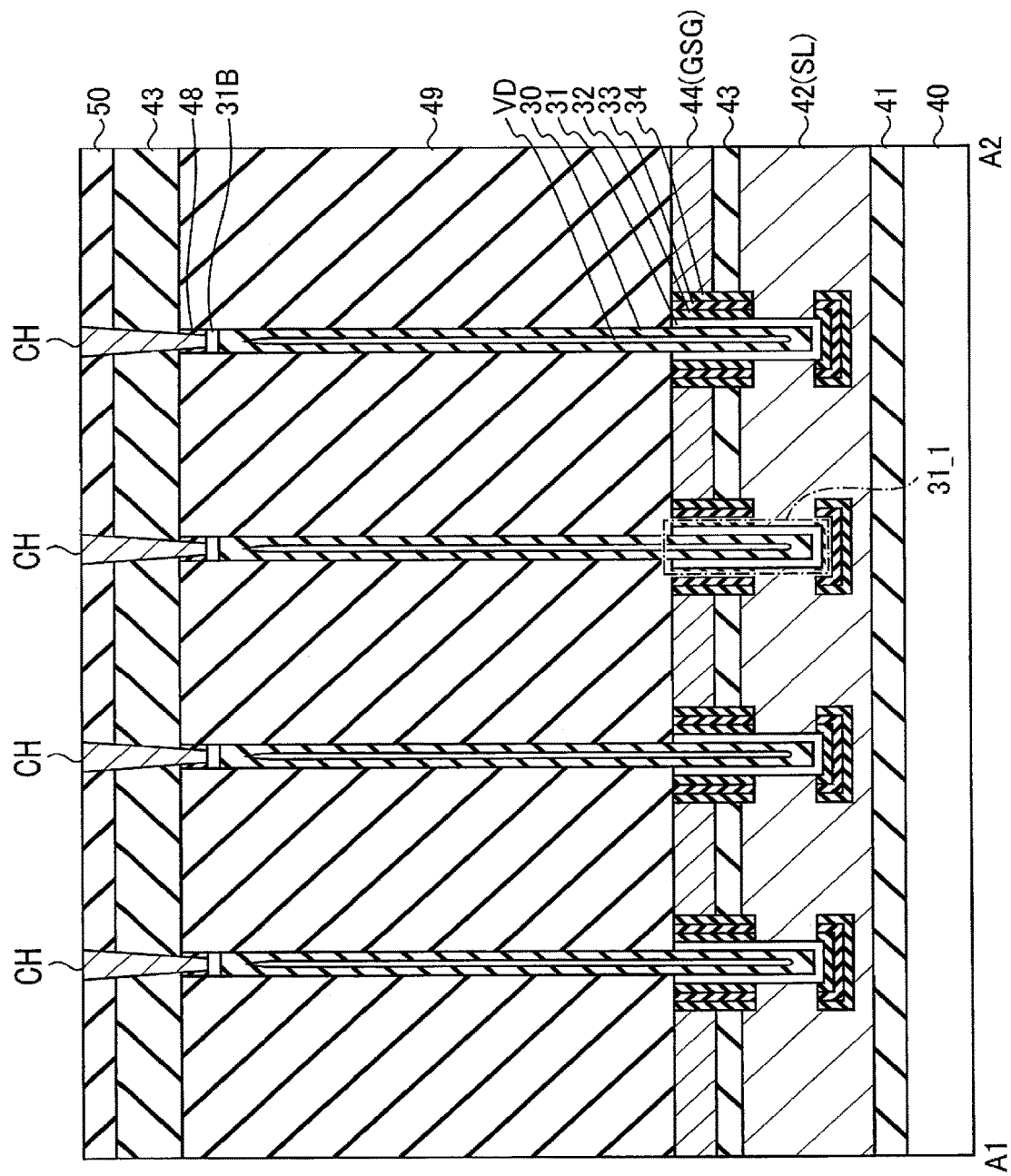
FIG. 5 is a cross-sectional view taken along line A1-A2 in FIG. 3.

Next, a cross-sectional configuration of the memory cell array 11 will be described with reference to FIGS. 4 and 5. FIG. 4 is a cross-sectional view of the memory cell array 11, taken along line B1-B2 shown in FIG. 3. FIG. 5 is a cross-sectional view of the memory cell array 11, taken along line A1-A2 shown in FIG. 3. Described below as an example is the case where eight layers of word lines WL, two layers of select gate lines SGS, and three layers of select gate lines SGD are formed. The number of layers of word lines WL is not limited to eight. The number of layers of each of select gate lines SGS and select gate lines SGD is not limited either. The number of layers of each of select gate lines SGS and select gate lines SGD may be any number equal to or greater than one.

As shown in FIG. 4, an insulating layer 41 is formed on the semiconductor substrate 40. For the insulating layer 41, for example, a silicon oxide film ($SiO_2$) is used. An interconnection layer 42, which functions as a source line SL, is formed on the insulating layer 41. The interconnection layer 42 is made of a conductive material, for example, an n-type semiconductor to which an impurity is added, or a metal material.

For example, the interconnection layer 42 may also be a laminated structure of a semiconductor layer and a metal layer. Described below is the case where polycrystalline silicon (polysilicon) with, for example, phosphorus (P) doped therein is used for the interconnection layer 42.

Circuits such as the row decoder 12 and the sense amplifier 13 may be provided in the region where the insulating layer 41 is formed, i.e., between the semiconductor substrate 40 and the interconnection layer 42.

An insulating layer 43 is formed on the interconnection layer 42, and an interconnection layer 44 that functions as select gate line GSG is formed on the insulating layer 43. For the insulating layer 43, for example, $SiO_2$ is used. Interconnection layer 44 is made of a conductive material, for example, polysilicon with, for example, phosphorus (P) doped therein, and also functions as an etching stopper used when forming the memory trench MT in the method for manufacturing the memory cell array to be described later. Above interconnection layer 44, for example, two interconnection layers 45 that function as select gate lines SGS are stacked with insulating layers 43 interposed therebetween. Above interconnection layers 45, a plurality of interconnection layers 46 that function as word lines WL and a plurality of interconnection layers 47 that function as select gate lines SGD are sequentially stacked with a plurality of insulating layers 43 interposed therebetween so that they are separate from one another in a Z direction perpendicular to the semiconductor substrate 40 and intersecting the X direction and the Y direction. Namely, a plurality of interconnection layers 43 and a plurality of interconnection layers 46 are alternately stacked on interconnection layer 44 and, for example, three insulating layers 43 and three interconnection layers 47 are alternately stacked on the topmost interconnection layer 46.

Interconnection layers 45 to 47 are made of a conductive material, for example, an n-type or p-type semiconductor to which an impurity is added, or a metal material. Described below is the case where tungsten (W) and titanium nitride (TiN) are used for interconnection layers 45 to 47. TiN has a function as a barrier layer for preventing a reaction between W and $SiO_2$, and as an adhesive layer for improving adhesion of W when forming a layer of W by, for example, chemical vapor deposition (CVD).

On the topmost interconnection layer 47, insulating layer 43 and insulating layer 50 are stacked. For insulating layer 50, for example, $SiO_2$ is used.

A memory trench MT that extends in the Y direction in such a manner as to pass through interconnection layers 45 to 47 and a plurality of insulating layers 43 to have its bottom in contact with interconnection layer 44 is formed. The memory trench MT divides interconnection layers 45 to 47 provided between two memory pillars MP in the X direction. The memory trench MT is filled with insulating layer 49. For insulating layer 49, for example, $SiO_2$ is used. In the present embodiment, the case where spin on glass (SOG), which has an excellent filling property, is used as $SiO_2$ for insulating layer 49 will be described. As an SOG application material, a material containing polysilazane may be used.

A plurality of memory pillars MP and memory trenches MT are alternately arranged in the X direction. One memory pillar MP functions as one memory group MG. The memory pillar MP includes a core layer 30, a semiconductor layer 31, a cap layer 31B, a tunnel insulating film 32, a charge storage layer 33, a block insulating layer 34, and an insulating layer 48.

Specifically, a hole AH corresponding to the memory pillar MP is formed in such a manner as to pass through interconnection layers 44 to 47 and a plurality of insulating layers 43 to have its bottom reach the inside of interconnection layer 42. On the bottom and part of the side surface of the hole AH, the block insulating film 34, the charge storage layer 33, the tunnel insulating film 32, and the semiconductor layer 31 are sequentially stacked. The semiconductor layer 31 is a region where the channels of the memory cell transistor MC and select transistors ST0, ST1, and ST2 are formed. Therefore, the semiconductor layer 31 functions as a signal line that couples the current paths of the select transistors ST0 to ST2 and the memory cell transistor MC.

In addition, the semiconductor layer 31 roughly includes three portions, that is, semiconductor layers 31_1 to 31_3. Semiconductor layer 31_1 includes the region from the bottom of the semiconductor layer 31 to the top surface of interconnection layer 44, i.e., the region below the bottom surface of the memory trench MT. Since semiconductor layer 31_1 is below the bottom surface of the memory trench MT, the memory trench MT does not divide the semiconductor layer 31. Accordingly, semiconductor layer 31_1 has a cylindrical shape surrounding the core layer 30. Semiconductor layer 31_2 and semiconductor layer 31_3 are positioned above the top surface of interconnection layer 44, i.e., above the bottom surface of the memory trench MT. Semiconductor layer 31_2 and semiconductor layer 31_3 are each divided into two in the X direction by the memory trench MT. In the case of FIG. 4, the semiconductor layer 31 on the left side of the memory pillar MP in the figure corresponds to semiconductor layer 31_2. Semiconductor layer 31_2 is a region where the channels of memory string MSa are formed. The semiconductor layer 31 on the right side of the memory pillar MP in the figure corresponds to semiconductor layer 31_3. Semiconductor layer 31_3 is a region where the channels of memory string MSb are formed.

Inside interconnection layer 42, part of the block insulating film 34, charge storage layer 33, and tunnel insulating film 32 on the hole AH side surface is removed, and interconnection layer 42 is in contact with part of the side surface of the semiconductor layer 31.

The core layer 30 is provided to fill the inside of the semiconductor layer 31, and a void VD is formed inside the core layer 30. The shape of the void VD varies depending on the shape of the hole AH, and the step coverage, etc. of the insulating material used for the core layer 30, which depends on the method of forming the layer of the insulating material, etc. In the case of FIG. 4, one void VD that extends in the core layer 30 in the Z direction is formed; however, a plurality of voids VD may be scattered, for example, in the Z direction. Alternatively, no void VD may be formed. On the semiconductor layer 31 (semiconductor layer 31_2 and semiconductor layer 31_3) and the core layer 30, the cap layer 31B with a side surface in contact with the tunnel insulating film 32 is formed. On the cap layer 31B, an insulating layer 48 with a side surface in contact with the tunnel insulating film 32 is formed.

For the core layer 30, the tunnel insulating film 32, and the block insulating film 34, $SiO_2$ formed by CVD is used, for example. For the charge storage layer 33 and insulating layer 48, for example, a silicon nitride film (SiN) is used. For the semiconductor layer 31 and the cap layer 31B, for example, polysilicon is used.

In the case of FIG. 4, interconnection layer 45 in contact with the left side of the memory pillar MP in the figure functions as select gate line SGSa, for example, eight interconnection layers 46 in contact with the left side thereof function as word lines WLa0 to WLa7 in order from the bottom layer, and interconnection layer 47 in contact with the left side thereof functions as select gate line SGDa. Similarly, interconnection layer 45 in contact with the right side of the memory pillar MP in the figure functions as select gate line SGSb, for example, eight interconnection layers 46 in contact with the right side thereof function as word lines WLb0 to WLb7 in order from the bottom layer, and interconnection layer 47 in contact with the right side thereof functions as select gate line SGDb0.

Consequently, memory cell transistors MCa0 to MCa7 are formed by the memory pillar MP and respective interconnection layers 46 provided on the left side of the memory pillar MP in the figure and function as word lines WLa0 to WLa7. Similarly, select transistor STa1 is formed by the memory pillar MP and interconnection layer 47 provided on the left side of the memory pillar MP in the figure. Select transistor STa2 is formed by the memory pillar MP and interconnection layers 44 and 45 provided on the left side of the memory pillar MP in the figure.

Memory cell transistors MCb0 to MCb7 are formed by the memory pillar MP and respective interconnection layers 46 provided on the right side of the memory pillar MP in the figure and function as word lines WLb0 to WLb7. Similarly, select transistor STb1 is formed by the memory pillar MP and interconnection layer 47 provided on the right side of the memory pillar MP in the figure. Select transistor STb2 is formed by the memory pillar MP and interconnection layers 44 and 45 provided on the right side of the memory pillar MP in the figure.

Select transistor ST0 is formed by the memory pillar MP and interconnection layer 44, which functions as select gate line GSG. In select transistor ST0, the laminated film of the block insulating film 34, the charge storage layer 33, and the tunnel insulating film 32 functions as a gate insulating film.

As shown in FIG. 5, the block insulating film 34, the charge storage layer 33, the tunnel insulating film 32, and the semiconductor layer 31 inside the memory trench MT, i.e., those on and above the top surface of interconnection layer 44 are removed, and the inside of the memory trench MT is filled with insulating layer 49. Accordingly, the block insulating film 34, charge storage layer 33, tunnel insulating film 32, and semiconductor layer 31 on the side surface of the hole AH, which are in contact with interconnection layers 45 to 47, are each divided into two in the X direction by the memory trench MT. The block insulating film 34, charge storage layer 33, tunnel insulating film 32, and semiconductor layer 31 in contact with interconnection layer 44 are not each divided into two.

1.2 Method for Manufacturing Memory Cell Array

Next, a method for manufacturing the memory cell array 11 will be described with reference to FIGS. 6 to 21. FIGS. 6 to 21 each show a plane, cross-section taken along A1-A2 (A1-A2 cross-section), and cross-section taken along B1-B2 (B1-B2 cross-section) of the memory cell array in a manufacturing step. In the example of FIGS. 6 to 21, the void VD formed in the core layer 30 is omitted for simplification of explanation. In the present embodiment, the case of using a method of forming a structure corresponding to interconnection layers 45 to 47 by insulating layer 56, and then removing insulating layer 56 and filling the gap with a conductive material to form interconnection layers 45 to 47 (hereinafter, "replacement") will be described. Hereinafter, the case of using SiN as insulating layer 56 and using W and TiN as the conductive material of interconnection layers 45 to 47 will be described. The material of insulating layer 56 is not limited to SiN. For example, insulating layer 56 may be made of a silicon oxynitride film (SiON), or any material that provides a sufficient selection ratio in etching between the material and insulating layer 43.

Figure 6:
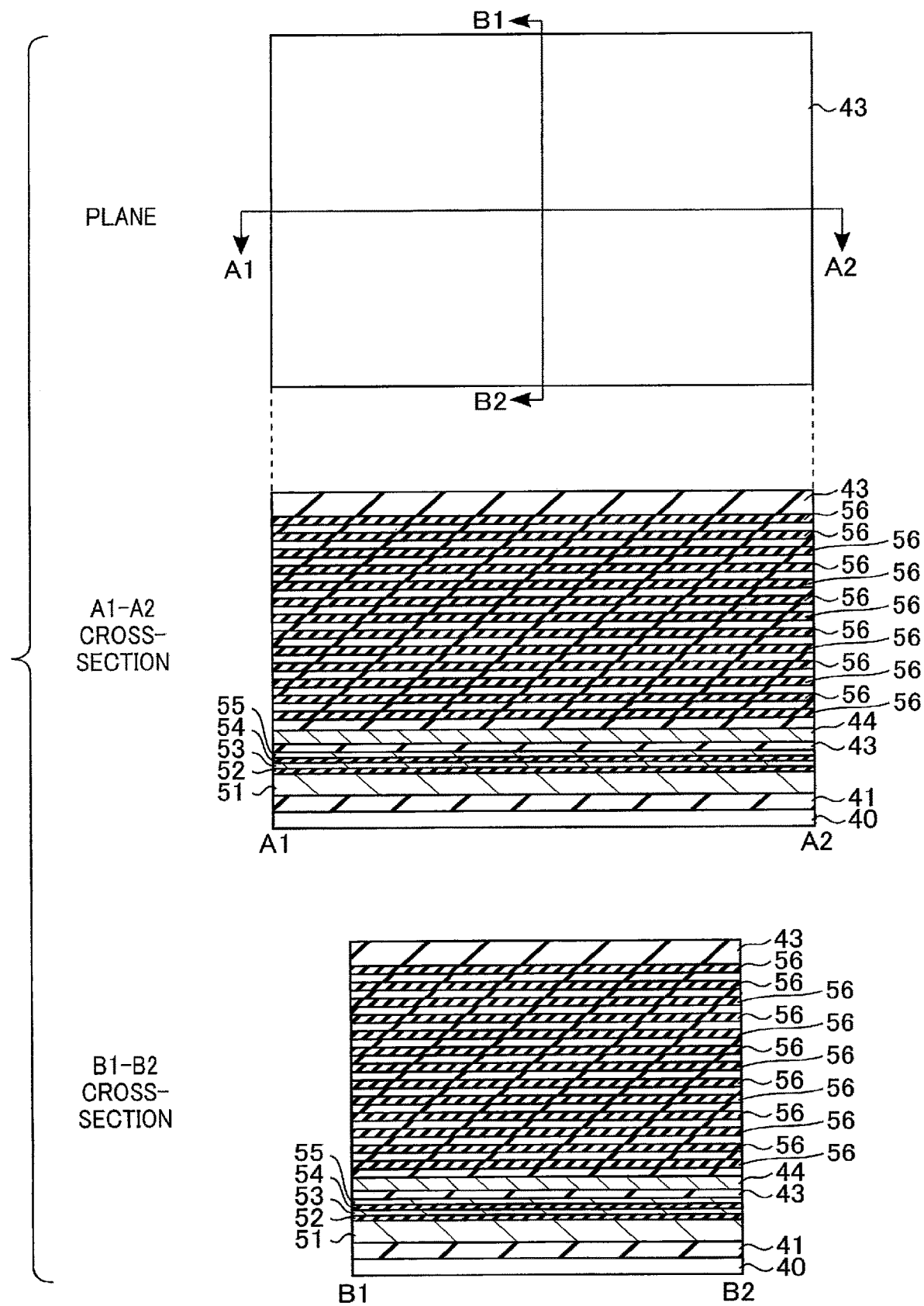

As shown in FIG. 6, insulating layer 41, semiconductor layer 51, insulating layer 52, semiconductor layer 53, insulating layer 54, semiconductor layer 55, insulating layer 43, and interconnection layer 44 are sequentially stacked on the semiconductor substrate 40. For semiconductor layers 51, 53, and 55, for example, amorphous silicon is used. For insulating layers 52 and 54, for example, $SiO_2$ is used. On interconnection layer 44, a plurality of insulating layers 56, which correspond respectively to interconnection layers 45 to 47, are formed with insulating layers 43 interposed between the layers. Insulating layer 43 is formed on the topmost insulating layer 56.

Figure 7:
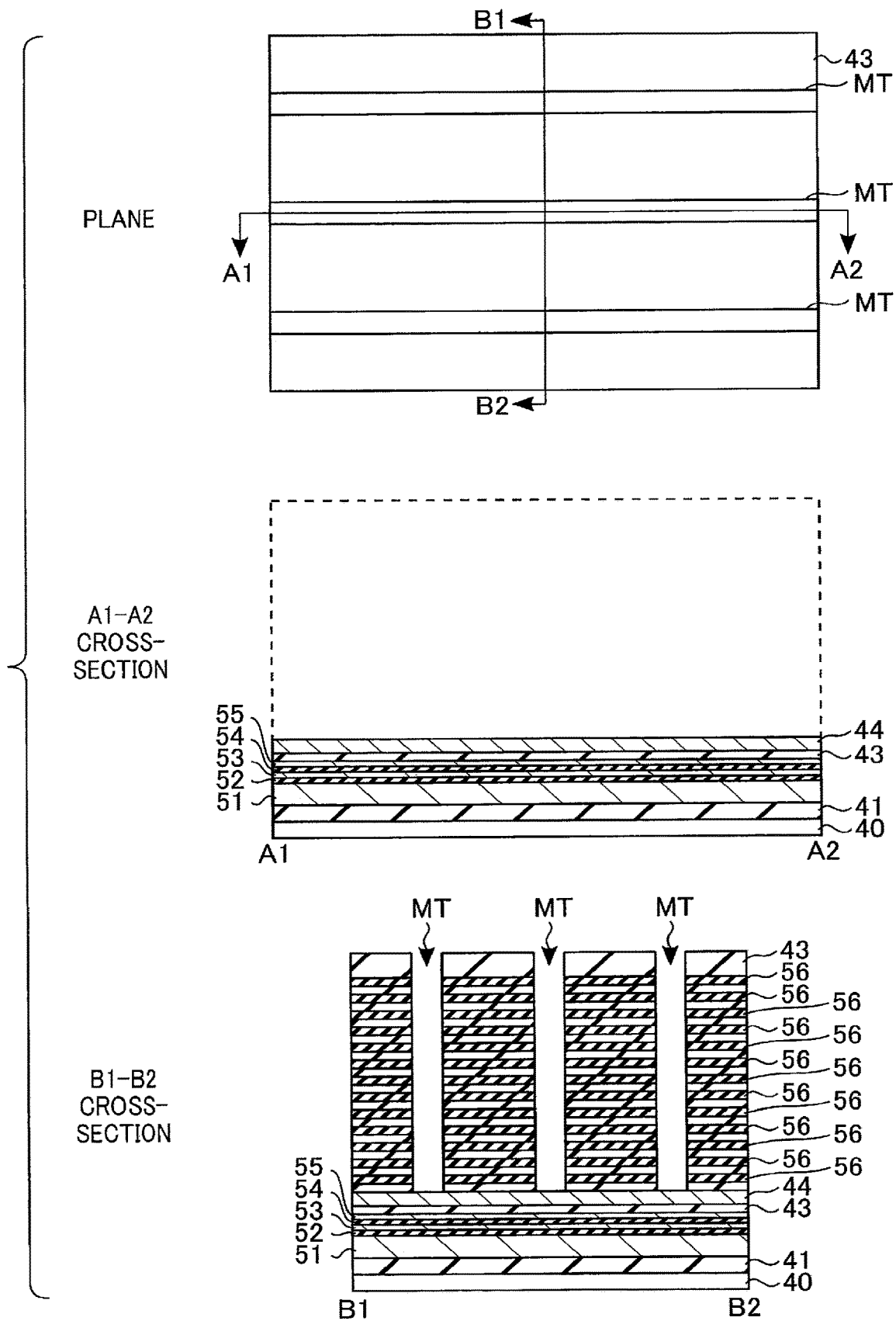

As shown in FIG. 7, a memory trench MT with a bottom that reaches interconnection layer 44 is formed.

As shown in FIG. 8, insulating layer 57 is formed on the side and bottom surfaces of the memory trench MT, and then the inside of the insulating layer 57 is filled with semiconductor layer 58. In the process of manufacturing the memory cell array 11, insulating layer 57 and semiconductor layer 58 function as sacrificial layers which temporarily fill the memory trench MT. Specifically, after insulating layer 57 and semiconductor layer 58 are formed to fill the inside of the memory trench MT, insulating layer 57 and semiconductor layer 58 on insulating layer 43 are removed by, for example, chemical mechanical polishing (CMP). For insulating layer 57, for example, $SiO_2$ is used. For semiconductor layer 58, for example, amorphous silicon is used.

Figure 9:
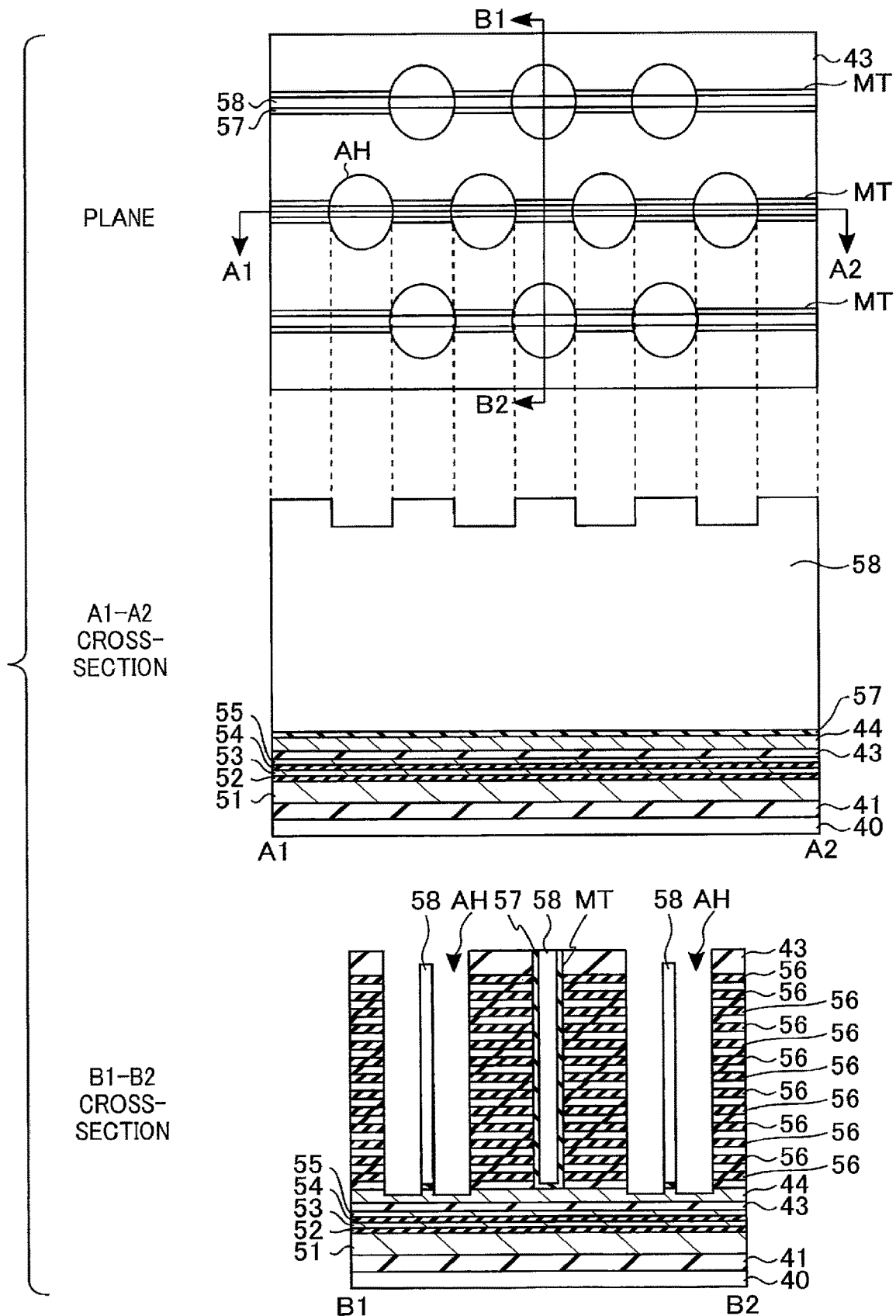

As shown in FIG. 9, a hole AH with a bottom that reaches interconnection layer 44 is formed. At this time, the hole AH is formed by selecting a condition in which the etching rate of semiconductor layer 58 is sufficiently lower than that of insulating layers 43, 56, and 57. Consequently, part of semiconductor layer 58 remains in the hole AH without being etched, as shown in the B1-B2 cross-section. As a result, the level of the top surface of semiconductor layer 58 in the hole AH becomes lower than the level of the top surface of semiconductor layer 58 outside the hole AH, as shown in the A1-A2 cross-section.

Figure 10:
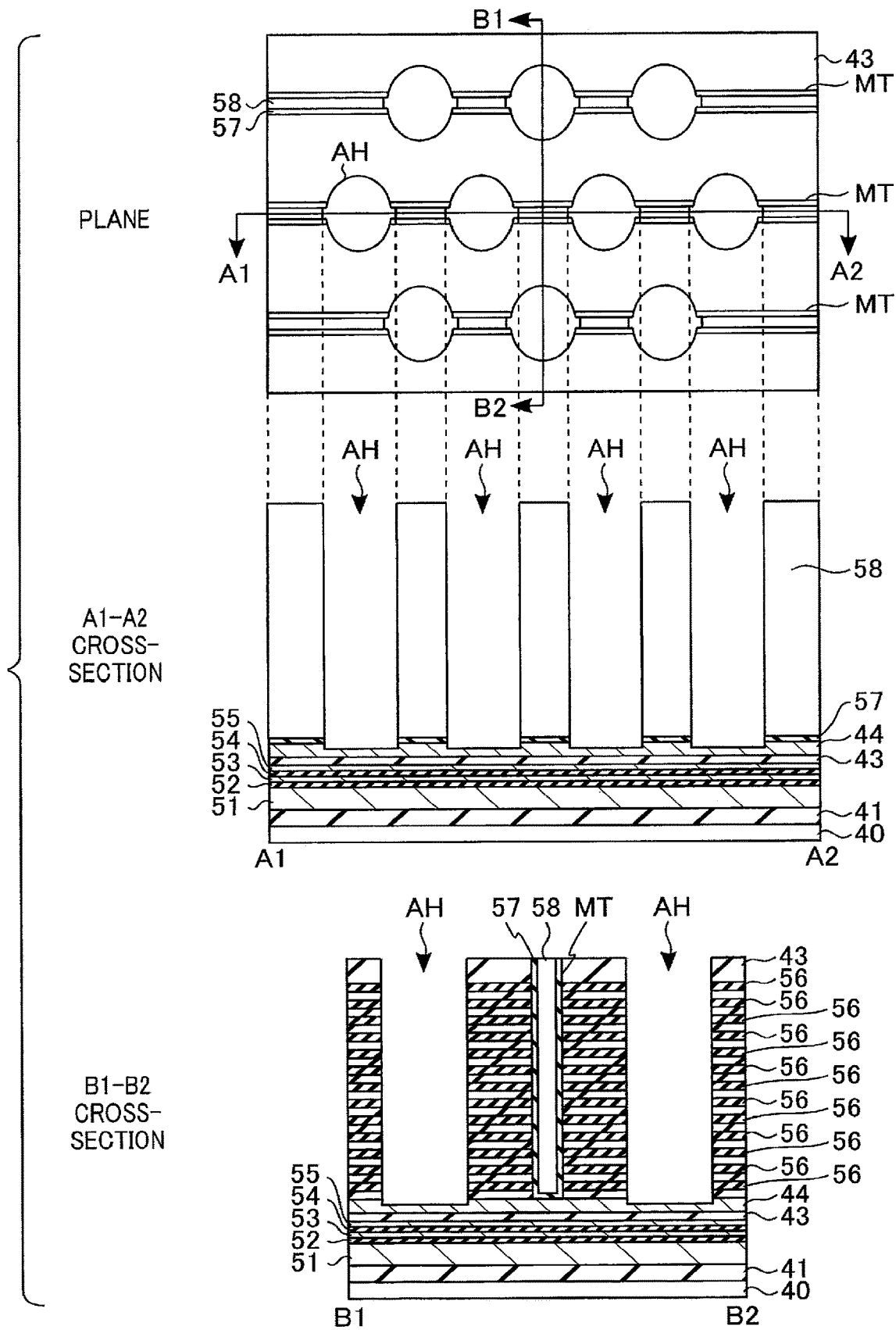

As shown in FIG. 10, semiconductor layer 58 in the hole AH is removed by, for example, dry isotropic etching (such as chemical dry etching (CDE)). At this time, semiconductor layer 58 in the memory trench MT is scarcely etched since the side surface thereof is not exposed. However, once semiconductor layer 58 in the hole AH is removed, the side surface of semiconductor layer 58 in the memory trench MT is exposed in a region where the hole AH is in contact with the memory trench MT, and semiconductor layer 58 is etched from the exposed side surface. Therefore, the length of semiconductor layer 58 between two holes AH becomes shorter than the distance between the holes AH and the length of insulating layer 57.

Figure 11:
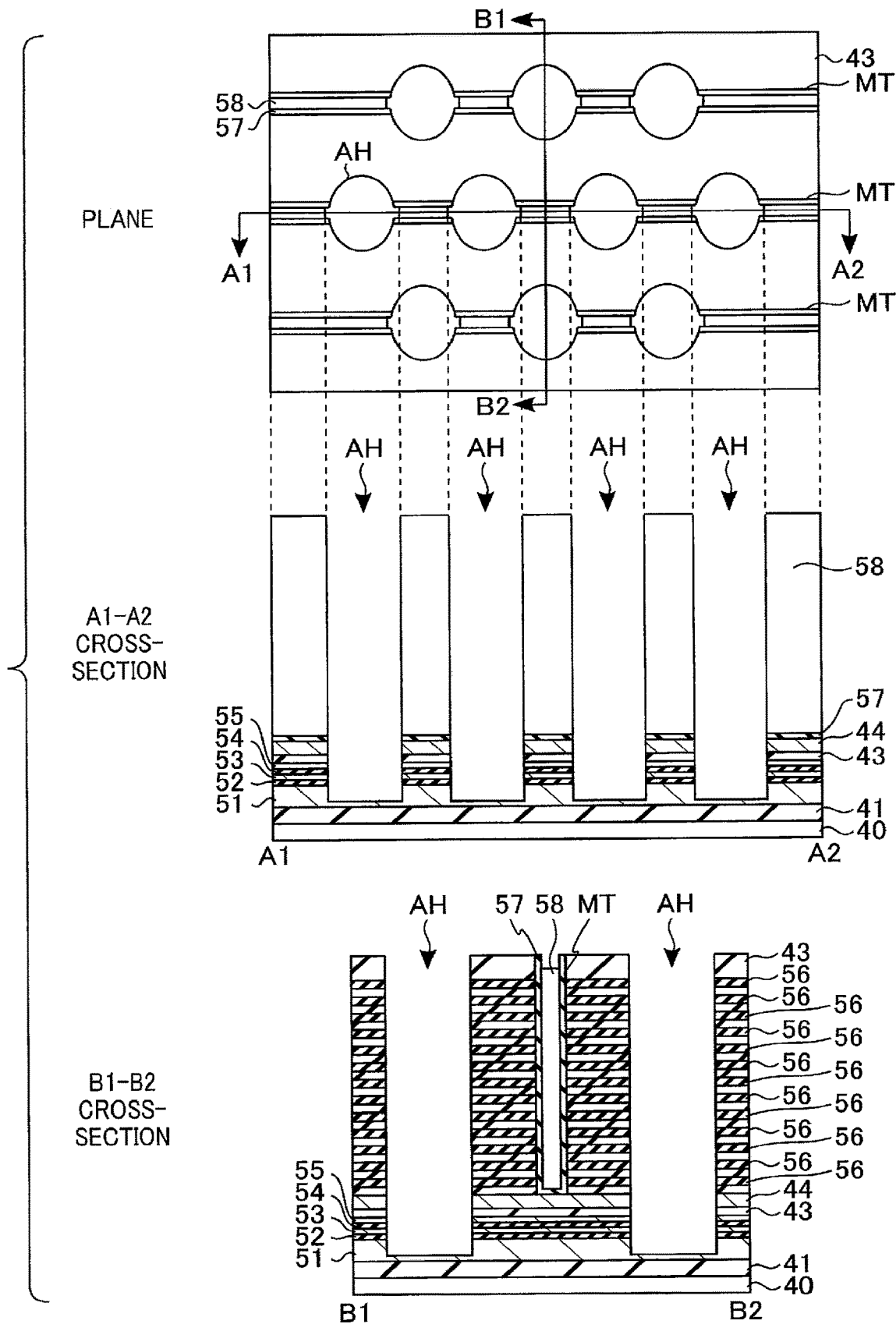

As shown in FIG. 11, the hole AH is additionally processed so that the bottom surface thereof reaches semiconductor layer 51. At this time, the surface of semiconductor layer 58 is etched to some extent; therefore, the level of the top surface of semiconductor layer 58 in the memory trench MT becomes lower than the level of the top surfaces of the topmost insulating layer 43 and insulating layer 57.

As shown in FIG. 12, insulating layer 59 is formed to cover the entire surface. Insulating layer 59 has a film thickness that does not allow insulating layer 59 to fill up the memory trench MT. For insulating layer 59, for example, $SiO_2$ is used.

Figure 13:
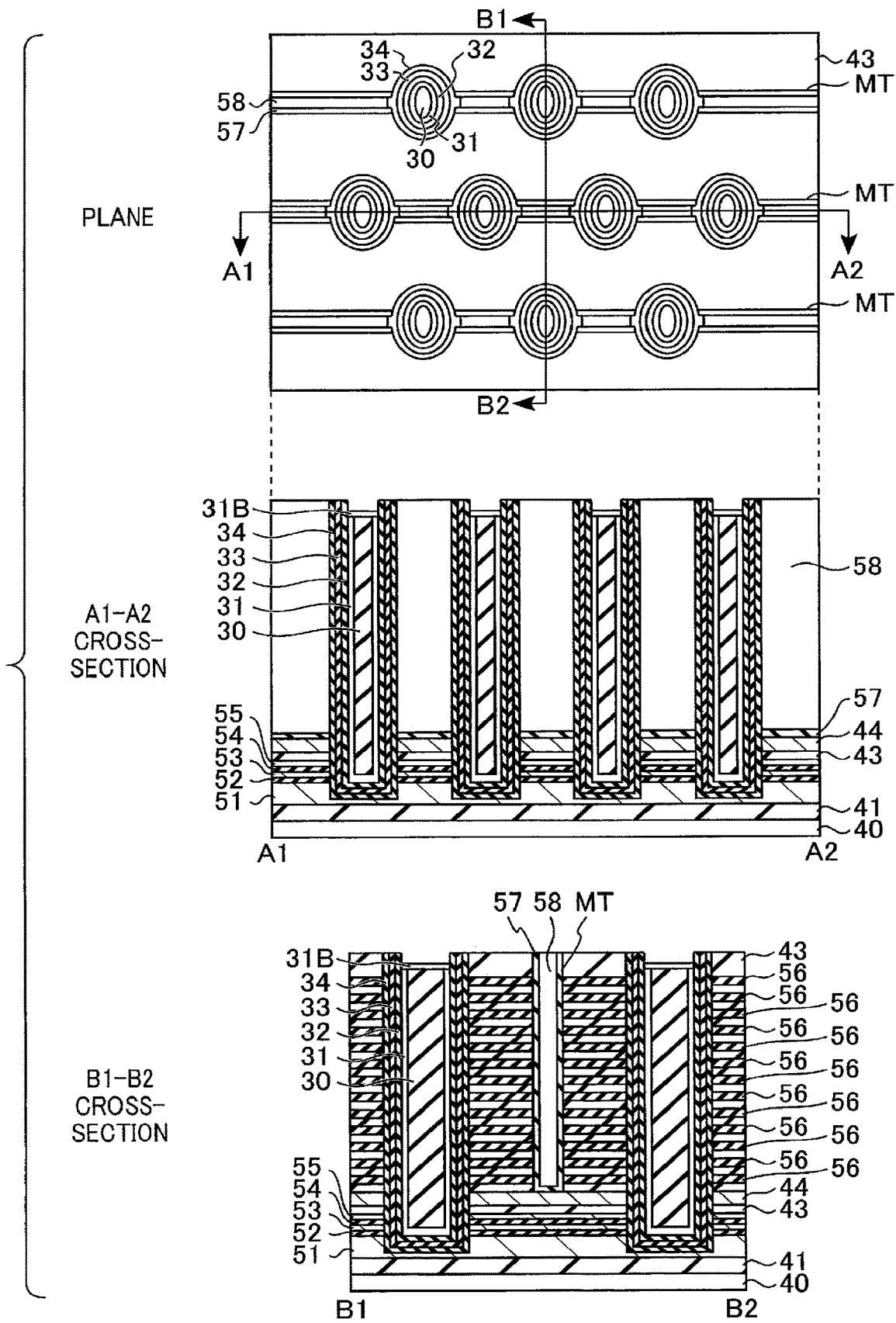

As shown in FIG. 13, a block insulating film 34, a charge storage layer 33, a tunnel insulating film 32, a semiconductor layer 31, a core layer 30, and a cap layer 31B are formed in the hole AH. Specifically, for example, the block insulating film 34, the charge storage layer 33, the tunnel insulating film 32, the semiconductor layer 31, and the core layer 30 are sequentially stacked. At this time, a void VD is formed in the core layer 30. Next, excessive block insulating film 34, charge storage layer 33, tunnel insulating film 32, semiconductor layer 31, and core layer 30 on insulating layer 43 are removed by, for example, dry etching. At this time, the semiconductor layer 31 and the core layer 30 are processed to be lower than the top surface of insulating layer 43. After that, a cap layer 31B is formed.

Figure 14:
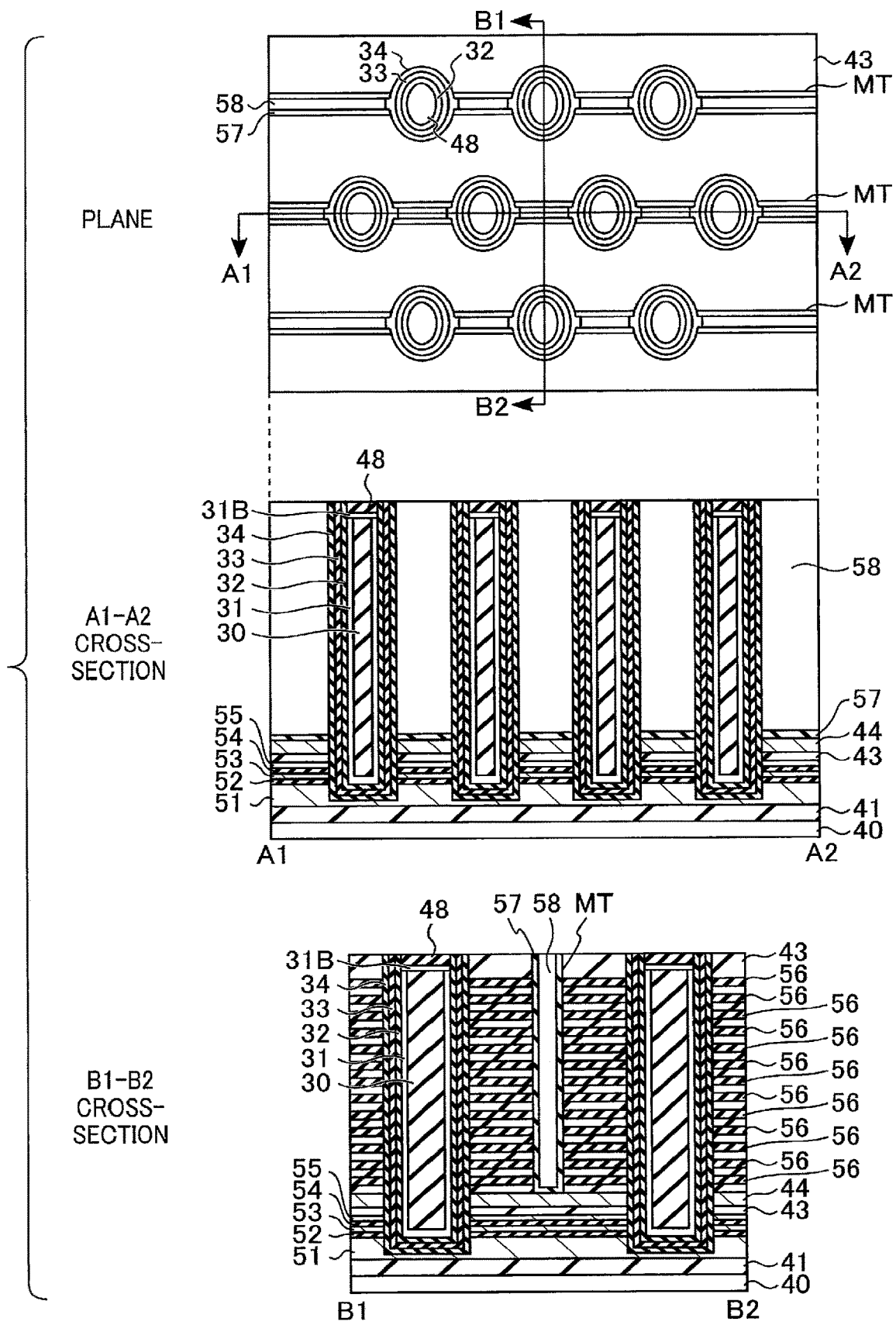

As shown in FIG. 14, insulating layer 48 is formed on the cap layer 31B. Specifically, after insulating layer 48 is formed, excessive insulating layer 48 on insulating layer 43 is removed by, for example, CMP. The removal is performed so that the top surface of semiconductor layer 58 is exposed in the memory trench MT.

Figure 15:
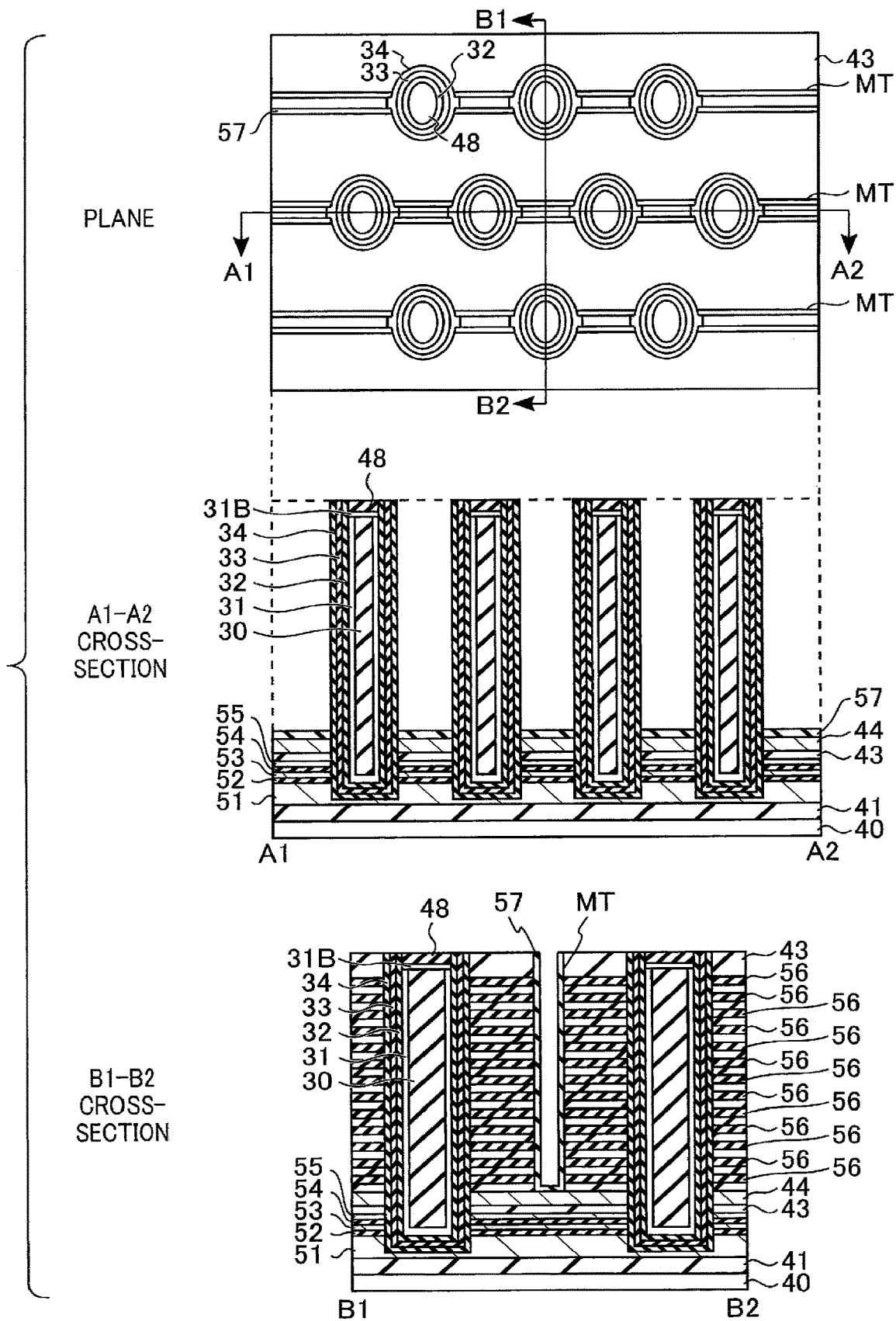

As shown in FIG. 15, semiconductor layer 58 in the memory trench MT is removed by, for example, wet etching.

As shown in FIG. 16, insulating layer 57 in the memory trench MT, the semiconductor layer 31, tunnel insulating film 32, charge storage layer 33, and block insulating film 34 with a side surface exposed to the inside of the memory trench MT, are removed by, for example, dry or wet isotropic etching. At this time, insulating layer 48 functions as an etching stopper for preventing the cap layer 31B and the core layer 30 from being etched from their top surfaces. As a result, part of the core layer 30, cap layer 31B, and insulating layer 48 remains in the memory trench MT without being etched. Above interconnection layer 44, the block insulating film 34, the charge storage layer 33, the tunnel insulating film 32, and the semiconductor layer 31 are each divided into two in the B1-B2 cross-sectional direction (X direction).

Figure 17:
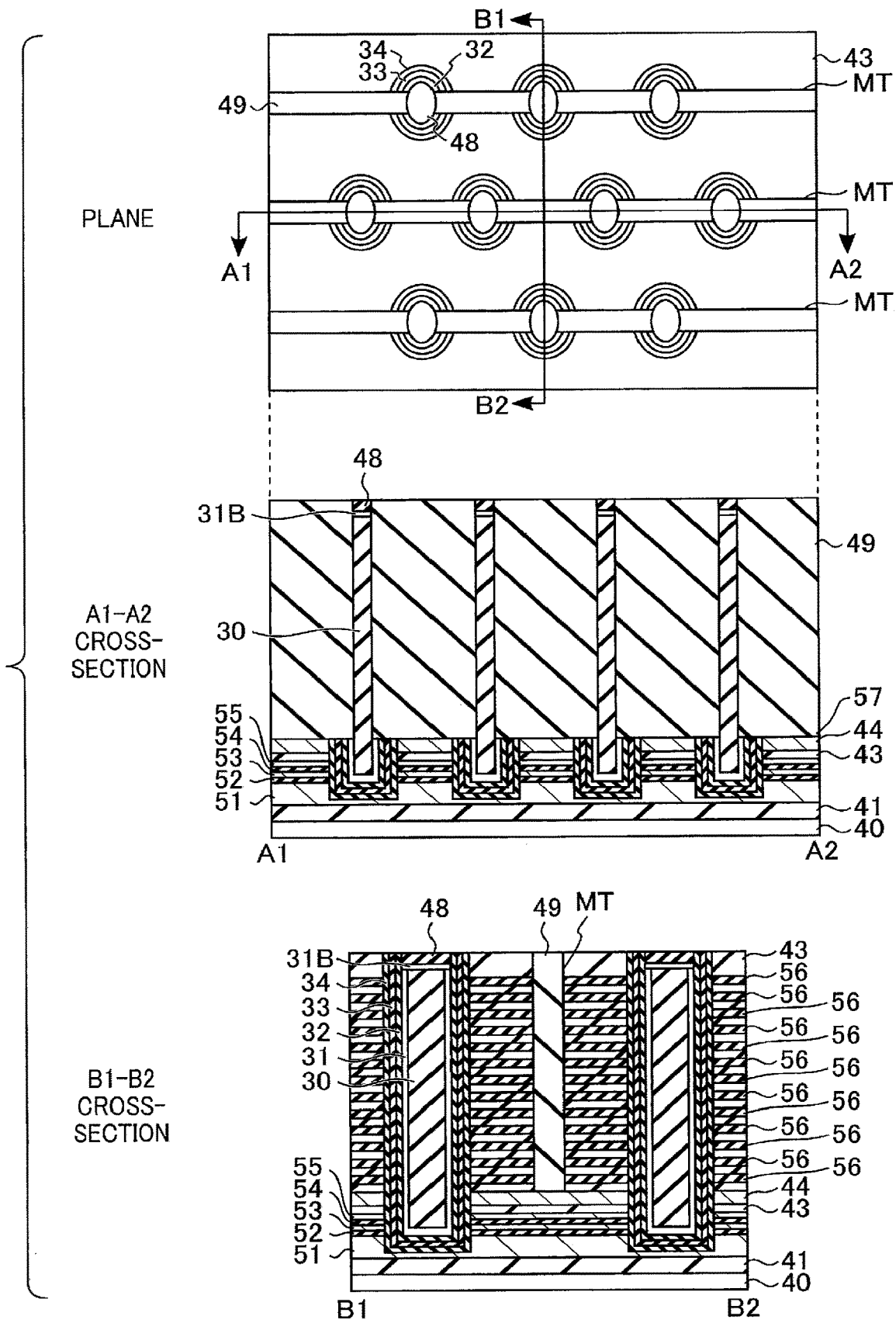

As shown in FIG. 17, insulating layer 49 is formed in the memory trench MT. For example, when SOG is used as insulating layer 49, after SOG is formed, excess SOG on insulating layer 43 is removed by, for example, CMP.

Figure 18:
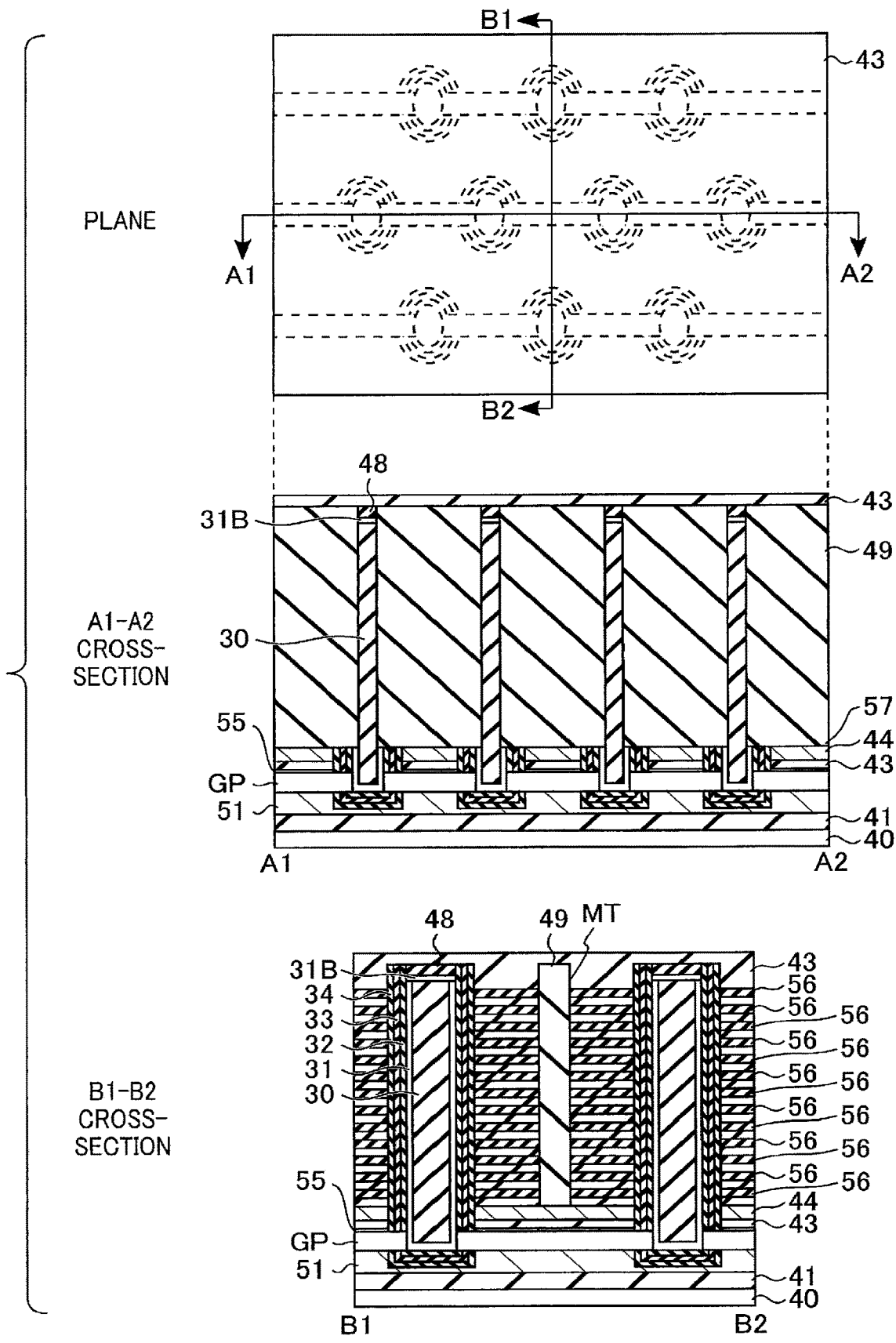

As shown in FIG. 18, insulating layer 43 is formed to cover the top surfaces of the memory pillar MP and the memory trench MT. Next, after a slit (not shown) that reaches semiconductor layer 51 is formed, insulating layer 52, semiconductor layer 53, and insulating layer 54 are removed by wet etching, thereby forming a gap GP. At this time, part of the block insulating film 34, charge storage layer 33, and tunnel insulating film 32 exposed to the gap GP is also removed by wet etching.

Figure 19:
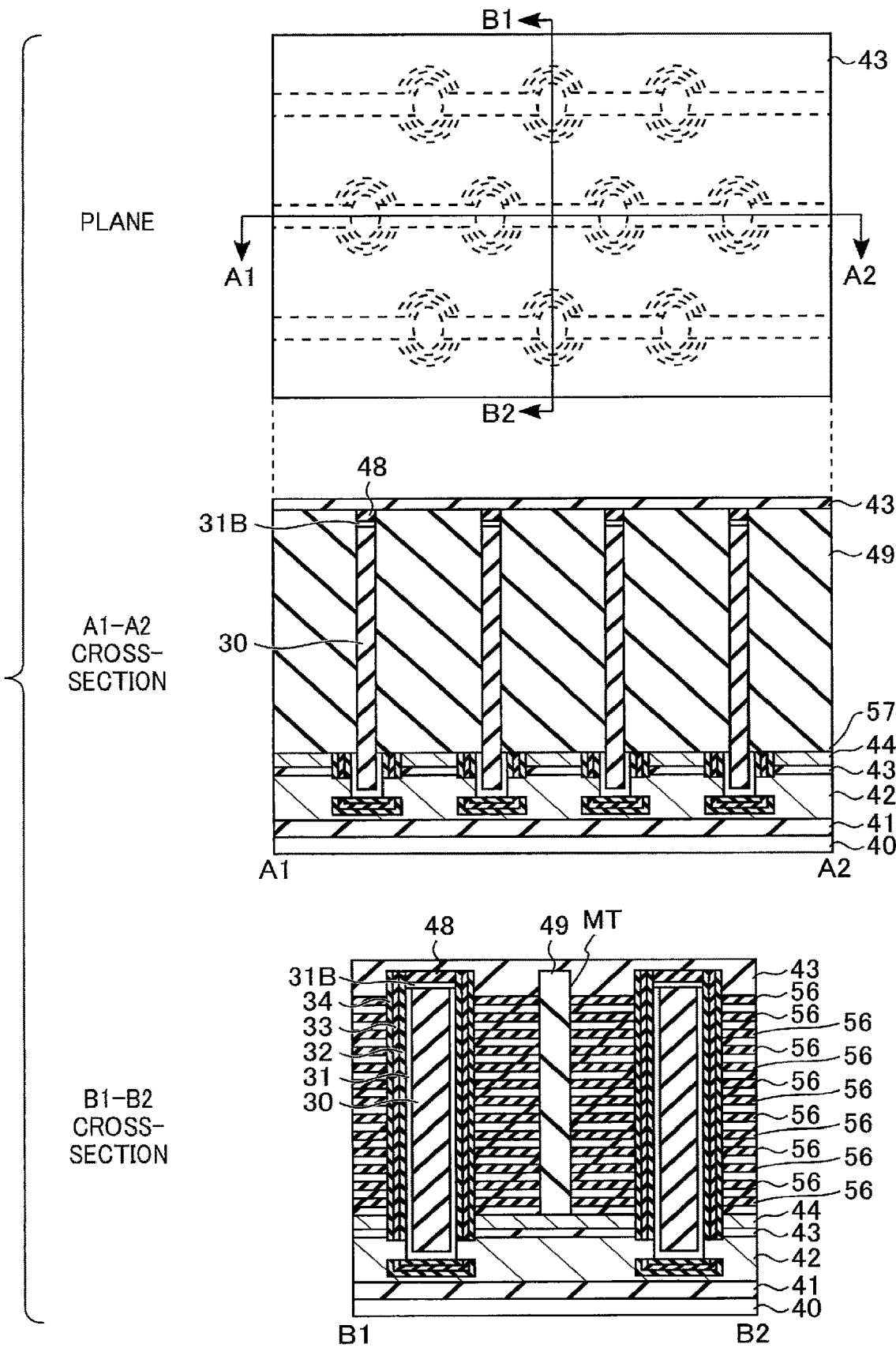

As shown in FIG. 19, interconnection layer 42 is formed by forming, for example, P-doped polysilicon in the gap GP. At this time, P is also diffused into semiconductor layers 51 and 55, thereby taking semiconductor layers 51 and 55 in interconnection layer 42. Specifically, P-doped amorphous silicon is filled in the gap GP, and is subjected to heat treatment for crystallization, thereby diffusing P into semiconductor layers 51 and 55. By removing polysilicon in the slit and excessive polysilicon on insulating layer 43 and filling the slit with insulating layer 43, formation of interconnection layer 42 is completed.

Figure 20:
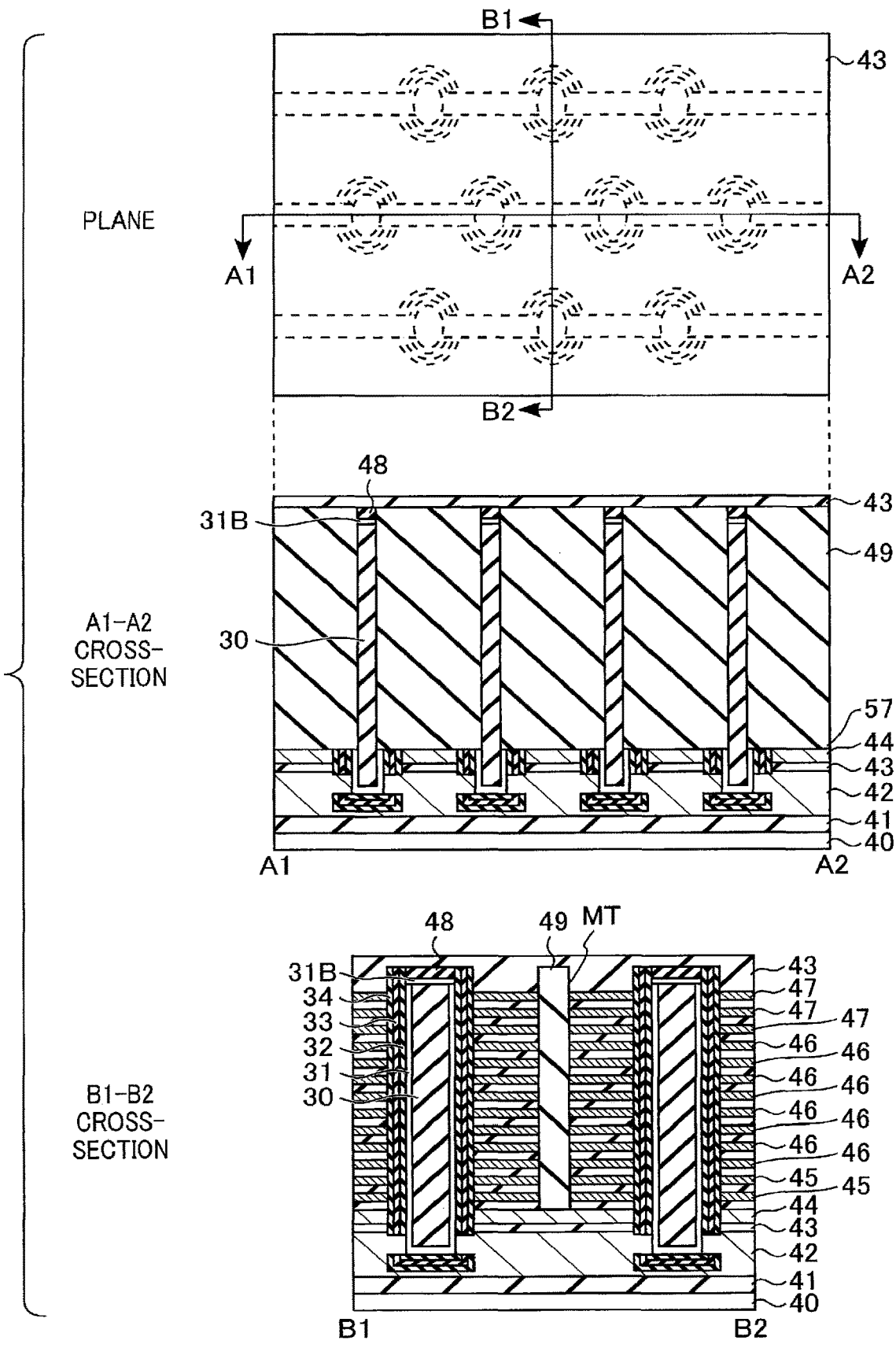

As shown in FIG. 20, insulating layer 56 is replaced, and interconnection layers 45 to 47 are formed. Specifically, a slit (not shown) that passes through a plurality of insulating layers 56 is formed. Next, insulating layers 56 are removed from the slit side by wet etching. Then, the gap formed by removing insulating layer 56 is filled with Tin and W. By removing TiN and W in the slit and excessive TiN and W on insulating layer 43 and filling the slit with insulating layer 43, the replacement step is completed.

Figure 21:
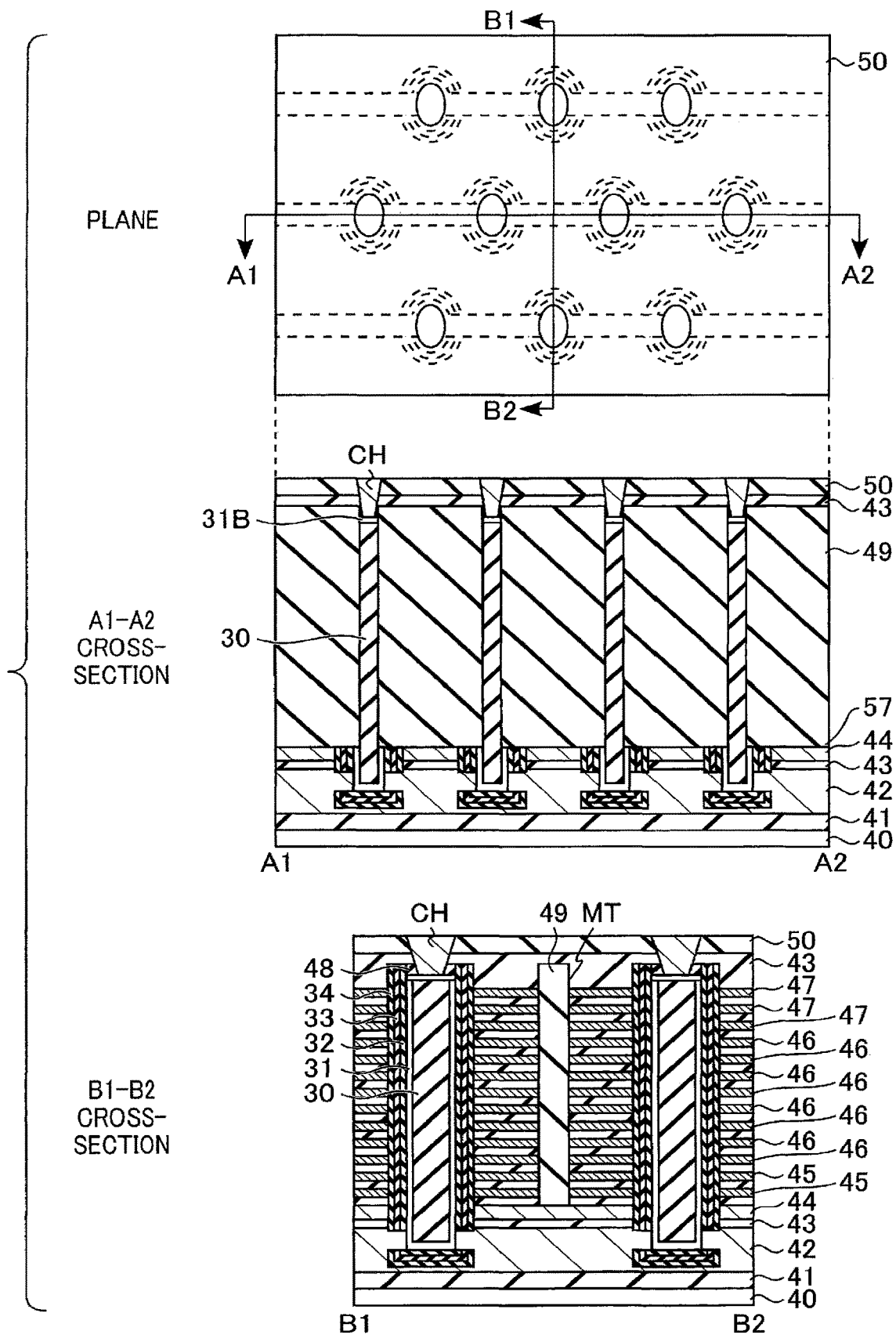

As shown in FIG. 21, after insulating layer 50 is formed on the topmost insulating layer 43, a contact plug CH is formed. Specifically, after insulating layer 50 is formed, a contact plug CH with a bottom that reaches the cap layer 31B is formed. Then, after Ti, TiN, and W are formed in order to fill the contact plug CH, excessive Ti, TiN, and W on insulating layer 50 are removed by, for example, CMP.

1.3 Advantageous Effect of Present Embodiment

The configuration according to the present embodiment can improve reliability. This advantageous effect will be described in detail.

For example, there is a case where, in one memory pillar MP, the block insulating film 34, charge storage layer 33, tunnel insulating film 32, and semiconductor layer 31 of two memory cell transistors MC formed on one plane are not each divided by the memory trench MT. Namely, there is a case where two memory cell transistors MC share semiconductor layer 31, and share a channel. In such a case, in, for example, the read operation, even if a selected memory cell transistor MC is in the OFF state, a current may flow in the channel by a parasitic transistor outside the region of the selected memory cell transistor MC being turned on, thereby causing erroneous reading.

In contrast, the configuration according to the present embodiment can divide each of the block insulating film 34, charge storage layer 33, tunnel insulating film 32, and semiconductor layer 31 by the memory trench MT in one memory pillar MP. Namely, the channels of two memory cell transistors MC formed on the same plane can be separated. Accordingly, the possibility that a current flows in a channel outside the region of the selected memory cell transistor MC, thereby causing erroneous reading, can be lowered. In addition, interference between two memory cell transistors MC can be inhibited. Therefore, the reliability of the semiconductor memory device can be improved.

Moreover, in the configuration according to the present embodiment, the core layer 30 is not divided by the memory trench MT. By leaving the core layer 30 in the memory pillar MP, distortion of the memory trench MT hollowed when the block insulating film 34, charge storage layer 33, tunnel insulating film 32, and semiconductor layer 31 in the memory trench MT are removed, can be inhibited in the process of manufacturing the memory cell array.

Moreover, in the configuration according to the present embodiment, interconnection layer 44, which functions as select gate line GSG, is not divided by the memory trench MT. Namely, in interconnection layer 44, the block insulating film 34, charge storage layer 33, tunnel insulating film 32, and semiconductor layer 31 in contact with select gate line GSG are formed to surround the core layer 30. This inhibits deterioration in insulation properties between select gate line GSG and semiconductor layer 31.

Furthermore, in the configuration according to the present embodiment, insulating layer 48 can be formed on the cap layer 31B. The insulating layer 48 can thereby be used as an etching stopper layer when forming a contact plug by processing insulating layer 43. This can inhibit processing damage on the cap layer 31B, and thereby inhibit bad coupling between the contact plug CH and the memory pillar MP. Accordingly, the reliability of the semiconductor memory device can be improved.

2. Second Embodiment

Next, the second embodiment will be described. In the second embodiment, the case where an air gap is formed in the memory trench MT is described. Hereinafter, the matters different from the first embodiment will be mainly described.

2.1 Cross-Sectional Configuration of Memory Cell Array

First, a cross-sectional configuration of the memory cell array 11 will be described with reference to FIGS. 22 and 23. Described below is the case where two layers of select gate lines SGS, and three layers of select gate lines SGD are formed as in the first embodiment.

Figure 22:
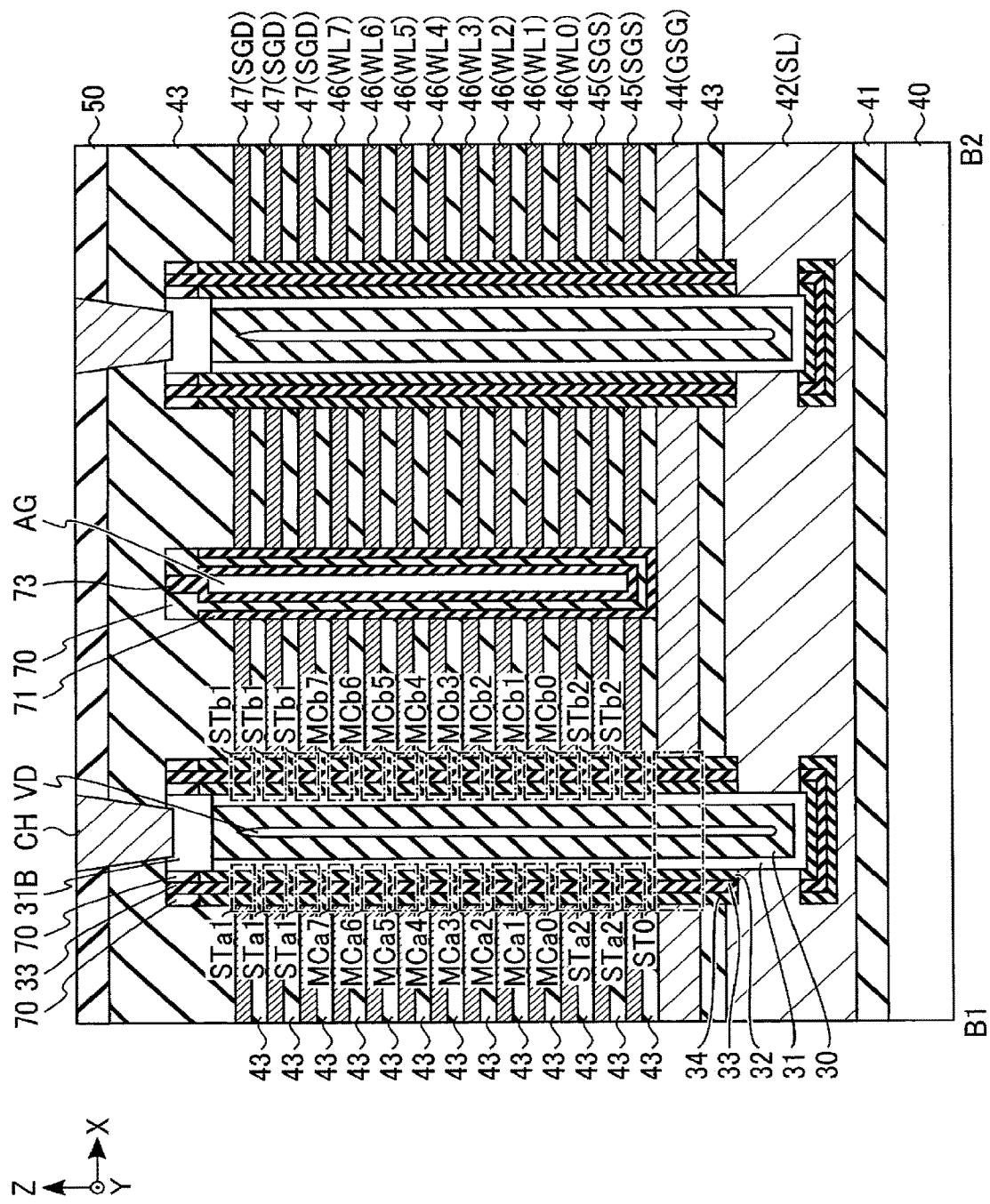
FIG. 22 is a B1-B2 cross-sectional view of a memory cell array included in a semiconductor memory device according, to a second embodiment.

As shown in FIG. 22, the arrangement of interconnection layers 42, and 44 to 47 is the same as that shown in FIG. 4 in the first embodiment.

The memory pillar MP of the present embodiment includes a core layer 30, a semiconductor layer 31, a cap layer 31B, a tunnel insulating film 32, a charge storage layer 33, a block insulating layer 34, and an insulating layer 70. Different from the memory pillar MP described with reference to FIG. 3 in the first embodiment, there is no insulating layer 48 formed on the cap layer 31B. In addition, insulating layer 70 is formed on the tunnel insulating film 32 and the block insulating film 34.

The memory trench MT includes insulating layers 70, 71, and 73, and an air gap AG is formed therein. Specifically, insulating layer 71 is formed on the side and bottom surfaces of the memory trench MT except for the top portion. Insulating layer 70 is formed in contact with the side surface of the top portion of the memory trench MT and the top, side, and bottom surfaces of insulating layer 71. In addition, insulating layer 73 is formed in contact with the side and bottom surfaces of insulating layer 70 in the memory trench MT. An air gap AG is formed in insulating layer 73.

For insulating layer 70, for example, SiN is used. For insulating layers 71 and 73, for example, $SiO_2$ is used.

Figure 23:
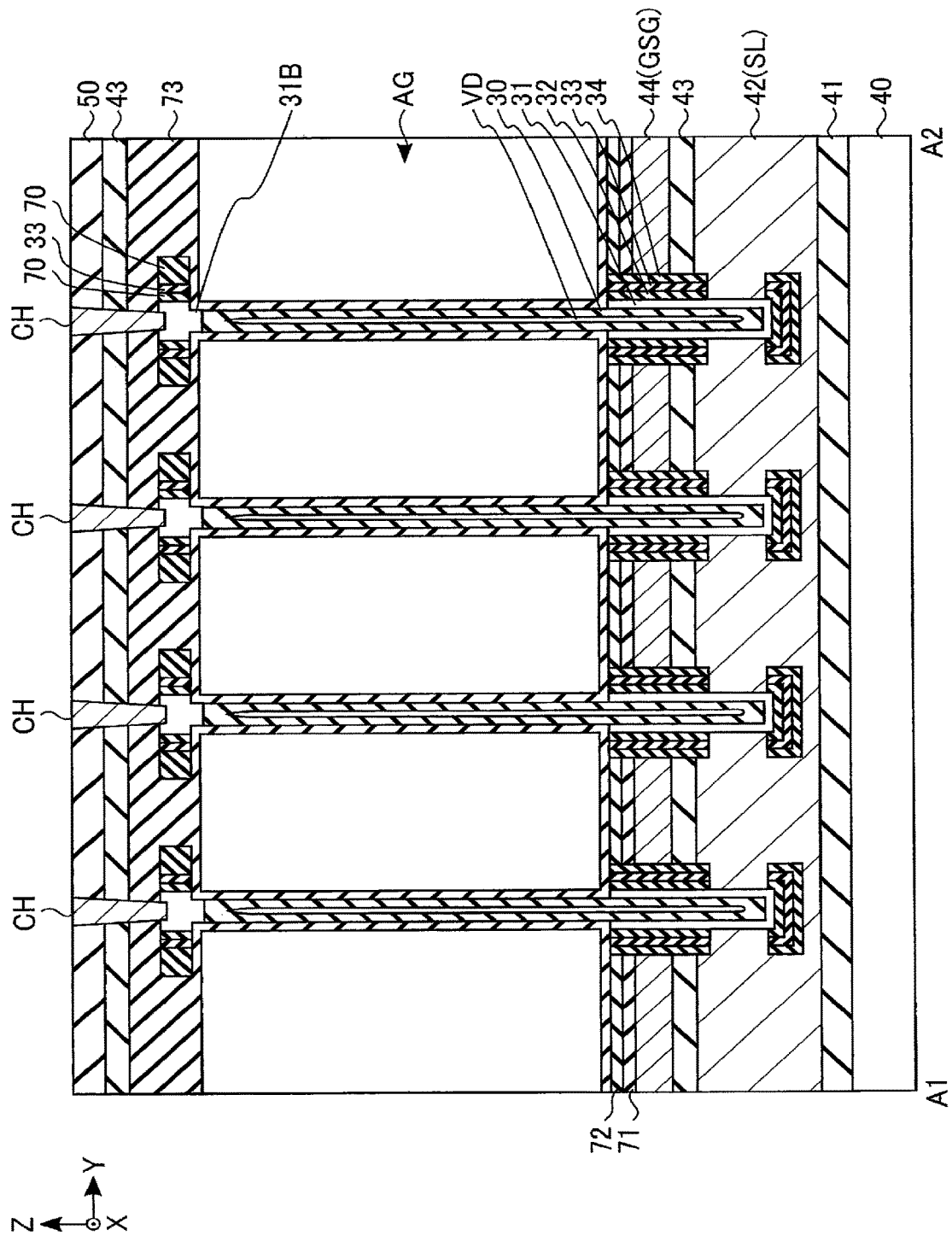
FIG. 23 is an A1-A2 cross-sectional view of the memory cell array included in the semiconductor memory device according to the second embodiment.

As shown in FIG. 23, an air gap AG is formed in insulating layer 73 in the memory trench MT. In the top portion of the memory pillar MP, a three-layer structure of insulating layer 70, charge storage layer 33, and insulating layer 70 is formed on the side surface of the cap layer 31B.

2.2 Method for Manufacturing Memory Cell Array

Next, a method for manufacturing the memory cell array 11 will be described with reference to FIGS. 24 to 36. FIGS. 24 to 36 each show a plane, A1-A2 cross-section, and B1-B2 cross-section of the memory cell array in a manufacturing step. In the example of FIGS. 24 to 36, the void VD formed in the core layer 30 is omitted for simplification of explanation.

Figure 24:
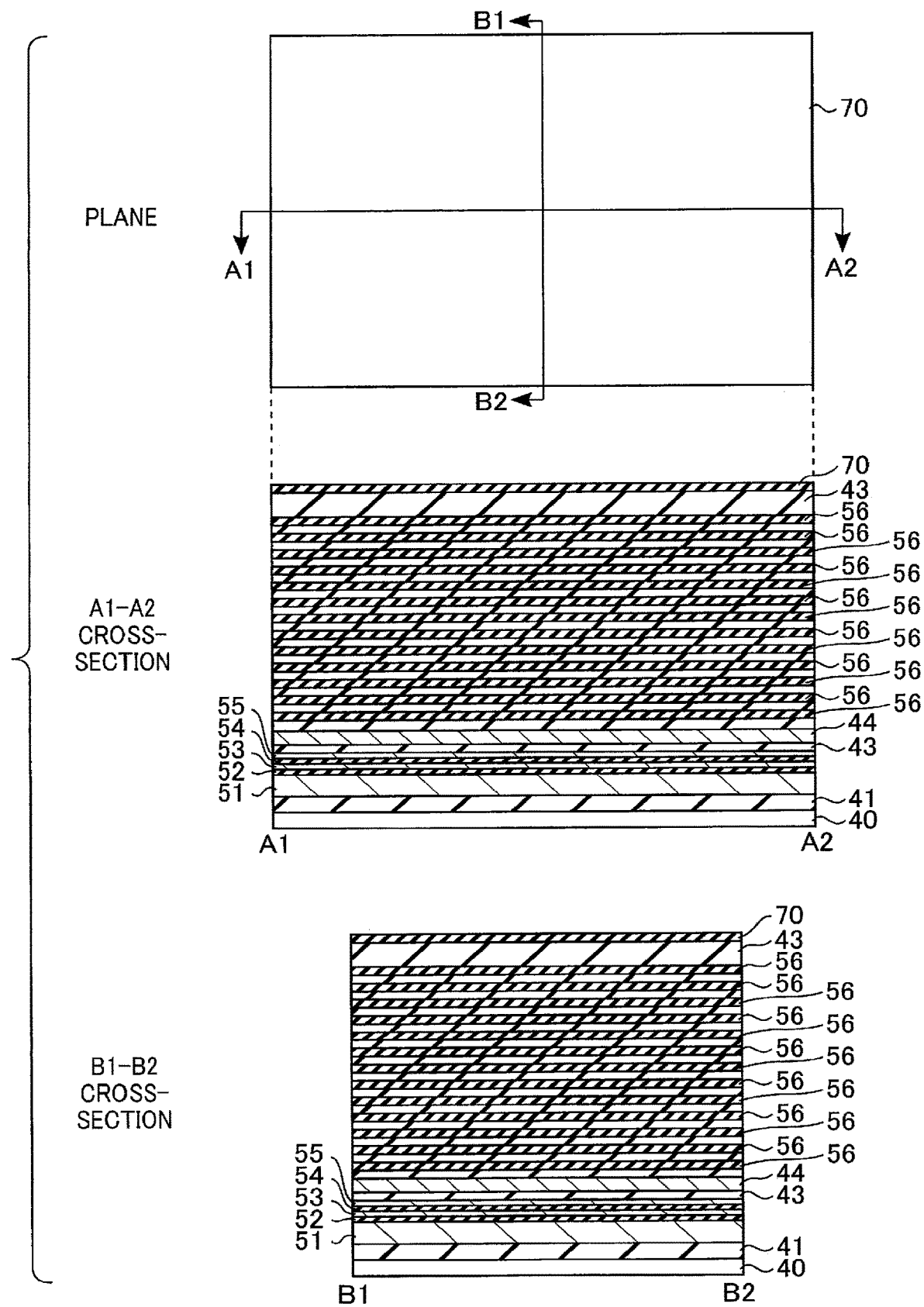

As shown in FIG. 24, insulating layer 41, semiconductor layer 51, insulating layer 52, semiconductor layer 53, insulating layer 54, semiconductor layer 55, insulating layer 43, and interconnection layer 44 are sequentially stacked on the semiconductor substrate 40. A plurality of insulating layers 43 and a plurality of insulating layers 56 which correspond respectively to interconnection layers 45 to 47, are alternately stacked on interconnection layer 44. Furthermore, insulating layer 43 and insulating layer 70 are sequentially formed on the topmost insulating layer 56.

Figure 25:
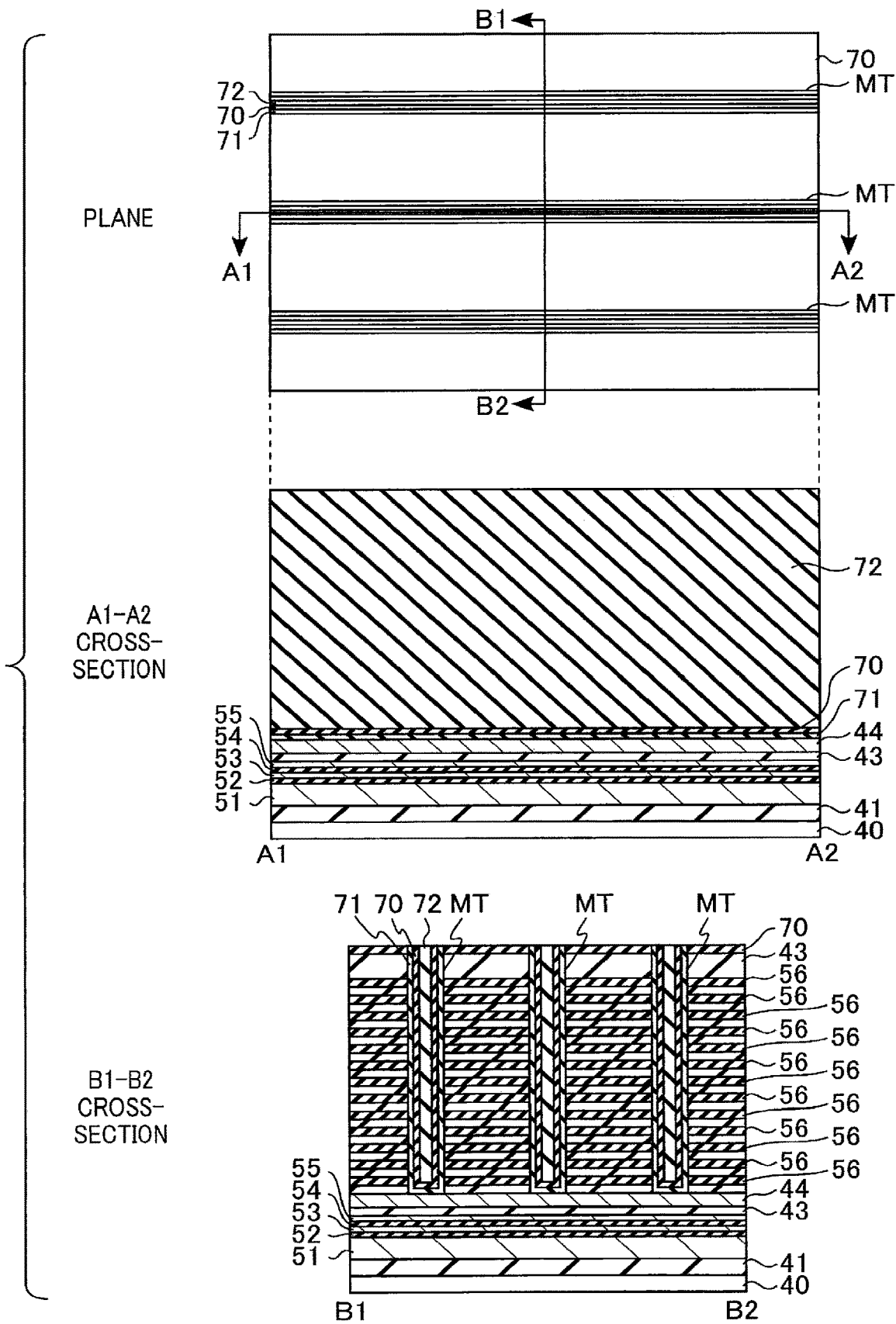

As shown in FIG. 25, a memory trench MT with a bottom that reaches interconnection layer 44 is formed, and the inside of the memory trench MT is filled with insulating layers 70 to 72. Specifically, after insulating layer 71, insulating layer 70, and insulating layer 72 are sequentially stacked to fill the memory trench MT, excessive insulating layer 71, insulating layer 70, and insulating layer 72 are removed. At this time, in the memory trench MT, the film thickness of insulating layer 72 in the B1-B2 cross-sectional direction (X direction) is made greater than that of insulating layer 71.

In the process of manufacturing the memory cell array 11, insulating layer 72 functions as a sacrificial layer which temporarily fills the memory trench MT. For insulating layer 72, for example, $SiO_2$ (SOG) is used.

Figure 26:
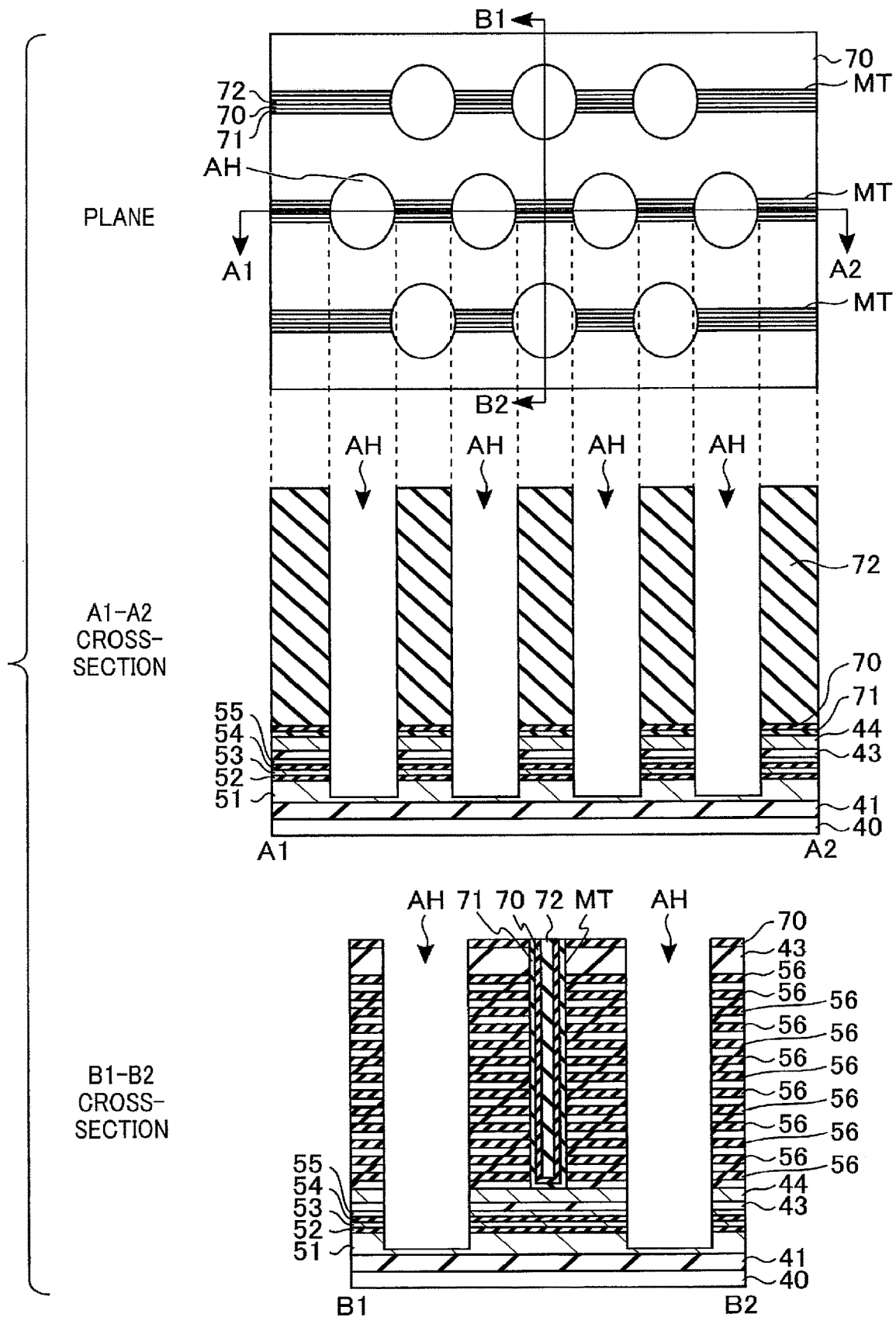

As shown in FIG. 26, a hole AH with a bottom that reaches interconnection layer 51 is formed.

As shown in FIG. 27, a block insulating film 34, a charge storage layer 33, a tunnel insulating film 32, a semiconductor layer 31, a core layer 30, and a cap layer 31B are formed in the hole AH. Specifically, first, a block insulating film 34, a charge storage layer 33, a tunnel insulating film 32, a semiconductor layer 31, and a core layer 30 are stacked. At this time, a void VD is formed in the core layer 30. Then, excessive block insulating film 34, charge storage layer 33, tunnel insulating film 32, semiconductor layer 31, and core layer 30 on insulating layer 70 are removed. At this time, the semiconductor layer 31 and the core layer 30 are processed to be lower than the top surface of insulating layer 43. After that, a cap layer 31B is formed to fill the hole AH.

As shown in FIG. 28, the tunnel insulating film 32 and block insulating film 34 in the memory pillar MP and the top portions of insulating layers 71 and 72 in the memory trench MT are etched by, for example, wet etching to form a groove. The etching amount is controlled so that, for example, the level of the bottom surface of the groove is higher than the top surface of the topmost insulating layer 56.

Figure 29:
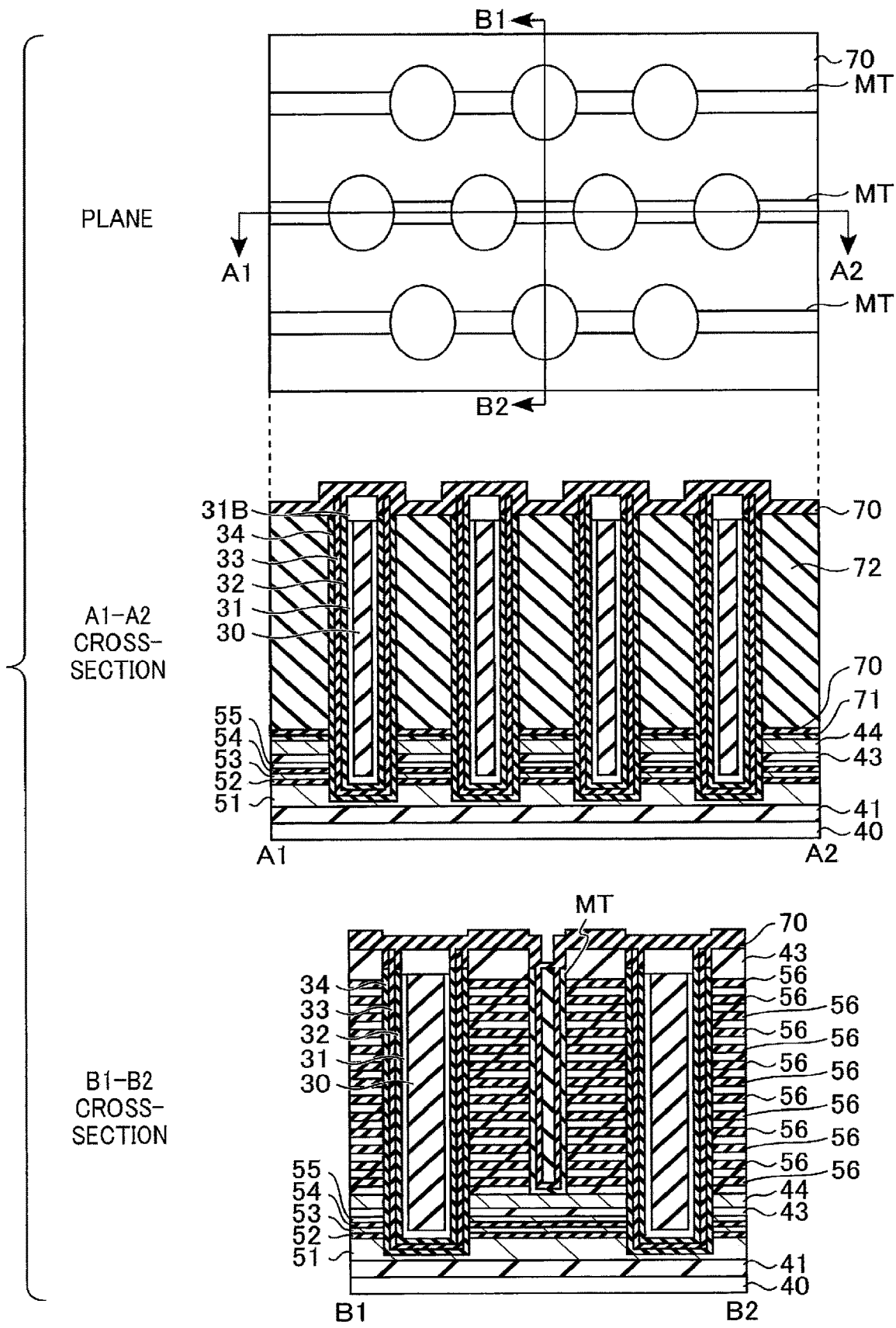

As shown in FIG. 29, insulating layer 70 is formed to cover the top surfaces of the memory pillar MP and the memory trench MT. For example, insulating layer 70 has a film thickness that allows insulating layer 70 to fill up the groove formed by etching the tunnel insulating film 32 and the block insulating film 34 in the memory pillar MP, and that allows insulating layer 70 to fill up the groove formed by etching insulating layer 71, but does not allow insulating layer 70 to fill up the groove formed by etching insulating layer 72 in the memory trench MT. Namely, insulating layer 70 has a film thickness that does not allow insulating layer 70 to fill up the memory trench MT.

Figure 30:
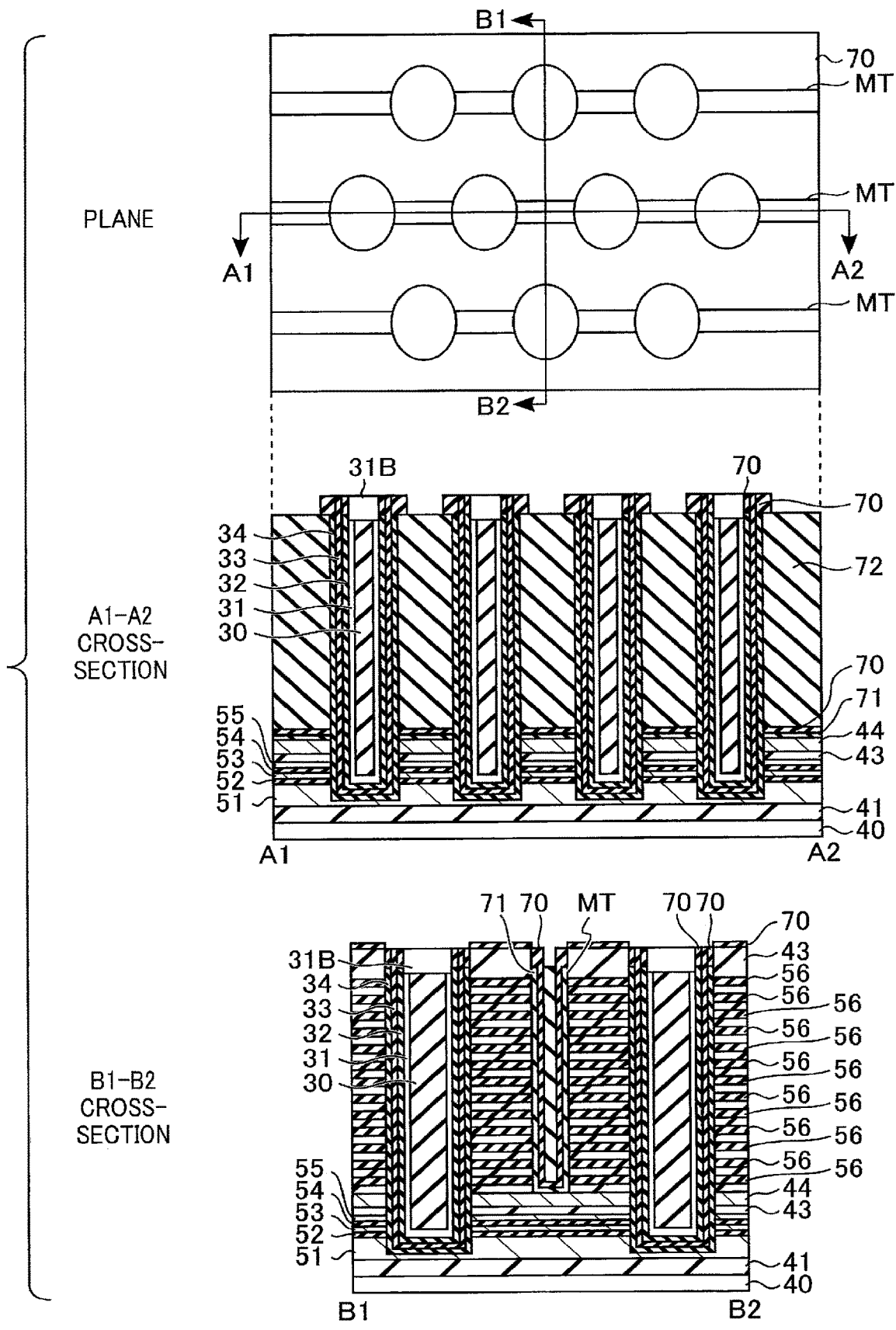

As shown in FIG. 30, insulating layer 70 is etched back until the top surfaces of the cap layer 31B and charge storage layer 33 in the memory pillar MP and insulating layer 72 in the memory trench MT are exposed. At this time, the etching-back amount is controlled so that insulating layer 70 remains on insulating layer 43.

Figure 31:
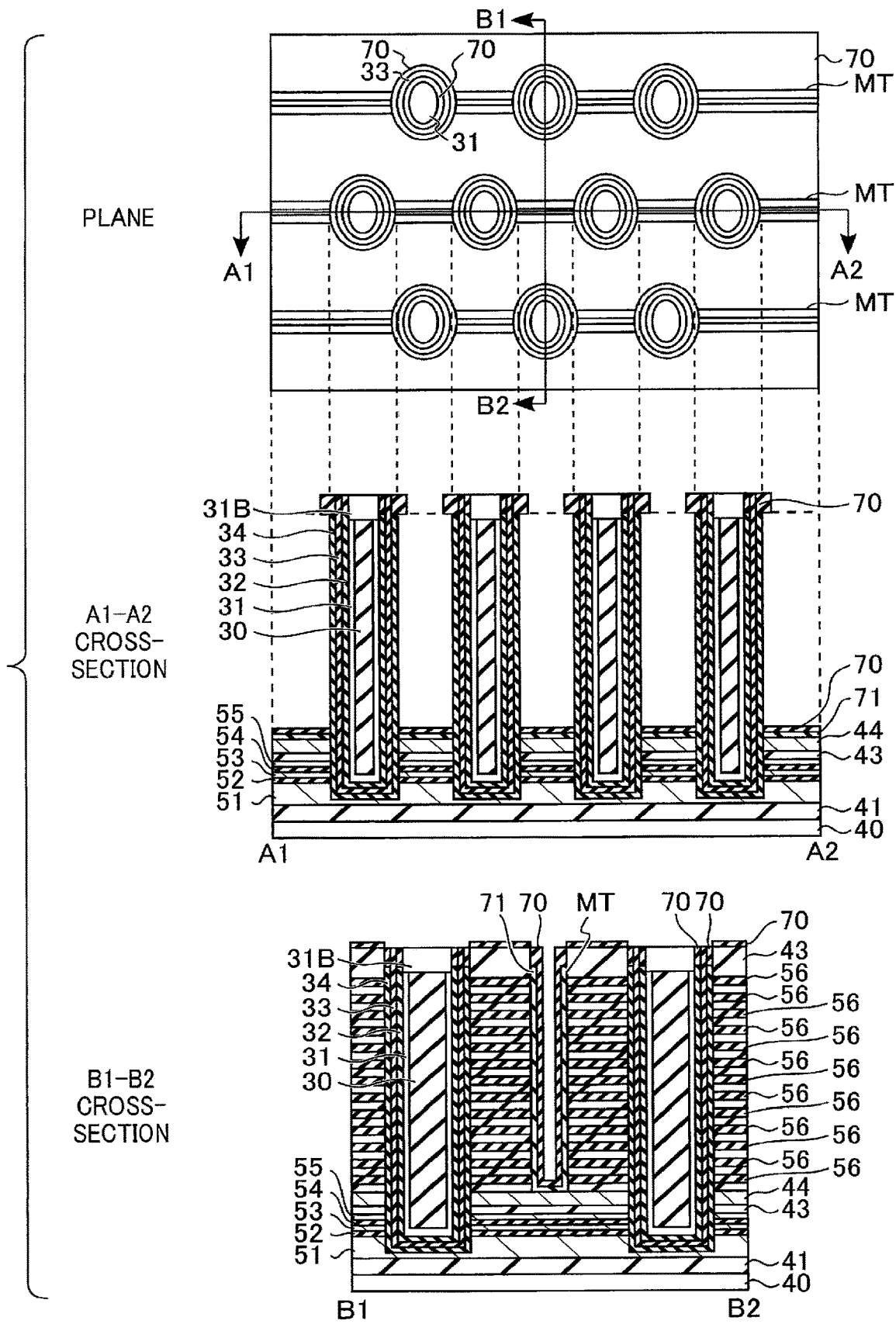

As shown in FIG. 31, insulating layer 72 in the memory trench MT is removed by wet etching.

Figure 32:
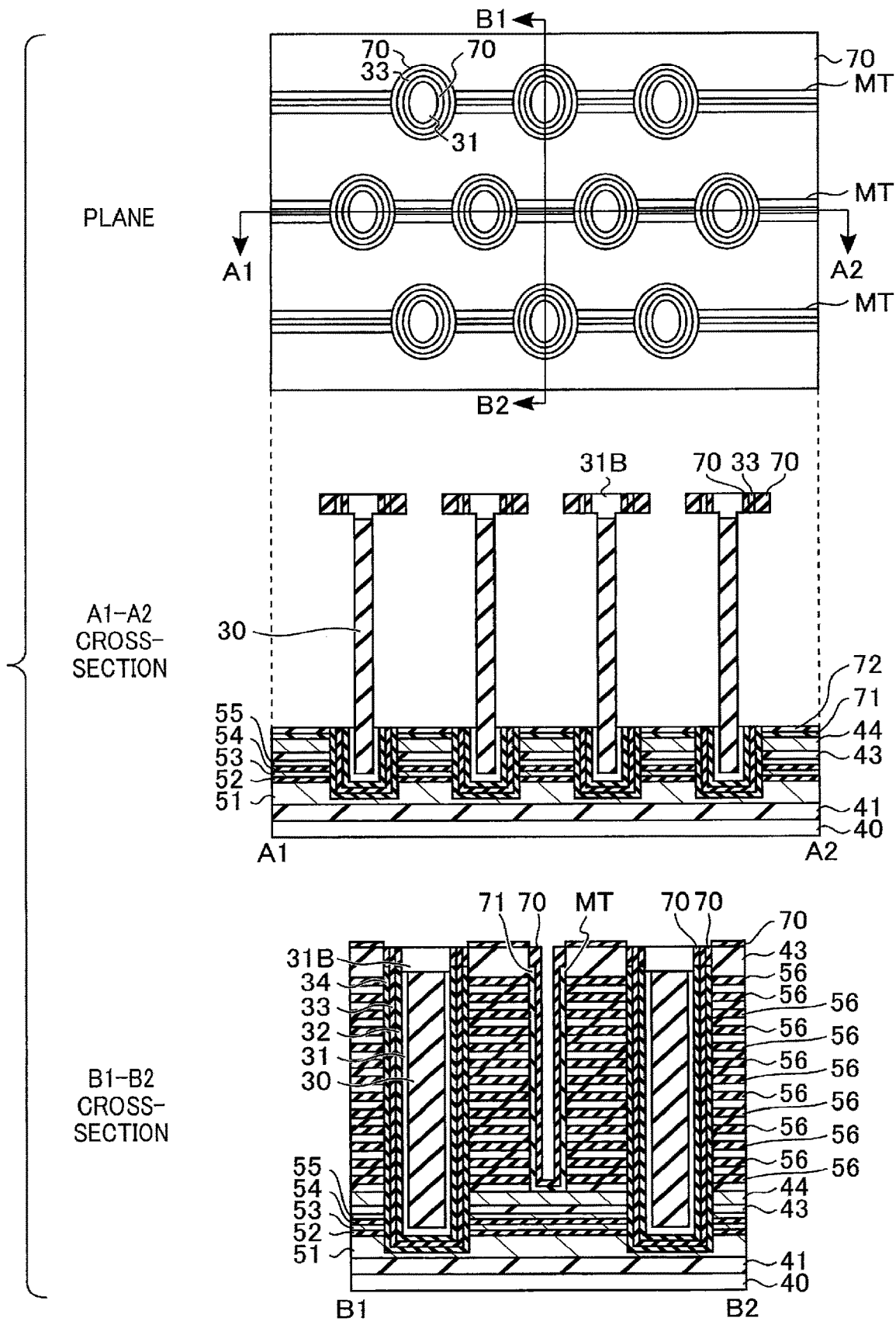

As shown in FIG. 32, the semiconductor layer 31, tunnel insulating film 32, charge storage layer 33, and block insulating film 34 with a side surface exposed to the inside of the memory trench MT are removed by, for example, dry or wet isotropic etching. At this time, insulating layers 70 and 71 remain in the memory trench MT without being removed. Accordingly, with the core layer 30 of the memory pillar MP and the structure of the cap layer 31B, insulating layer 70, charge storage layer 33, and insulating layer 70 at the top of the memory pillar maintained, the block insulating film 34, charge storage layer 33, tunnel insulating film 32, and semiconductor layer 31 are each divided into two in the B1-B2 cross-sectional direction (X direction) above interconnection layer 44.

Figure 33:
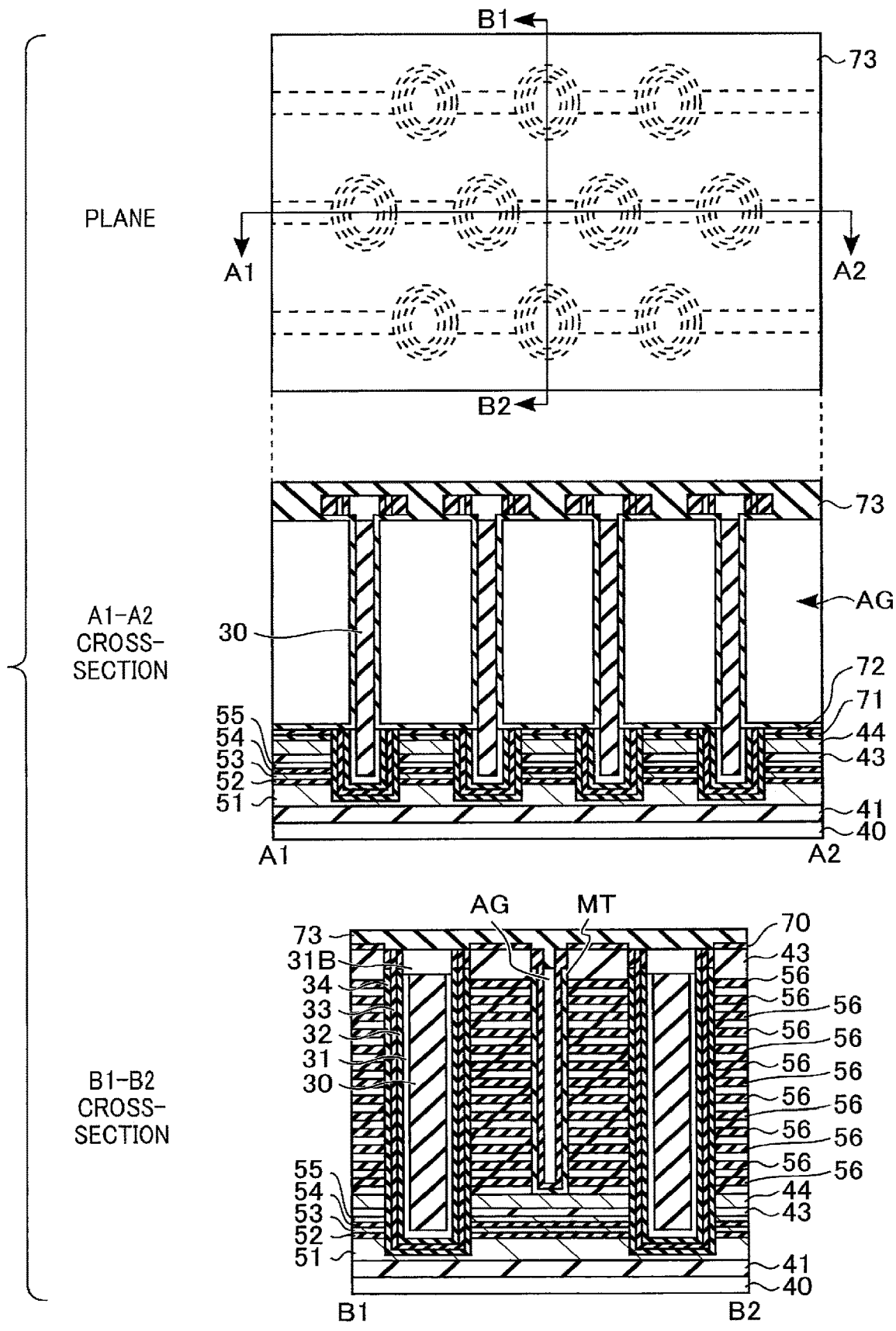

As shown in FIG. 33, insulating layer 73 is formed to cover the top surfaces of the memory pillar MP and the memory trench MT. At this time, the top (opening) of the memory trench MT is blocked by insulating layer 73, thereby forming an air gap AG in the memory trench MT. When $SiO_2$ formed by plasma CVD, using Tetra Ethyl Ortho Silicate (TEOS) or $SiH_4$ as a raw material, is used as insulating layer 73, $SiO_2$ is apt to be thicker at the opening than on the side and bottom surfaces of the memory trench MT; therefore, it is likely that the opening is blocked before the memory trench MT is filled, and an air gap AG is formed. After being formed, insulating layer 73 may be planarized by, for example, CMP.

Figure 34:
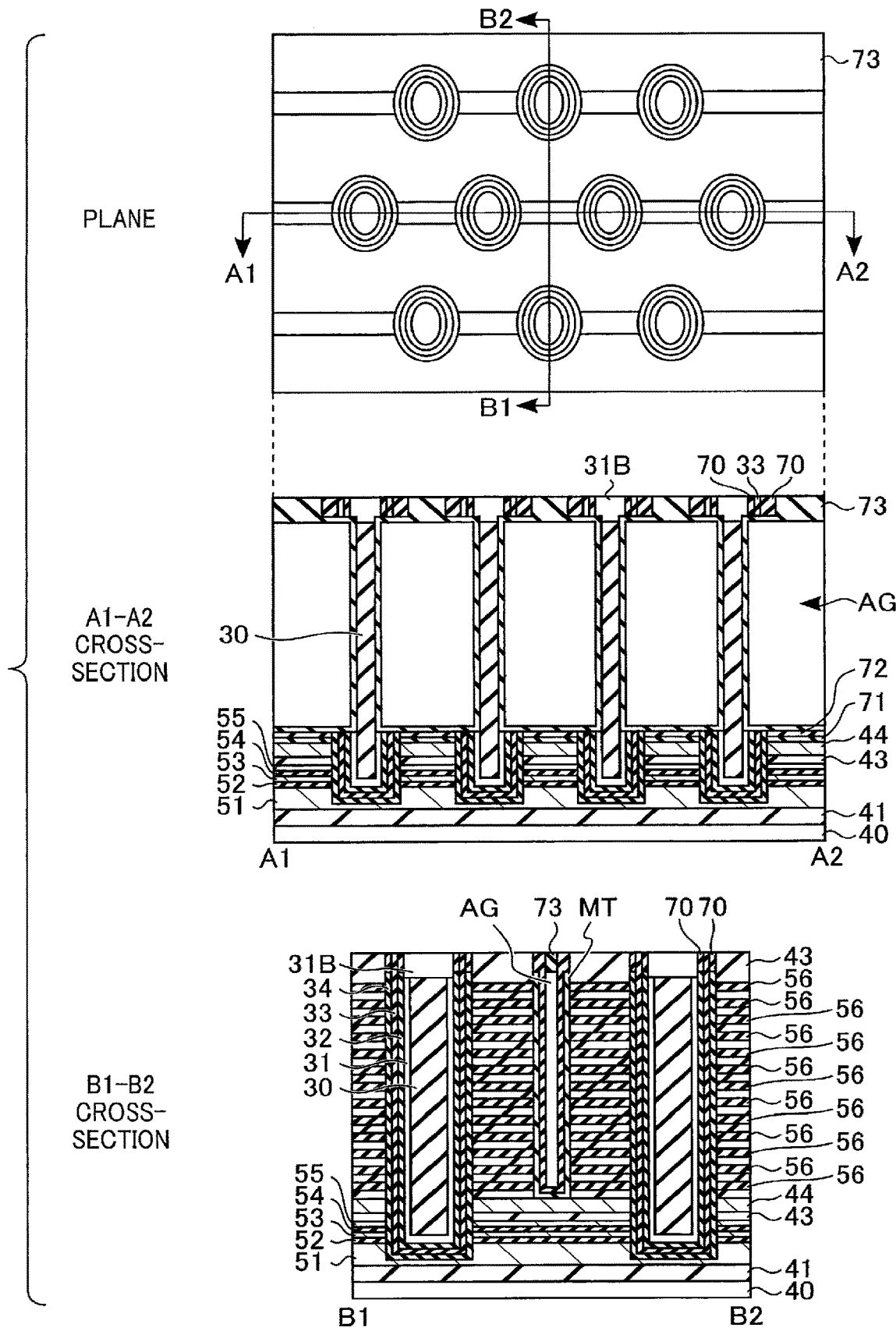

As shown in FIG. 34, insulating layer 73 is removed by, for example, etching back or CMP until the top surfaces of the memory pillar MP and the memory trench MT are exposed.

Figure 35:
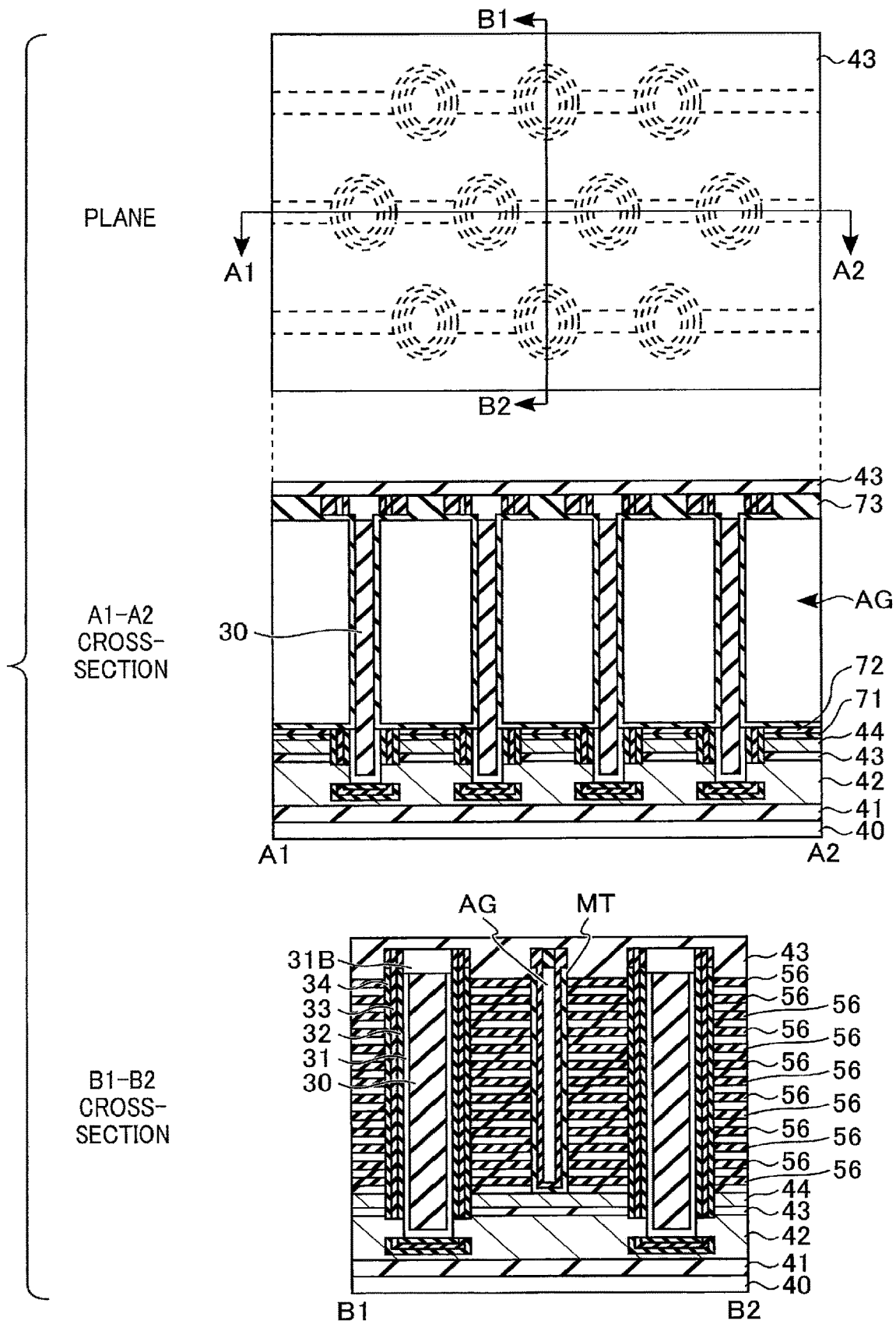

As shown in FIG. 35, insulating layer 43 is formed to cover the top surfaces of the memory pillar MP and the memory trench MT as in the steps shown in FIGS. 18 and 19 of the first embodiment. Then, after a slit (not shown) which reaches semiconductor layer 51 is formed, insulating layer 52, semiconductor layer 53, and insulating layer 54 are removed by wet etching, thereby forming a gap GP. At this time, the block insulating film 34, charge storage layer 33, and tunnel insulating film 32 exposed to the gap GP are also removed by wet etching. Then, interconnection layer 42 is formed by forming, for example, P-doped polysilicon in the gap GP. By removing polysilicon in the slit and excessive polysilicon on insulating layer 43 and filling the slit with insulating layer 43, formation of interconnection layer 42 is completed.

As shown in FIG. 36, insulating layer 56 is replaced, and interconnection layers 45 to 47 are formed as in the steps shown in FIGS. 20 and 21 of the first embodiment. After insulating layer 50 is formed, a contact plug CH is formed.

2.3 Advantageous Effect of Present Embodiment

The configuration of the present embodiment can attain the same advantageous effect as the first embodiment.

In addition, the configuration according to the present embodiment enables formation of an air gap AG in the memory trench MT. Accordingly, for example, in one memory pillar MP, the capacitance between two memory cell transistors MC formed on the same plane is reduced, and interference by capacitive coupling can be inhibited. Therefore, the reliability of the semiconductor memory device can be improved.

Furthermore, the configuration according to the present embodiment can reduce the capacitance between channels by forming an air gap AG, thereby inhibiting an RC delay caused when operating the device.

Furthermore, the configuration according to the present embodiment can inhibit deterioration of device characteristics caused by a gas emitted from the material filling the memory trench MT by forming the air gap AG.

3. Third Embodiment

Next, the third embodiment will be described. In the third embodiment, only the shape of the memory pillar MP which is different from that in the first and second embodiments will be described. Hereinafter, only the matters different from the first and second embodiments will be described.

3.1 Cross-Sectional Configuration of Memory Cell Array

First, a cross-sectional configuration of the memory cell array 11 will be described with reference to FIGS. 37 and 38. Described below as an example is the case where eight layers of word lines WL, two layers of select gate lines SGS, and three layers of select gate lines SGD are formed as in the first and second embodiments. The numbers of layers of word lines WL, and select gate lines SGS and SGD are not limited.

Figure 37:
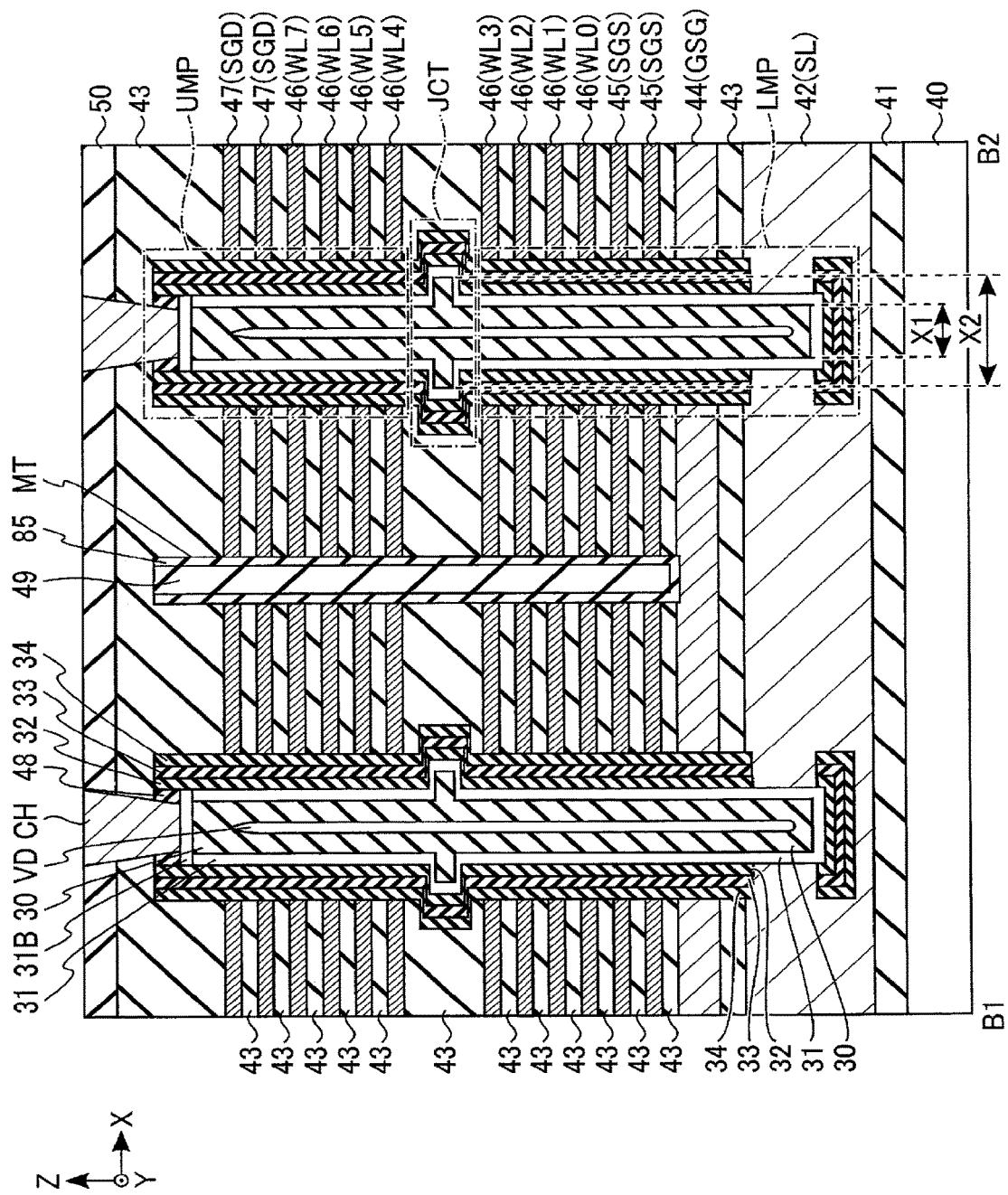
FIG. 37 is a B1-B2 cross-sectional view of a memory cell array included in a semiconductor memory device according to a third embodiment.

As shown in FIG. 37, the arrangement of interconnection layers 42, and 44 to 47 is the same as that shown in FIG. 4 in the first embodiment. In the case of FIG. 37, the interval in the Z direction between interconnection layer 46 that functions as word line WL3 and interconnection layer 46 that functions as word line WL4 is wider than those between the other interconnection layers 46.

Insulating layer 85 is formed on the side and bottom surfaces of the memory trench MT, and the inside of insulating layer 85 is filled with insulating layer 49. For insulating layer 85, for example, $SiO_2$ is used.

In the present embodiment, the memory pillar MP includes a lower memory pillar LMP, a junction JCT, and an upper memory pillar UMP.

The lower memory pillar LMP passes through a plurality of interconnection layers 46 that function as word lines WL (for example, word lines WL0 to WL3), a plurality of interconnection layers 45 that function as select gate lines SGS, interconnection layers 44 that function as select gate lines GSG, and a plurality of insulating layers 43, with its bottom surface reaching the inside of interconnection layer 42, and its top surface in contact with the bottom surface of the junction JCT.

For example, in the case of FIG. 37, the junction JCT is provided between interconnection layer 46 that functions as word line WL3 and interconnection layer 46 that functions as word line WL4 in the Z direction. The arrangement of the junction JCT in the Z direction can be designed at will. For example, the junction JCT may be provided between interconnection layer 46 that functions as word line WL4 and interconnection layer 46 that functions as word line WL5.

The junction JCT is formed to have a diameter larger in the X-Y plane than the diameters of the lower memory pillar LMP and the upper memory pillar UMP as a countermeasure against misalignment between the lower memory pillar LMP and the upper memory pillar UMP in a lithography step. Therefore, the junction JCT has a shape protruding on the X-Y plane with respect to the lower memory pillar LMP and the upper memory pillar UMP. Therefore, the area of the junction JCT on the X-Y plane is larger than that of the lower memory pillar LMP or the upper memory pillar UMP.

The upper memory pillar UMP passes through two interconnection layers 47 that function as select gate lines SGD, a plurality of interconnection layers 46 that function as word lines WL (for example, WL4 to WL7), and a plurality of insulating layers 43, with its bottom surface in contact with the top surface of the junction JCT. The top surface of the upper memory pillar UMP is in contact with the contact plug CH.

As in FIG. 4 of the first embodiment, a block insulating film 34, a charge storage layer 33, a tunnel insulating film 32, and a semiconductor layer 31 are sequentially stacked on the bottom surface and part of the side surface of the lower memory pillar LMP, the side surface of the junction JCT, and the side surface of the upper memory pillar UMP. A core layer 30 is provided to fill the inside of the semiconductor layer 31, and a void VD is formed inside the core layer 30. On the semiconductor layer 31 and the core layer 30, a cap layer 31B with a side surface in contact with the tunnel insulating film 32 is formed. On the cap layer 31B, insulating layer 48 with a side surface in contact with the tunnel insulating film 32 is formed.

Therefore, the core layer 30 is not divided between the lower memory pillar LMP, the junction JCT, and the upper memory pillar UMP. Where the length (diameter) of the core layer 30 in the lower memory pillar LMP and upper memory pillar UMP region in the X direction is X1, and the length of the core layer 30 in the junction JCT region in the X direction is X2, X1 and X2 satisfy X1<X2.

Figure 38:
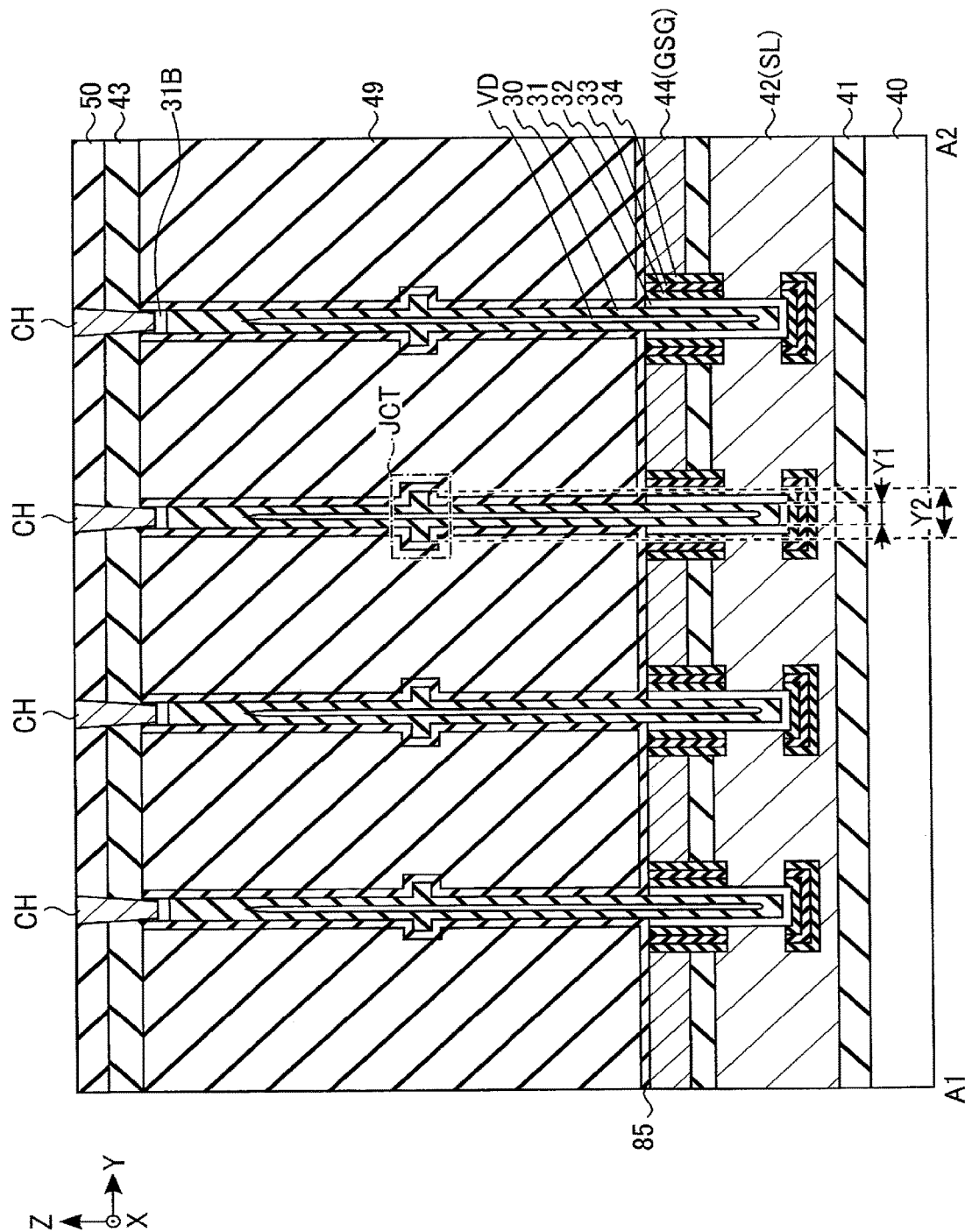
FIG. 38 is an A1-A2 cross-sectional view of the memory cell array included in the semiconductor memory device according to the third embodiment.

As shown in FIG. 38, side surfaces of the core layer 30, the cap layer 31B, and insulating layer 48 are in contact with insulating layer 85.

Where the length (diameter) of the core layer 30 in the lower memory pillar LMP and upper memory pillar UMP region in the Y direction is Y1, and the length of the core layer 30 in the junction JCT region in the Y direction is Y2, Y1 and Y2 satisfy Y1<Y2. Therefore, the core layer 30 is a structure including a protruding portion which protrudes on the X-Y plane.

3.2 Method for Manufacturing Memory Cell Array

Next, a method for manufacturing the memory cell array 11 will be described with reference to FIGS. 39 to 55. FIGS. 39 to 55 each show a plane, A1-A2 cross-section, and B1-B2 cross-section of the memory cell array in a manufacturing step. In the example of FIGS. 39 to 55, the void VD formed in the core layer 30 is omitted for simplification of explanation.

As shown in FIG. 39, insulating layer 41, semiconductor layer 51, insulating layer 52, semiconductor layer 53, insulating layer 54, semiconductor layer 55, insulating layer 43, and interconnection layer 44 are stacked in order on the semiconductor substrate 40, as in FIG. 6 of the first embodiment. A plurality of insulating layers 43 and a plurality of insulating layers 56 which correspond respectively to interconnection layers 45 to 47 are alternately stacked on interconnection layer 44. Insulating layer 43 is formed on the topmost insulating layer 56.

Next, a lower memory trench LMT and a lower hole LAH each having a bottom that reaches interconnection layer 44 are simultaneously formed. The lower memory trench LMT is a lower portion of when the memory trench MT is divided into two in the Z direction. The lower hole LAH corresponds to the lower memory pillar LMP. Next, insulating layer 80 is formed. Insulating layer 80 has a film thickness that does not allow insulating layer 80 to fill up the lower memory trench LMT or lower hole LAN. For insulating layer 80, for example, SiN is used.

Figure 40:
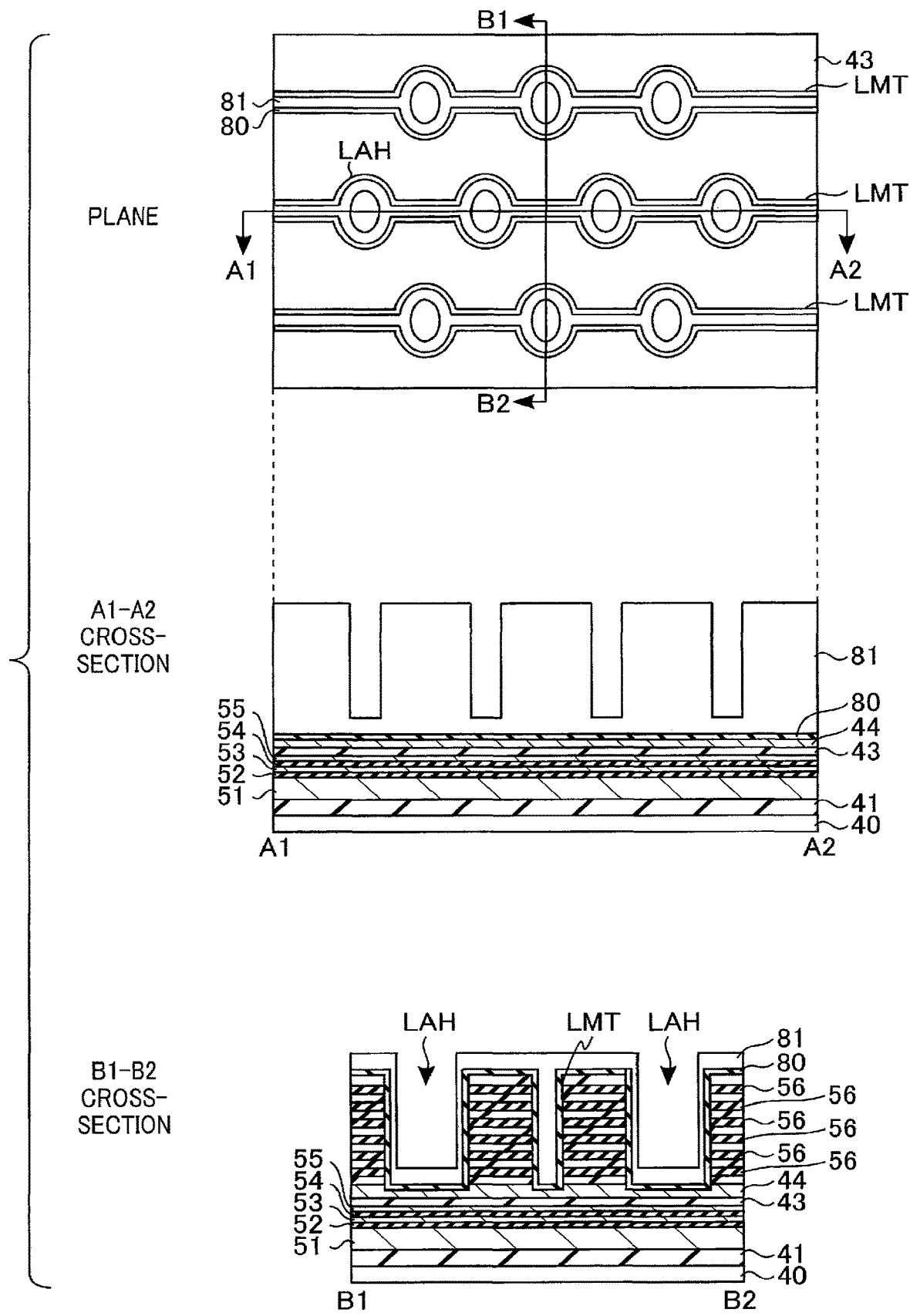

As shown in FIG. 40, semiconductor layer 81 is formed. Semiconductor 81 has a film thickness that allows semiconductor 81 to fill up the lower memory trench LMT and does not allow semiconductor layer 81 to fill up the lower hole LAH. In the process of manufacturing the memory cell array 11, semiconductor 81 functions as a sacrificial layer which temporarily fills the memory trench MT. For semiconductor layer 81, for example, amorphous silicon is used.

Figure 41:
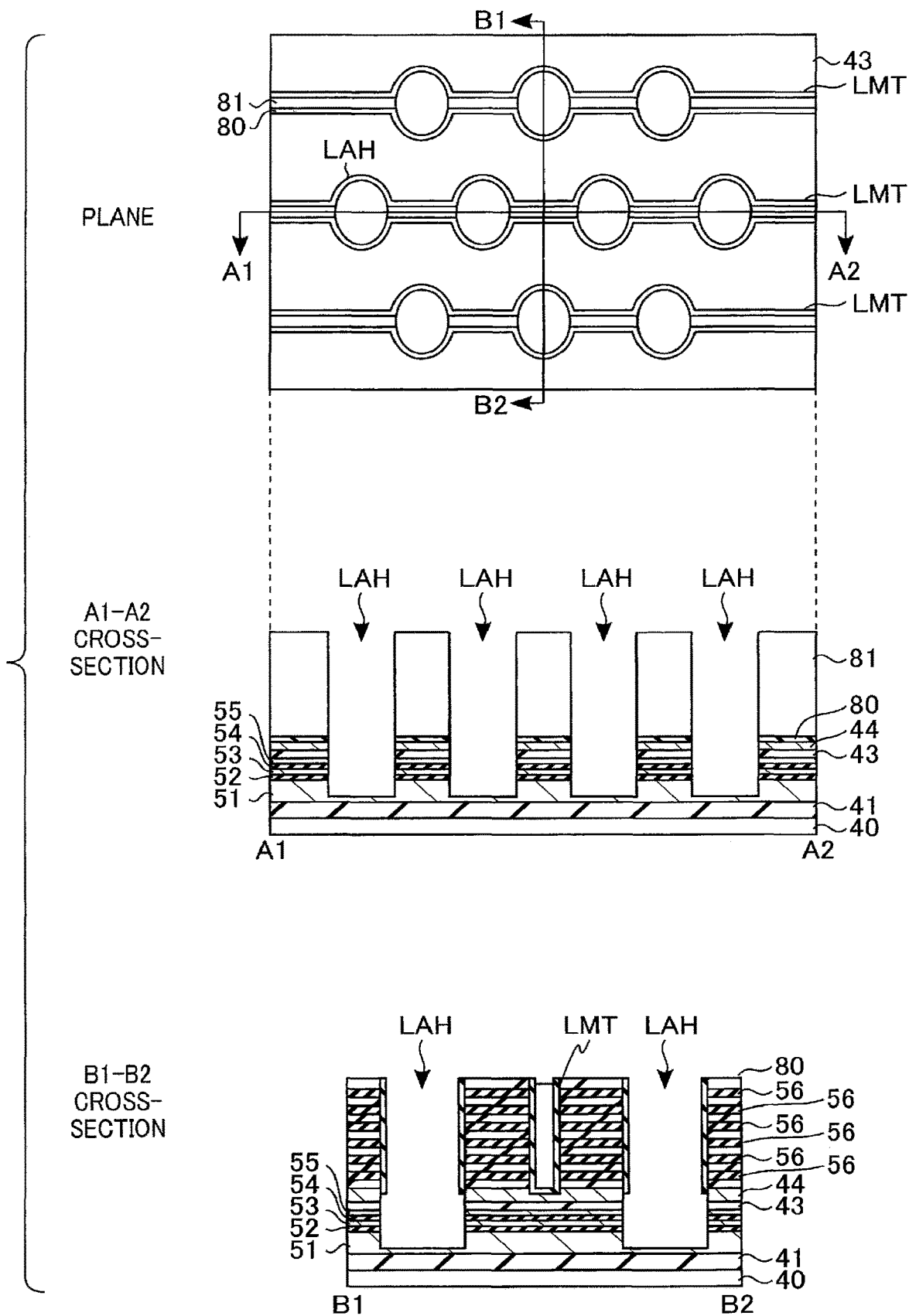

As shown in FIG. 41, semiconductor layer 81 in the lower hole LAH is removed by, for example, dry or wet isotropic etching. At this time, semiconductor layer 81 in the memory trench MT is scarcely etched since the side surface thereof is not exposed. Next, the lower hole LAH is additionally processed so that the bottom surface thereof reaches semiconductor layer 51. At this time, the top surface of semiconductor layer 81 is also etched; therefore, the level of the top surface of semiconductor layer 81 in the memory trench MT becomes lower than the level of the top surface of insulating layer 80. When additionally processing the lower hole LAH, insulating layer 80 on insulating layer 43 is removed, but insulating layer 80 remains on the lower hole LAH side surface.

As shown in FIG. 42, after insulating layer 80 is formed, semiconductor layer 82 is formed to fill the top portion of the memory trench MT and the inside of the lower hole LAH. In the process of manufacturing the memory cell array 11, semiconductor layer 82 functions as a sacrificial layer which temporarily fills the memory trench MT. For semiconductor layer 82, for example, amorphous silicon is used.

Figure 43:
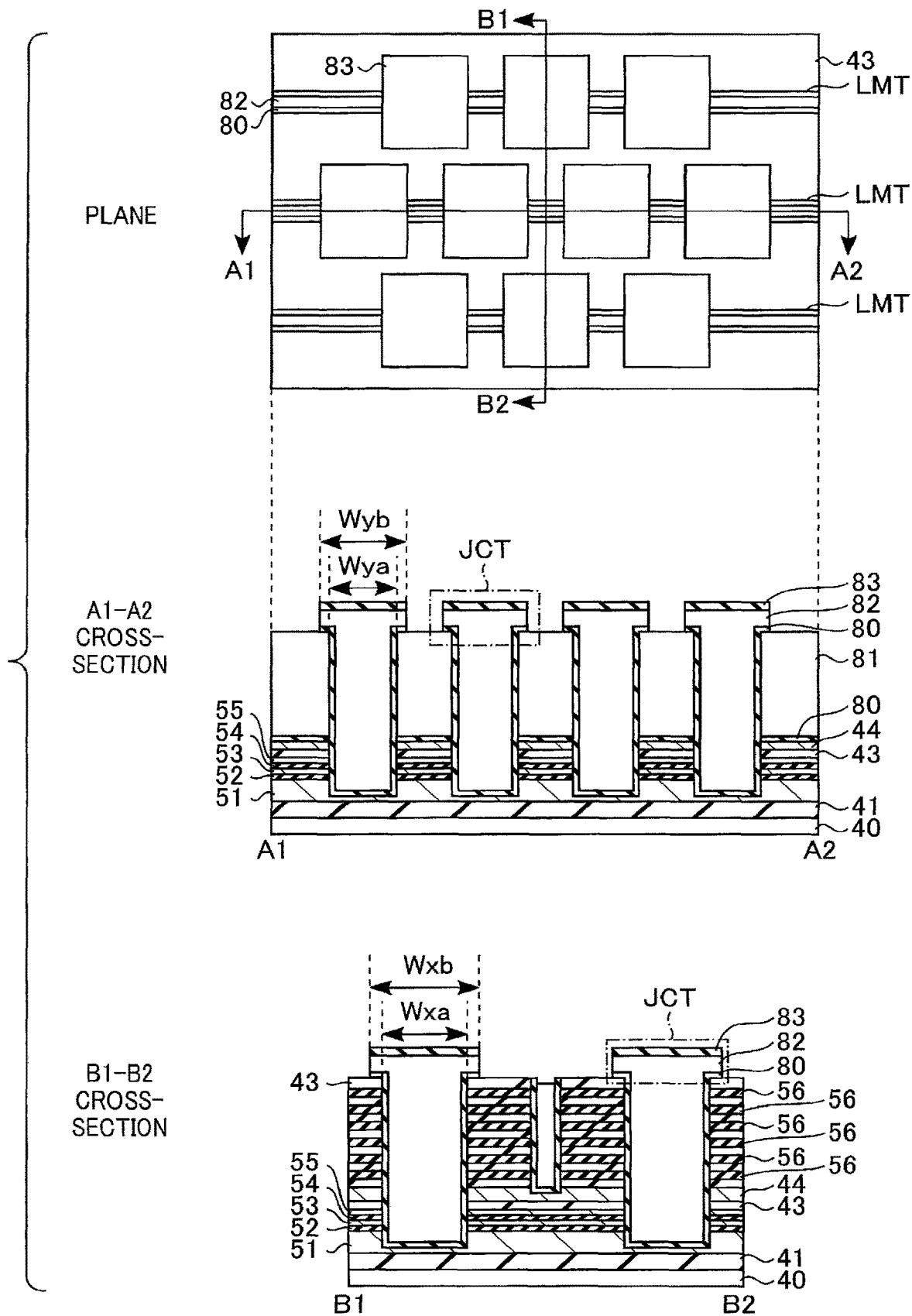

As shown in FIG. 43, insulating layer 83 is formed on semiconductor layer 82. For insulating layer 83, for example, SiN is used. Next, insulating layer 83 and semiconductor layer 82 are processed to form a junction JCT on the lower hole LAH (lower memory pillar LMP). At this time, insulating layer 80 under semiconductor layer 82 is also processed so that insulating layer 43 is exposed. Where the length (diameter) of the lower hole LAH in the A1-A2 cross-sectional direction (Y direction) is Wya, and that of the junction JCT is Wyb, Wya and Wyb satisfy Wya<Wyb. Where the length (diameter) of the lower hole LAH in the B1-B2 cross-sectional direction (X direction) is Wxa, and that of the junction JCT is Wxb, Wxa and Wxb satisfy Wxa<Wxb. The shape of the junction JCT is not limited to a square pillar. For example, the junction JCT may be columnar.

Figure 44:
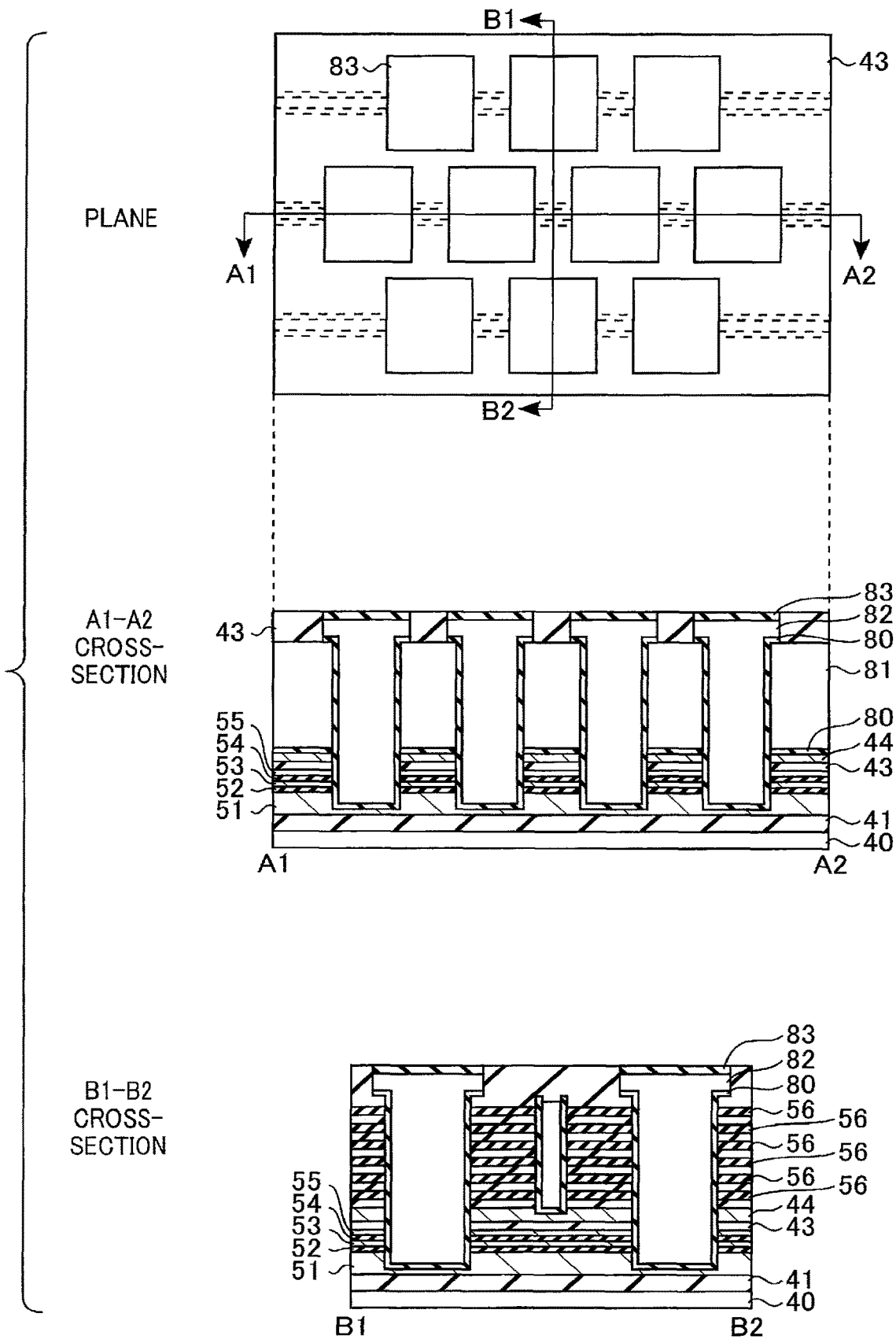

As shown in FIG. 44, insulating layer 43 is formed to fill in between junctions JCT. Next, insulating layer 43 is polished by CMP until the junction JCT, i.e., insulating layer 83, is exposed for planarization.

As shown in FIG. 45, insulating layer 83 is removed by, for example, dry etching. Next, a plurality of insulating layers 43 and a plurality of insulating layers 56 which correspond respectively to interconnection layers 46 and 47 are alternately stacked. In addition, insulating layer 43 is formed on the topmost insulating layer 56.

Figure 46:
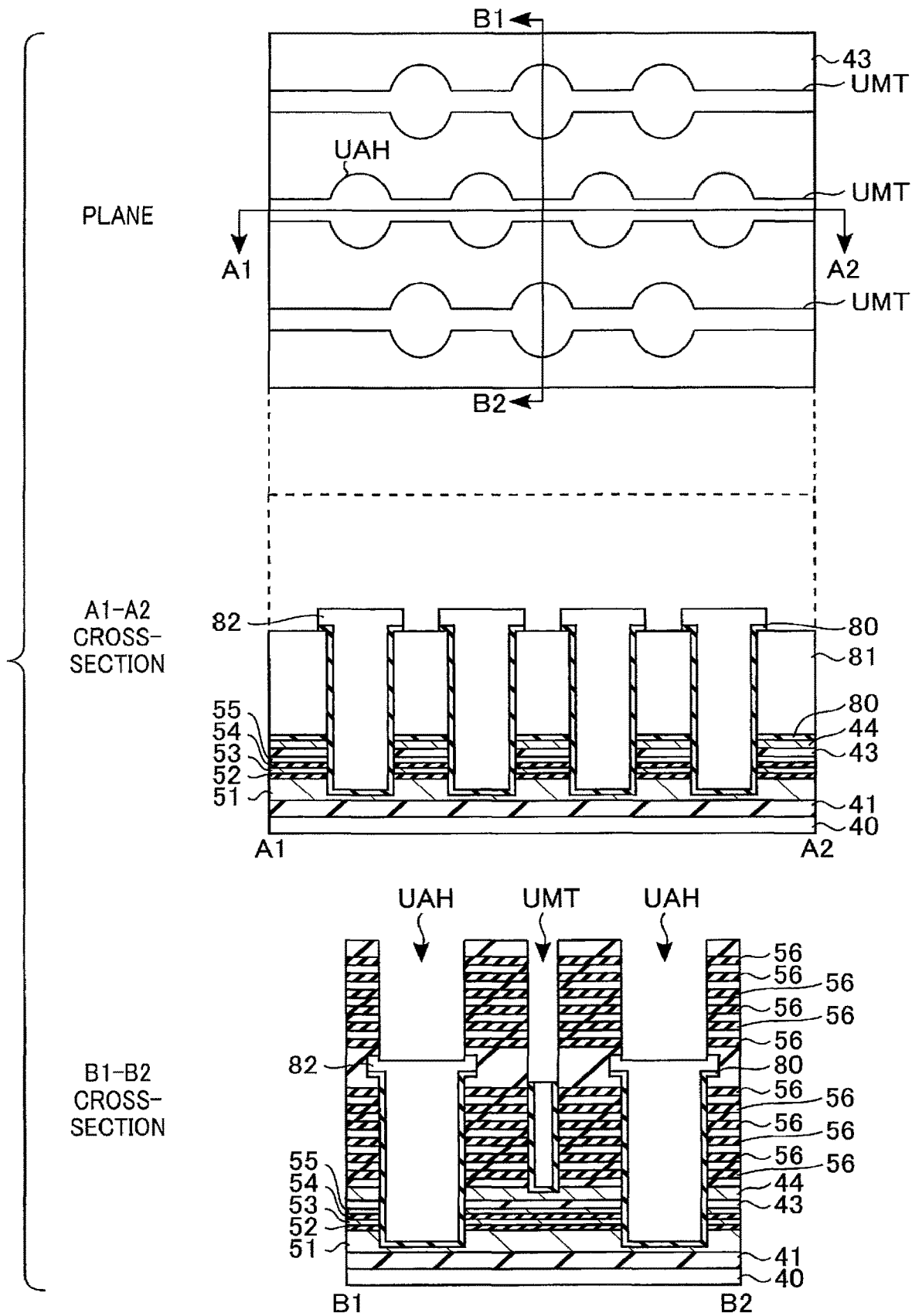

As shown in FIG. 46, an upper memory trench UNIT with a bottom that reaches the lower memory trench LMT and an upper hole UAH with a bottom in contact with semiconductor layer 82 of the junction JCT are simultaneously processed. The upper memory trench UMT is an upper portion of when the memory trench MT is divided into two in the Z direction. The upper hole UAH corresponds to the upper memory pillar UMP.

Figure 47:
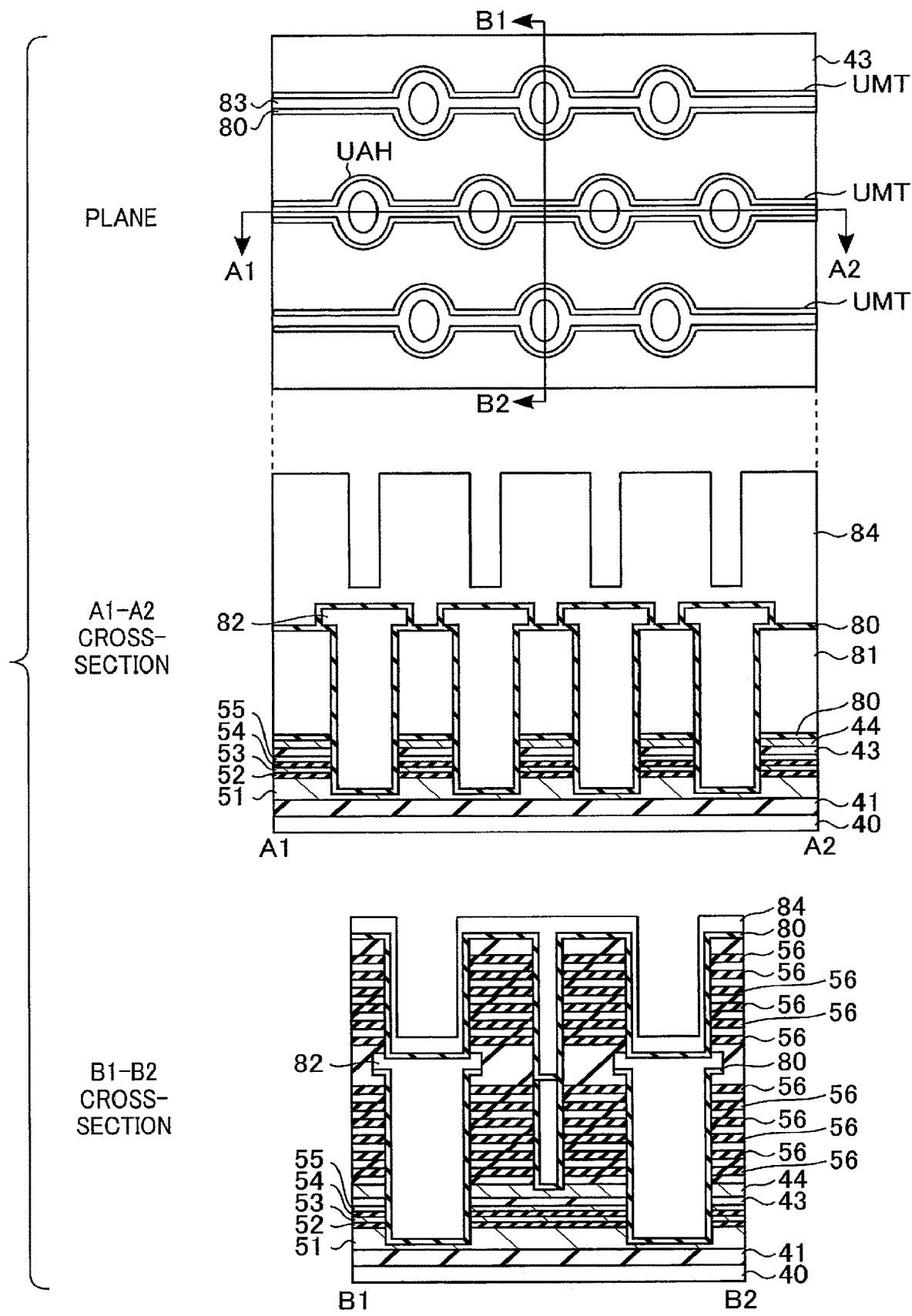

As shown in FIG. 47, insulating layer 80 and semiconductor layer 84 are formed. Insulating layer 80 has a film thickness that does not allow insulating layer 80 to fill up the upper memory trench UMT. For insulating layer 80, for example, SiN is used. Semiconductor layer 84 has a film thickness that allows semiconductor layer 84 to fill up the upper memory trench UMT and does not allow semiconductor layer 84 to fill up the upper hole UAH. In the process of manufacturing the memory cell array 11, semiconductor layer 84 functions as a sacrificial layer which temporarily fills the memory trench MT. For semiconductor layer 84, for example, amorphous silicon is used.

Figure 48:
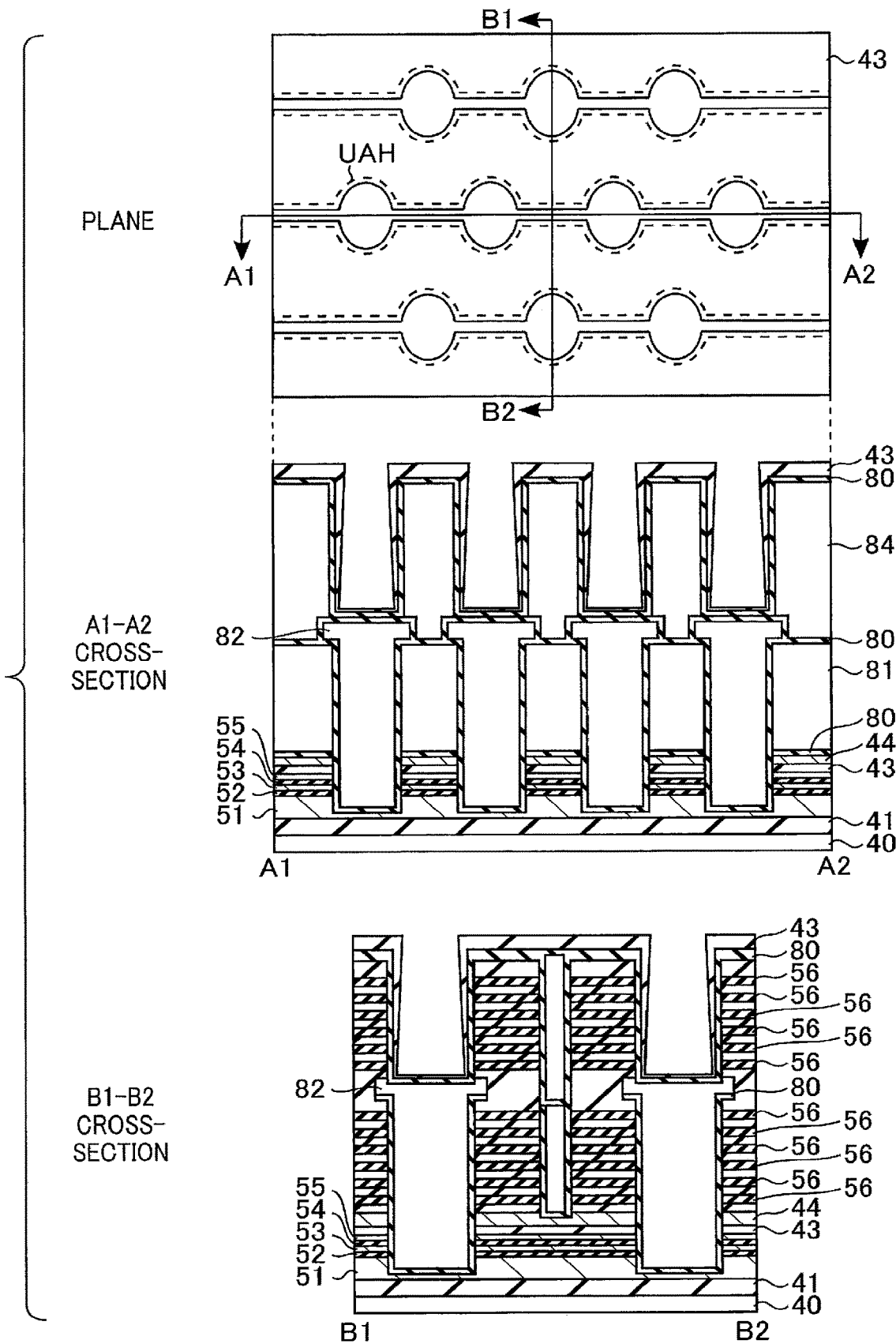

As shown in FIG. 48, semiconductor layer 84 in the upper hole UAH is removed by, for example, dry or wet isotropic etching. At this time, the etching amount is controlled so that semiconductor layer 84 in the upper memory trench UMT is not removed. Next, insulating layer 80 and insulating layer 43 are formed. At this time, insulating layer 43 has a film thickness that does not allow insulating layer 43 to block the upper hole UAH opening.

Figure 49:
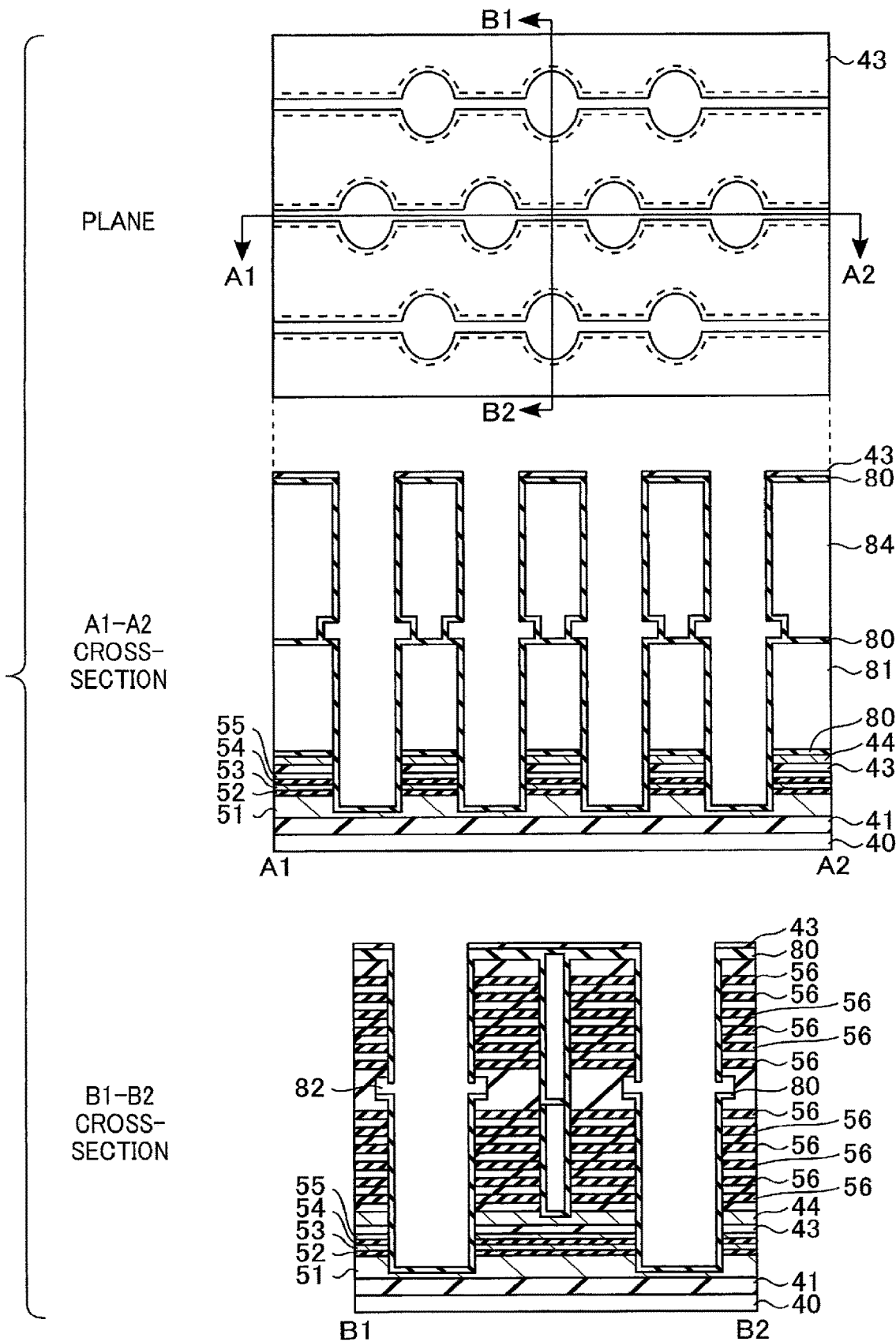

As shown in FIG. 49, insulating layer 43 and insulating layer 80 at the bottom of the upper hole UAH are removed by dry etching, and then, semiconductor layer 82 filled in the junction JCT and in the lower hole LAH are removed by wet etching, for example.

Figure 50:
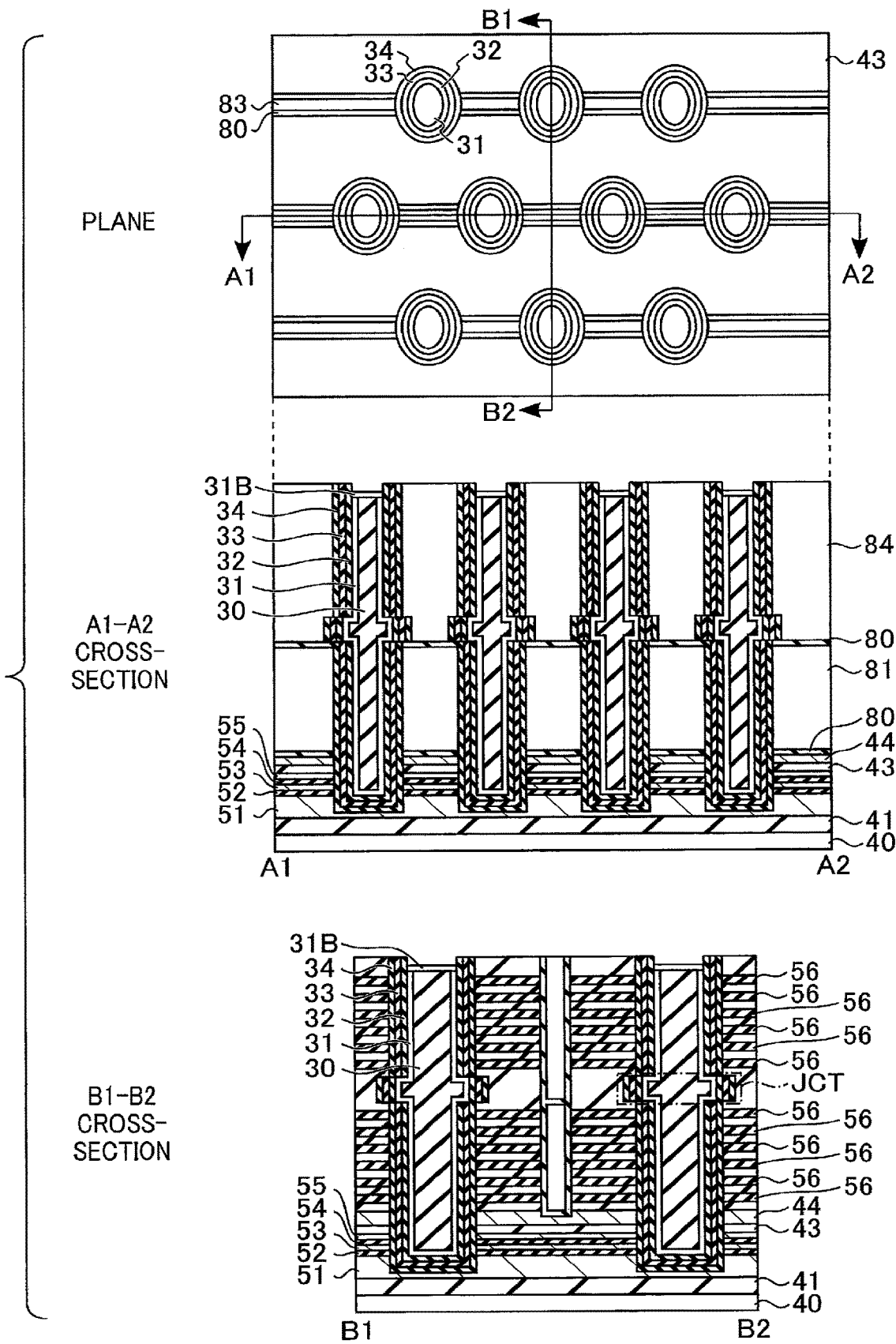

As shown in FIG. 50, insulating layer 43 and insulating layer 80 on the top are removed by, for example, wet etching. Next, as in the step shown in FIG. 13 of the first embodiment, a block insulating film 34, a charge storage layer 33, a tunnel insulating film 32, a semiconductor layer 31, a core layer 30, and a cap layer 31B are formed in the hole AH.

Figure 51:
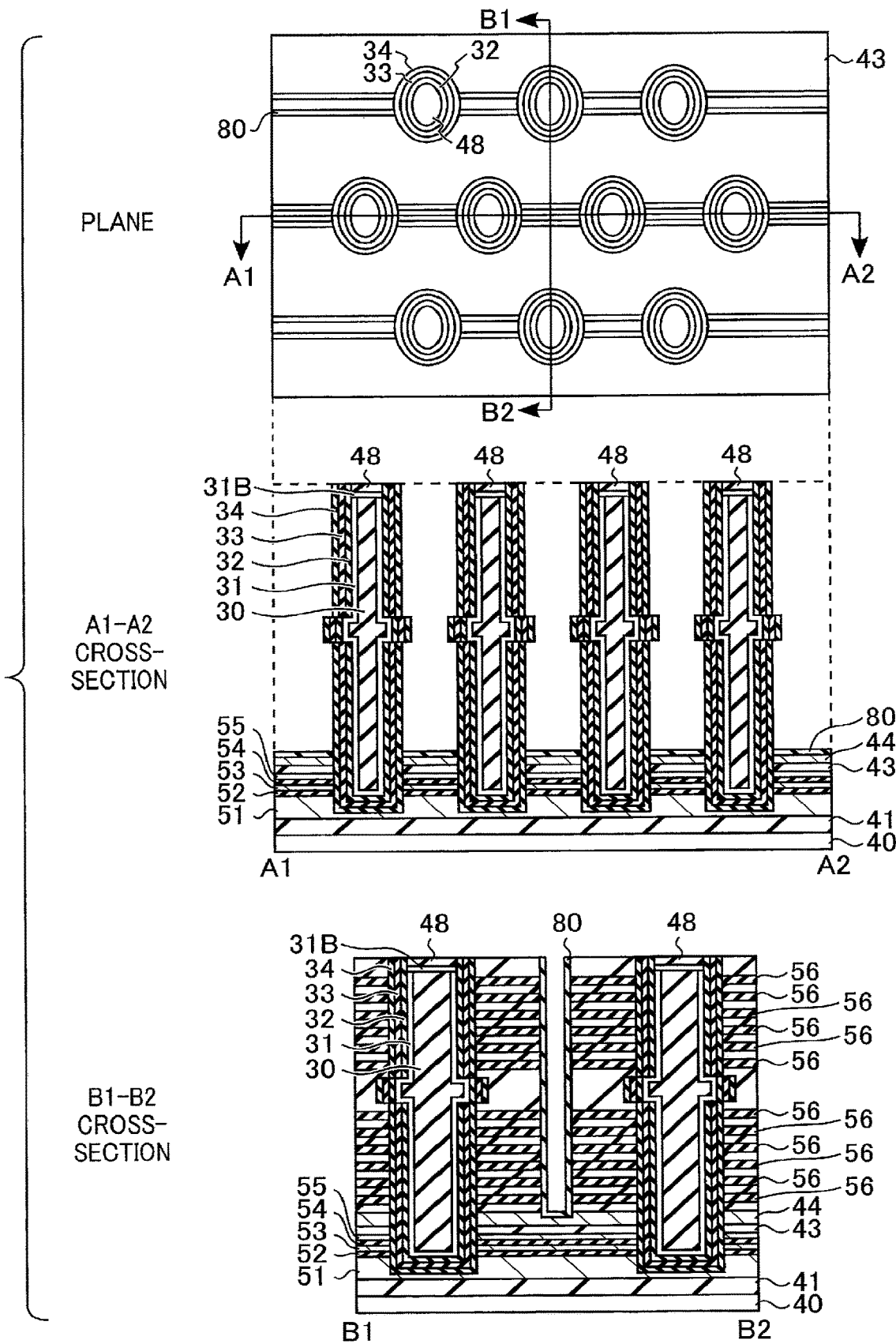

As shown in FIG. 51, insulating layer 48 is formed on the cap layer 31B as in the step shown in FIG. 14 of the first embodiment. Next, semiconductor layers 81 and 84 in the memory trench MT are removed. Specifically, first, semiconductor layer 84 in the upper memory trench UMT is removed. After insulating layer 80 formed at the bottom of the upper memory trench UMT is removed, semiconductor layer 81 in the lower memory trench LMT is removed.

As shown in FIG. 52, insulating layer 80 in the memory trench MT, the semiconductor layer 31, tunnel insulating film 32, charge storage layer 33, and block insulating film 34 with a side surface exposed to the inside of the memory trench MT are removed by, for example, dry or wet isotropic etching as in the step shown in FIG. 16 of the first embodiment. As a result, the block insulating film 34, the charge storage layer 33, the tunnel insulating film 32, and the semiconductor layer 31 are each divided into two in the B1-B2 cross-sectional direction (X direction) above interconnection layer 44.

Figure 53:
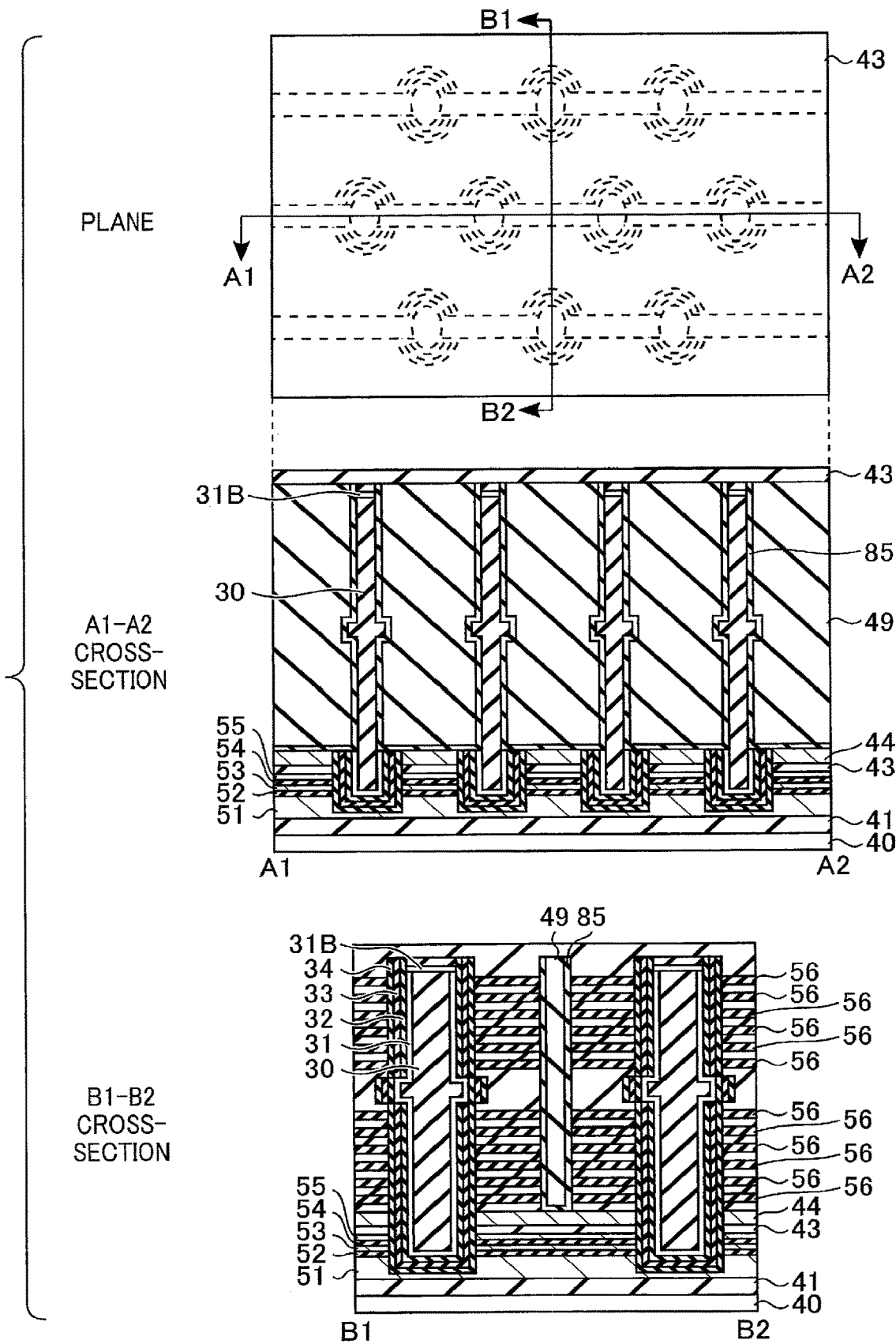

As shown in FIG. 53, insulating layer 85 and insulating layer 49 are filled in the memory trench MT, and then, insulating layer 43 is formed.

As shown in FIG. 54, interconnection layer 42 is formed as in the steps shown in FIGS. 18 and 19 of the first embodiment.

As shown in FIG. 55, insulating layer 56 is replaced, and interconnection layers 45 to 47 are formed as in the step shown in FIG. 20 of the first embodiment. Next, as in the step shown in FIG. 21 of the first embodiment, insulating layer 50 is formed on the topmost insulating layer 43, and then, a contact plug CH is formed.

3.3 Advantageous Effect of Present Embodiment

The configuration of the present embodiment can attain the same advantageous effect as the first embodiment.

In addition, the configuration according to the present embodiment makes it possible to form a junction JCT between two memory pillars MP when stacking a plurality of memory pillars MP in the direction perpendicular to the semiconductor substrate. Moreover, the size of the junction JCT (area on the plane parallel to the semiconductor substrate) can be made greater than the diameter of the memory pillar MP. Accordingly, even when misalignment between the memory pillar MP and the junction JCT occurs in the lithography step, processing error, filling error, or the like of the memory pillar MP can be inhibited. Accordingly, the reliability of the semiconductor memory device can be improved.

The third embodiment may be combined with the second embodiment. In addition, an air gap AG may be formed in the memory trench MT in the third embodiment.

Furthermore, the configuration according to the present embodiment enables simultaneous formation of the hole AH and the memory trench MT. Consequently, the number of manufacturing steps can be inhibited from increasing.

4. Modifications, Etc.

The semiconductor memory device according to the above-described embodiments includes: a first interconnection layer (46; WLa0) extending in a first direction (Y direction); a second interconnection layer (46; WLb0) arranged adjacently to the first interconnection layer in a second direction (X direction) intersecting the first direction, and extending in the first direction; a first insulating layer (30) provided between the first interconnection layer and the second interconnection layer, and extending in a third direction (Z direction) intersecting the first direction and the second direction; a first semiconductor layer (31_2) provided between the first interconnection layer and the first insulating layer, and extending in the third direction; a second semiconductor layer (31_3) provided between the second interconnection layer and the first insulating layer, and extending in the third direction; a first charge storage layer (33) provided between the first interconnection layer and the first semiconductor layer; a second charge storage layer (33) provided between the second interconnection layer and the second semiconductor layer; and a second insulating layer (49 (MT)) provided between the first interconnection layer and the second interconnection layer, between the first semiconductor layer and the second semiconductor layer, and between the first charge storage layer and the second charge storage layer, and extending in the first and third directions.

By applying the above embodiments, a semiconductor memory device that can increase reliability can be provided.

The embodiments are not limited to the above-described ones, and various modifications are possible.

The term "couple" in the above-described embodiments includes indirect coupling via a transistor, a resistor or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first interconnection layer extending in a first direction;
a second interconnection layer extending in the first direction and arranged adjacently to the first interconnection layer in a second direction, the second direction intersecting the first direction;
a first insulating layer provided between the first interconnection layer and the second interconnection layer, and extending in the first direction and a third direction, the third direction intersecting the first direction and the second direction;
a second insulating layer provided between the first interconnection layer and the second interconnection layer, and extending in the third direction; a first semiconductor layer provided between the first interconnection layer and the second insulating layer, and extending in the third direction;
a second semiconductor layer provided between the second interconnection layer and the second insulating layer, and extending in the third direction;
a first charge storage layer provided between the first interconnection layer and the first semiconductor layer;
a second charge storage layer provided between the second interconnection layer and the second semiconductor layer;
a third interconnection layer disposed apart in the third direction from the first and second interconnection layers, the first insulating layer being extending in the third direction inside the third interconnection layer; and
a third semiconductor layer extending in the third direction inside the third interconnection layer, provided between the first insulating layer and the third interconnection layer, and being in contact with the first and second semiconductor layers.

2. The device according to claim 1, further comprising a gate insulating film provided between the third interconnection layer and the third semiconductor layer,
wherein the gate insulating film contains a material contained in the first and second charge storage layers.

3. The device according to claim 1, further comprising a fourth interconnection layer disposed apart in the third direction from the first and second interconnection layers via the third interconnection layer, and coupled to the third semiconductor layer.

4. The device according to claim 3, further comprising a third insulating layer provided in the fourth interconnection layer,
wherein the third semiconductor layer is extending in the third direction inside the fourth interconnection layer, and
the third insulating layer is provided between the third semiconductor layer and the fourth interconnection layer.

5. A semiconductor memory device comprising:
a first interconnection layer extending in a first direction;
a second interconnection layer extending in the first direction and arranged adjacently to the first interconnection layer in a second direction, the second direction intersecting the first direction;
a first insulating layer provided between the first interconnection layer and the second interconnection layer, and extending in the first direction and a third direction, the third direction intersecting the first direction and the second direction;
a second insulating layer provided between the first interconnection layer and the second interconnection layer , and extending in the third direction;
a first semiconductor layer provided between the first interconnection layer and the second insulating layer, and extending in the third direction;

a second semiconductor layer provided between the second interconnection layer and the second insulating layer, and extending in the third direction;
a first charge storage layer provided between the first interconnection layer and the first semiconductor layer;
a second charge storage layer provided between the second interconnection layer and the second semiconductor layer;
a fourth insulating layer provided between the first interconnection layer and the first charge storage layer;
a fifth insulating layer provided between the first charge storage layer and the first semiconductor layer;
a sixth insulating layer provided between the second interconnection layer and the second charge storage layer; and
a seventh insulating layer provided between the second charge storage layer and the second semiconductor layer,
wherein the second insulating layer is provided between the fourth insulating layer and the sixth insulating layer, and between the fifth insulating layer and the seventh insulating layer.

6. A semiconductor memory device comprising:
a first interconnection layer extending in a first direction;
a second interconnection layer extending in the first direction and arranged adjacently to the first interconnection layer in a second direction, the second direction intersecting the first direction;
a first insulating layer provided between the first interconnection layer and the second interconnection layer, and extending in the first direction and a third direction, the third direction intersecting the first direction and the second direction;
a second insulating layer provided between the first interconnection layer and the second interconnection layer and extending in the third direction;
a first semiconductor layer provided between the first interconnection layer and the second insulating layer, and extending in the third direction;
a second semiconductor layer provided between the second interconnection layer and the second insulating layer, and extending in the third direction;
a first charge storage layer provided between the first interconnection layer and the first semiconductor layer;
a second charge storage layer provided between the second interconnection layer and the second semiconductor layer; and
a fourth semiconductor layer provided on the first and second semiconductor layers and the first insulating layer.

7. The device according to claim 6, further comprising a contact plug provided on the fourth semiconductor layer.

8. The device according to claim 1, further comprising:
a fifth interconnection layer disposed apart in the third direction from the first interconnection layer, and extending in the first direction; and
a sixth interconnection layer disposed apart in the third direction from the second interconnection layer, arranged adjacently to the fifth interconnection layer in the second direction, and extending in the first direction,
wherein, with respect to the second direction, the first and second semiconductor layers, the first and second insulating layers, and the first and second charge storage layers are provided between the fifth interconnection layer and the sixth interconnection layer.

9. The device according to claim 1, further comprising:
an eighth insulating layer provided between the first interconnection layer and the second interconnection layer, and extending in the third direction;
a fifth semiconductor layer provided between the first interconnection layer and the eighth insulating layer, and extending in the third direction; and
a sixth semiconductor layer provided between the second interconnection layer and the eighth insulating layer, and extending in the third direction.

10. The device according to claim 9, wherein one end of the first insulating layer with respect to the first direction is in contact with the eighth insulating layer.

11. The device according to claim 1, wherein an air gap is formed in the second insulating layer.

12. The device according to claim 11, further comprising:
a ninth insulating layer provided between the first interconnection layer and the second interconnection layer, and being in contact with the second insulating layer; and
a tenth insulating layer provided between the first interconnection layer and the second interconnection layer with one side surface in contact with the ninth insulating layer and an opposite side surface in contact with one of the first and second interconnection layers.

13. The device according to claim 1, further comprising:
a first memory cell including part of the first interconnection layer and part of the first semiconductor layer; and
a second memory cell including part of the second interconnection layer and part of the second semiconductor layer.

14. The device according to claim 1, further comprising:
a seventh interconnection layer disposed apart in the third direction from the first interconnection layer, and extending in the first direction;
an eighth interconnection layer disposed apart in the third direction from the second interconnection layer, arranged adjacently to the seventh interconnection layer in the second direction, and extending in the first direction;
a third charge storage layer provided between the seventh interconnection layer and the first semiconductor layer; and
a fourth charge storage layer provided between the eighth interconnection layer and the second semiconductor layer,
wherein the first insulating layer has a first portion protruding in the first and second directions, the first portion being provided between the first interconnection layer and the seventh interconnection layer and between the second interconnection layer and the eighth interconnection layer.

15. The device according to claim 14, wherein a width of the first portion in the second direction is greater than that of the first insulating layer except for the first portion.

16. The device according to claim 14, wherein
the first semiconductor layer has a second portion protruding in the second direction, the second portion being produced between the first interconnection layer and the seventh interconnection layer, and
the second semiconductor layer has a third portion protruding in the second direction, the third portion being provided between the second interconnection layer and the eighth interconnection layer.

17. The device according to claim 5, further comprising:
a fifth interconnection layer disposed apart in the third direction from the first interconnection layer, and extending in the first direction; and
a sixth interconnection layer disposed apart in the third direction from the second interconnection layer, arranged adjacently to the fifth interconnection layer in the second direction, and extending in the first direction,
wherein, with respect to the second direction, the first and second semiconductor layers, the first and second insulating layers, and the first and second charge storage layers are provided between the fifth interconnection layer and the sixth interconnection layer.

18. The device according to claim 5, further comprising:
an eighth insulating layer provided between the first interconnection layer and the second interconnection layer, and extending in the third direction;
a fifth semiconductor layer provided between the first interconnection layer and the eighth insulating layer, and extending in the third direction; and
a sixth semiconductor layer provided between the second interconnection layer and the eighth insulating layer, and extending in the third direction.

19. The device according to claim 5, wherein one end of the first insulating layer with respect to the first direction is in contact with the eighth insulating layer.

20. The device according to claim 5, further comprising:
a first memory cell including part of the first interconnection layer and part of the first semiconductor layer; and
a second memory cell including part of the second interconnection layer and part of the second semiconductor layer.

21. The device according to claim 6, further comprising:
a fifth interconnection layer disposed apart in the third direction from the first interconnection layer, and extending in the first direction; and
a sixth interconnection layer disposed apart in the third direction from the second interconnection layer, arranged adjacently to the fifth interconnection layer in the second direction, and extending in the first direction,
wherein, with respect to the second direction, the first and second semiconductor layers, the first and second insulating layers, and the first and second charge storage layers are provided between the fifth interconnection layer and the sixth interconnection layer.

22. The device according to claim 6, further comprising:
an eighth insulating layer provided between the first interconnection layer and the second interconnection layer, and extending in the third direction;
a fifth semiconductor layer provided between the first interconnection layer and the eighth insulating layer, and extending in the third direction; and
a sixth semiconductor layer provided between the second interconnection layer and the eighth insulating layer, and extending in the third direction.

23. The device according to claim 22, wherein one end of the first insulating layer with respect to the first direction is in contact with the eighth insulating layer.

24. The device according to claim 6, further comprising:
a first memory cell including part of the first interconnection layer and part of the first semiconductor layer; and
a second memory cell including part of the second interconnection layer and part of the second semiconductor layer.

* * * * *